(12) United States Patent
Kikuchi et al.

(10) Patent No.: US 8,598,045 B2
(45) Date of Patent: Dec. 3, 2013

(54) SEMICONDUCTOR DEVICE AND METHOD FOR MANUFACTURING THE SAME

(75) Inventors: Hideaki Kikuchi, Kawasaki (JP); Kouichi Nagai, Yokohama (JP); Tomoyuki Kikuchi, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 386 days.

(21) Appl. No.: 12/819,992

(22) Filed: Jun. 21, 2010

(65) Prior Publication Data

US 2010/0255675 A1 Oct. 7, 2010

Related U.S. Application Data

(62) Division of application No. 12/027,530, filed on Feb. 7, 2008, now abandoned.

(30) Foreign Application Priority Data

Feb. 23, 2007 (JP) ................................. 2007-044534

(51) Int. Cl.
*H01L 21/768* (2006.01)

(52) U.S. Cl.
USPC ............................................ 438/740; 438/637

(58) Field of Classification Search
USPC ............ 438/740, 637; 257/E21.585, E21.577
See application file for complete search history.

(56) References Cited

U.S. PATENT DOCUMENTS

| | | | |
|---|---|---|---|
| 5,786,276 A | 7/1998 | Brooks et al. | |
| 5,933,761 A | 8/1999 | Lee | |
| 6,069,063 A | 5/2000 | Chang et al. | |
| 6,593,223 B1* | 7/2003 | Huang et al. | 438/618 |
| 7,166,524 B2 | 1/2007 | Al-Bayati et al. | |
| 2007/0269951 A1 | 11/2007 | Lu et al. | |

FOREIGN PATENT DOCUMENTS

| | | |
|---|---|---|
| JP | 8-102489 A | 4/1996 |
| JP | 8-195438 A | 7/1996 |
| JP | 3019816 | 4/1999 |
| JP | 2000-243829 A | 9/2000 |
| JP | 2000-323572 | 11/2000 |
| JP | 2000-323572 A | 11/2000 |
| JP | 2004-056099 | 2/2004 |

OTHER PUBLICATIONS

USPTO, (CHI) Non-Final Rejection, Feb. 19, 2010, in parent U.S. Appl. No. 12/027,530 [now abandoned].
USPTO, (CHI) Requirement for Restriction/Election, Sep. 24, 2009, in parent U.S. Appl. No. 12/027,530 [now abandoned].
Korean Office Action dated Nov. 25, 2009, issued in corresponding Korean Patent Application No. 10-2008-0014875.
"Taiwanese Office Action" mailed by TW Patent Office and corresponding to Taiwanese application No. 097102850 on Feb. 23, 2012, with English translation.
Japanese Office Action mailed Oct. 2, 2012 for corresponding Japanese Application No. 2007-044534, with Partial English-language Translation.
Japanese Office Action mailed Jul. 30, 2013 for corresponding Japanese Application No. 2007-044534, with Partial English-language Translation.

* cited by examiner

*Primary Examiner* — Daniel Whalen
*Assistant Examiner* — Suberr Chi
(74) *Attorney, Agent, or Firm* — Fujitsu Patent Center

(57) ABSTRACT

A method for manufacturing a semiconductor device including, forming a first insulating film above a silicon substrate, forming an impurity layer in the first insulating film by ion-implanting impurities into a predetermined depth of the first insulating film, and modifying the impurity layer to a barrier insulating film by annealing the first insulating film after the impurity layer is formed, is provided.

1 Claim, 93 Drawing Sheets

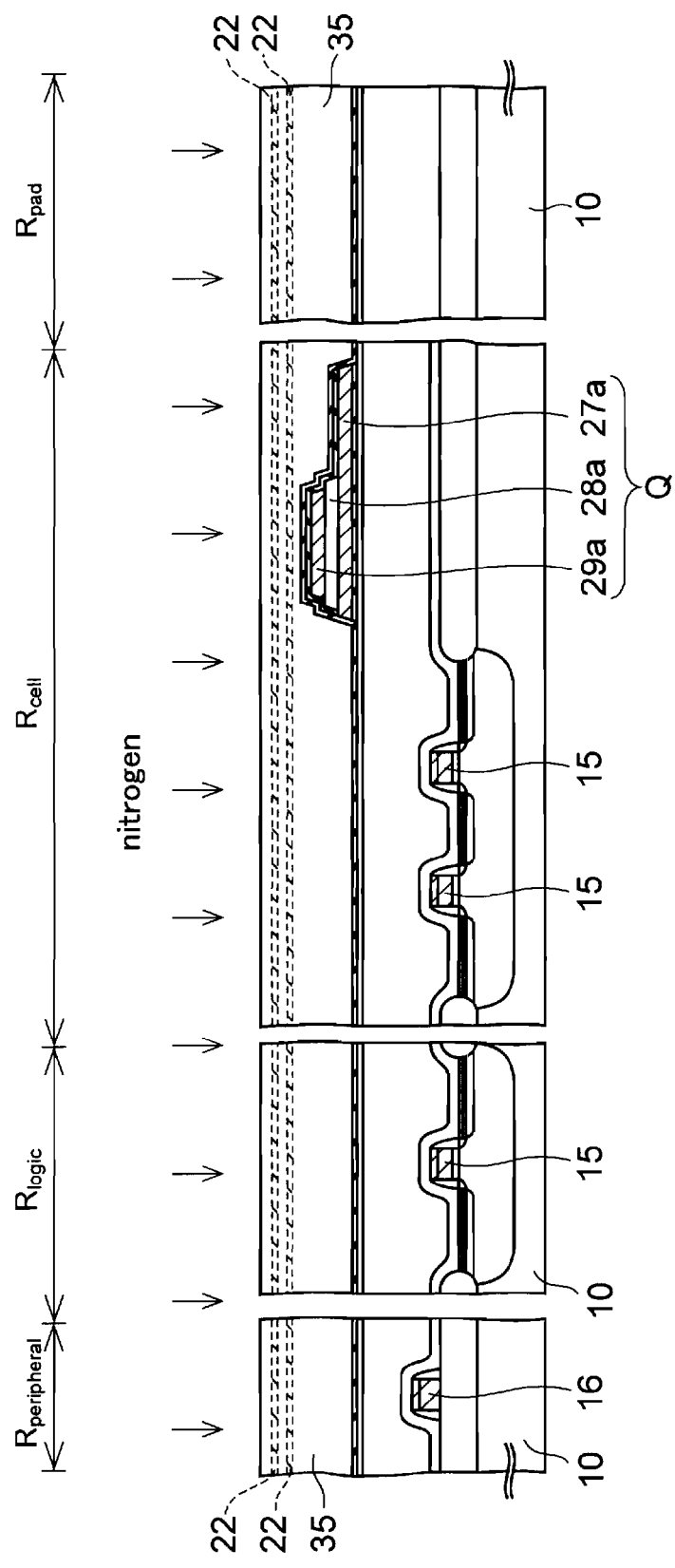

SEMICONDUCTOR DEVICE AND METHOD FOR MANUFACTURING THE SAME

CROSS-REFERENCE TO RELATED APPLICATIONS

The present application is a divisional application of U.S. patent application Ser. No. 12/027,530 filed on Feb. 7, 2008, which is based on and claims priority of Japanese Patent Application No. 2007-044534 filed on Feb. 23, 2007, the entire contents of each of which are incorporated herein by reference.

TECHNICAL FIELD

It is related to a semiconductor device and a method for manufacturing the semiconductor device.

BACKGROUND

In some semiconductor devices such as LSIs, a barrier insulating film is formed on an upper surface of an interlayer insulating film, in order to protect a circuit formed on a semiconductor substrate from the outer atmosphere. A material of the barrier insulating film is selected in accordance with the responsible atmosphere from which the circuit is to be protected.

For example, to protect a circuit from moisture, a silicon nitride film with excellent moisture resistance is formed as the barrier insulating film.

In a ferroelectric device such as an FeRAM, a ferroelectric film is deteriorated due to reduction by a reductant, such as hydrogen. Accordingly, an insulating metal oxide film, such as an alumina film, is formed as the barrier insulating film in order to protect the ferroelectric film from the reductant in the FeRAM.

However, since an insulating metal oxide film, such as an alumina film, is less chemically reactive, there are disadvantages that it is difficult to form a hole in the film by etching, and to form a hole having a stable cross-sectional shape.

Furthermore, a contact defect may possibly occur in a tungsten plug because it is difficult to form the tungsten plug in the hole due to a reaction product generated at the time of etching the alumina film.

The difficulties in forming the hole and the contact defect described above become a factor of deteriorating the yield of the semiconductor device.

In addition, when a metal wiring is directly formed on an alumina film, the alumina film is etched by over-etching at the time when a metal film is etched to form the metal wiring. As a result, barrier performance of the alumina film against the reductants is deteriorated. In view of this fact, it is also possible that a cover insulating film is formed on the alumina film for absorbing the etching, and thereafter, a metal wiring is formed on this cover insulating film.

However, this increases the number of manufacturing processes because a process of forming a cover insulating film and a process of annealing for dehydrating the cover insulating film need to be added.

To overcome such difficulties in forming the hole and the increase in the number of manufacturing processes, it is preferable that a silicon nitride film be formed as a barrier insulating film for preventing hydrogen and moisture penetration even in ferroelectric devices.

In addition, the silicon nitride film can be used as an etching stopper film in addition to being used as the above-mentioned barrier insulating film.

For example, in a damascene process useful for forming a copper wiring, a silicon nitride film and a silicon oxide film are formed in this order. Then, the silicon oxide film is etched while the silicon nitride film is used as an etching stopper film, so that a wiring groove is formed in the silicon oxide film.

However, when the silicon nitride film is formed by a chemical vapor deposition (CVD) method in the ferroelectric device to which the damascene process is applied, capacitor dielectric film is reduced and deteriorated due to hydrogen contained in film-forming atmosphere, so that the yield of the semiconductor device decreases. Accordingly, a film which rarely generates hydrogen at the time of film-forming is required as an etching stopper film used in the damascene process.

Note that techniques relating to the present application are disclosed in the specification of Japanese Patent No. 3019816, and Japanese Patent Application Laid-open Publication Nos. 2000-323572 and 2004-56099.

Among these documents, in Japanese Patent No. 3019816, nitrogen is introduced to a silicon nitride film on a gate electrode of a MOS transistor by ion implantation, and thereafter thermal processing is carried out to thermally diffuse nitrogen into an interface between an insulating sidewall and a silicon substrate.

In Japanese Patent Application Laid-open Publication No. 2000-323572, boron is ion-implanted into an organic spin-on-glass (SOG) film to reduce moisture and hydroxyl groups contained in the organic SOG film.

In Japanese Patent Application Laid-open Publication No. 2004-56099, a silicon nitride film is formed on an interlayer insulating film and a metal wiring.

In addition, patent literature 4 also discloses a technique relating to the present application.

SUMMARY

It is an aspect of the embodiments discussed herein to provide a method for manufacturing a semiconductor device, including, forming an insulating film over a semiconductor substrate, forming an impurity layer in the insulating film by ion-implanting impurities into a predetermined depth of the insulating film, and modifying the impurity layer to a barrier insulating film by annealing the insulating film after the impurity layer is formed.

It is another aspect of the embodiments discussed herein to provide a method for manufacturing a semiconductor device, including, forming an insulating film over a semiconductor substrate, forming an impurity layer in the insulating film by ion-implanting impurities into a predetermined depth of the insulating film, modifying the impurity layer to an etching stopper film by annealing the insulating film after the impurity layer is formed, forming a mask film provided with an opening over the insulating film, forming a groove in the insulating film over the etching stopper film by etching the insulating film through the opening, and embedding a wiring in the groove.

It is still another aspect of the embodiments discussed herein to provide a semiconductor device, including an insulating film formed over a semiconductor substrate, and an impurity-containing insulating film, which is formed in a predetermined depth of the insulating film, and which contains impurities, wherein the concentration of the impurities continuously increases from the insulating film towards the impurity-containing insulating film.

DETAILED DESCRIPTION OF THE PREFERRED EMBODIMENTS

(1) First Embodiment

Figure 1A:
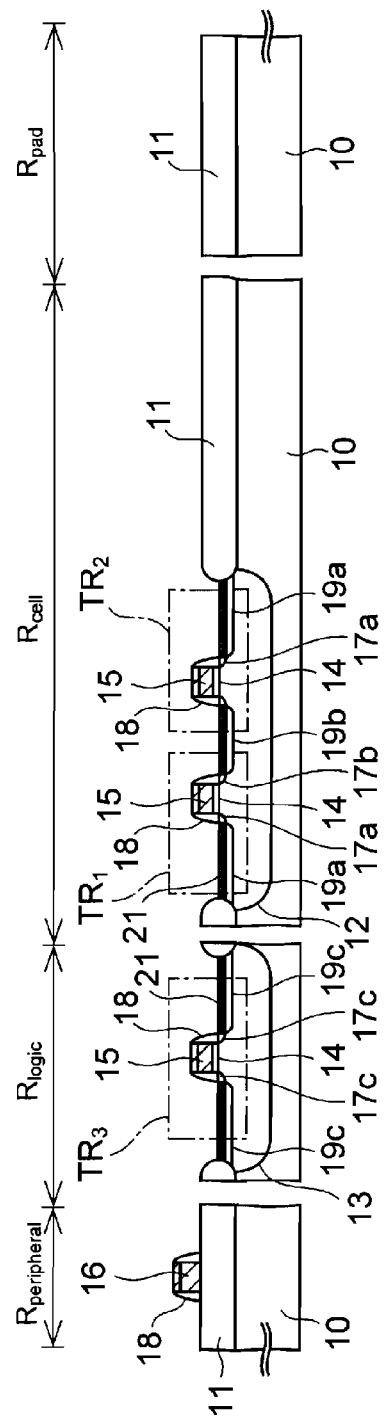
FIGS. 1A to 1Z and 2A to 2D are cross-sectional views of a manufacturing semiconductor device according to a first embodiment.

Firstly, a semiconductor device according to a first embodiment will be described along with its manufacturing processes.

FIGS. 1A to 1Z and 2A to 2D are cross-sectional views of the semiconductor device according to the present embodiment in the course of manufacturing. Note that, in these figures, a peripheral circuit region $R_{peripheral}$, a logic circuit region $R_{logic}$, a cell region $R_{cell}$, and a pad region $R_{pad}$, all of which are in one semiconductor chip, are shown.

This semiconductor device is a planer-type FeRAM, and is manufactured as follows.

Firstly, processes for obtaining a cross-sectional structure shown in FIG. 1A will be described.

A surface of an n-type or p-type silicon (semiconductor) substrate 10 is thermally oxidized to form a device isolation insulating film 11. This device isolation film 11 defines active regions of transistors. The film thickness of the device isolation insulating film 11 is, for example, approximately 200 nm when measured from an upper surface of the silicon substrate 10. Such a device isolation structure is referred to as a local oxidation of silicon (LOCOS). In place of this, shallow trench isolation (STI) may be employed.

Subsequently, p-type impurities, boron for example, are introduced into the active regions of the silicon substrate 10 to form first and second p-wells 12 and 13, and thereafter the surfaces of the active regions are thermally oxidized to form thermally-oxidized films to be gate insulating films 14 with the thickness of approximately 6 nm to 7 nm.

After that, an amorphous silicon film with the thickness of approximately 50 nm and a tungsten silicide film with a thickness of approximately 150 nm are sequentially formed on the entire upper surface of the silicon substrate 10. Here, a polycrystal silicon film may be formed in place of the amorphous silicon film. Thereafter, these films are patterned by photolithography, so that gate electrodes 15 are formed in the logic circuit region $R_{logic}$ and cell region $R_{cell}$ on the silicon substrate 10, and a wiring 16 is formed in the peripheral circuit region $R_{peripheral}$ on the device isolation insulating film 11.

The gate length of gate electrode 15 is, for example, approximately 360 μm.

Furthermore, phosphorus is introduced as n-type impurities into the silicon substrate 10 beside the gate electrodes 15 by ion implantation using the gate electrodes 15 as a mask. Thereby, first to third source/drain extensions 17a to 17c are formed.

After that, an insulating film is formed on the entire upper surface of the silicon substrate 10, and the insulating film is etched back to be left, as insulating sidewalls 18, beside the gate electrodes 15 and the wiring 16. For example, a silicon oxide film is formed as the insulating film with the thickness of 45 nm by a chemical vapor deposition (CVD) method.

Subsequently, by carrying out again the ion implantation to introduce n-type impurities such as arsenic into the silicon substrate 10 while using the insulation sidewalls 18 and the gate electrodes 15 as a mask, first to third source/drain regions (conductive patterns) 19a to 19c are formed in the silicon substrate 10 at the sides of the gate electrodes 15.

Furthermore, a refractory metal film, such as a cobalt film, is formed on the entire upper surface of the silicon substrate 10 by a sputtering method. Then, the refractory metal film is heated, and thereby caused to react with silicon. Accordingly, a refractory metal silicide layer 21, such as a cobalt silicide layer, is formed in the first to third source/drain regions 19a to 19c on the silicon substrate 10. Thereby, resistance of each of the first to third source/drain regions 19a to 19c is lowered. Note that such a refractory metal silicide layer is also formed on surface layers of the gate electrodes 15 and the wiring 16.

Thereafter, the refractory metal layer left unreacted on the device isolation insulating film 11 and the like is removed by wet etching.

With the processes described so far, first to third MOS transistors $TR_1$ to $TR_3$, each of which is constructed from a gate insulating film 14, a gate electrode 15, and at least one of first to third source/drain regions 19a to 19c, and the like, are formed in the cell region $R_{cell}$ and logic circuit region $R_{logic}$ on the silicon substrate 10.

Figure 1B:
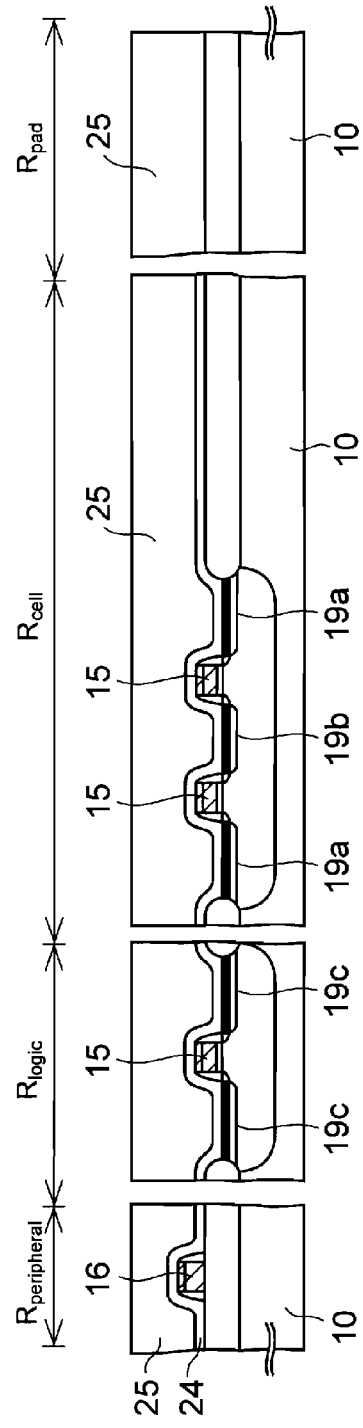

Next, as shown in FIG. 1B, a silicon oxynitride (SiON) film is formed with the thickness of approximately 200 nm on the entire upper surface of the silicon substrate 10 by a plasma CVD method as a base insulating film 24.

Furthermore, a silicon oxide ($SiO_2$) film is formed as a first insulating film 25 with the thickness of approximately 600 nm on the base insulating film 24, by the plasma CVD method using a mixed gas of a tetraethoxysilane (TEOS) gas and an oxygen gas. Thereafter, the upper surface of the first insulating film 25 is polished to be planarized, by means of a chemical mechanical polishing (CMP) method. The amount of this polishing is, for example, approximately 200 nm.

Here, moisture contained in the base insulating film 24 and the first insulating film 25 may possibly reduce and deteriorate a capacitor dielectric film of a ferroelectric capacitor which will be formed on the first insulating film 25 later.

Figure 1C:
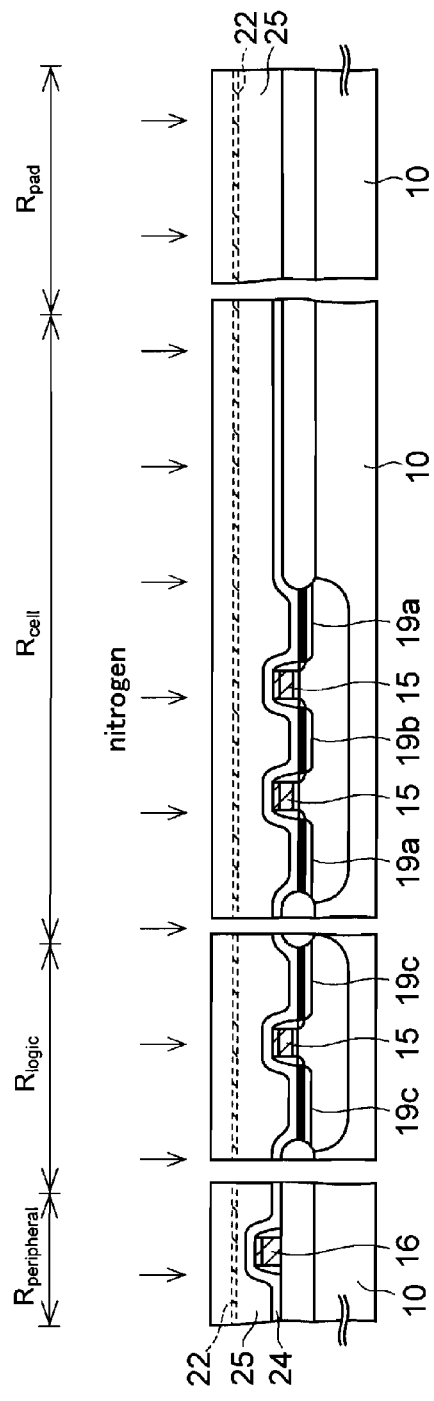

To deal with this problem, in the next process, as shown in FIG. 1C, nitrogen is ion-implanted as impurities into the predetermined depth of the first insulating film 25, so that an impurity layer 22 is formed in the first insulating film 25 in order to prevent moisture from diffusing upwardly from the substrate side. The conditions for this ion implantation are not particularly limited. In the present embodiment, the condition is set that acceleration energy is 5 keV and a dose amount is $1 \times 10^{15}$ $cm^{-2}$. With such acceleration energy, a peak concentration of impurities of the impurity layer 22 locates at the depth of approximately 20 nm from the upper surface of the first insulating film 25.

In addition, since the upper surface of the first insulating film 25 is planarized by CMP before this ion implantation, an implanted distance of nitrogen from the upper surface of the first insulating film 25 is made uniform in the substantially entire portion of the first insulating film 25, so that the planar impurity layer 22 can be formed.

However, barrier performance against moisture of the impurity layer 22 cannot be sufficiently secured because nitrogen simply remains inside the first insulating film 25 by simply carrying out the ion implantation as described above.

Figure 1D:
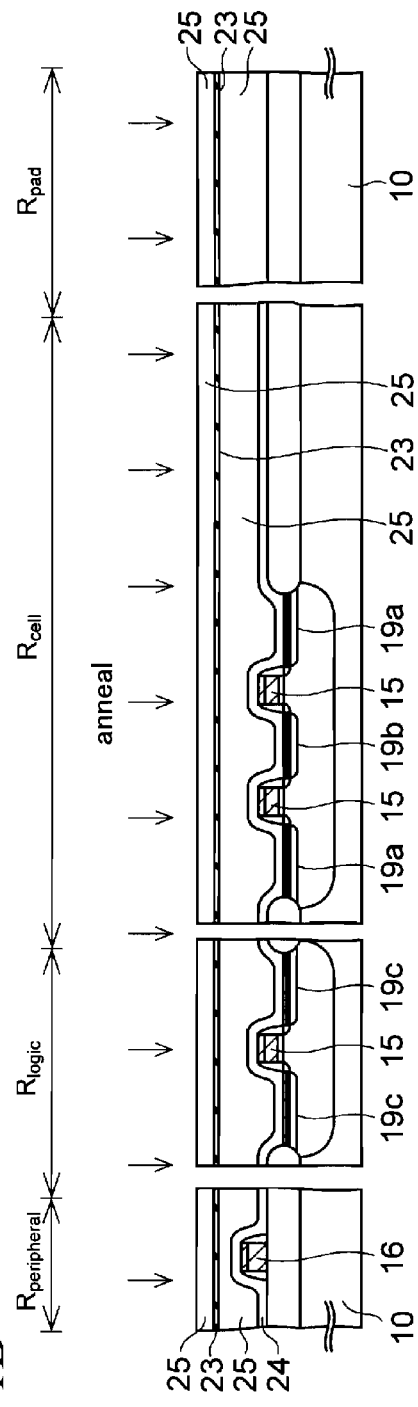

For this reason, in the present embodiment, as shown in FIG. 1D, by carrying out annealing on the impurity layer 22, nitrogen in the impurity layer 22 is caused to react with silicon in the first insulating film 25. Thereby, the impurity layer 22 is modified to a barrier insulating film (an impurity-containing insulating film) 23 containing silicon nitride.

This annealing is carried out in a vertical or horizontal furnace with the substrate temperature of 800° C. to 1000° C. for approximately 30 to 60 minutes in an atmosphere of an inert gas, such as argon or nitrogen, for example.

Note that this annealing may be carried out by rapid thermal anneal (RTA) in place of the furnace. In this case, a processing time is required for only a short time of 2 to 20 seconds.

In addition, since the planer impurity layer 22 is formed by planarizing the first insulating film 25 in advance as described above, the barrier insulating film 23 is also planarized. Accordingly, a locally thin portion is difficult to be formed in the barrier insulating film 23, and thereby it is made possible that capability of preventing moisture by the barrier film 23 can be improved.

Figure 25:
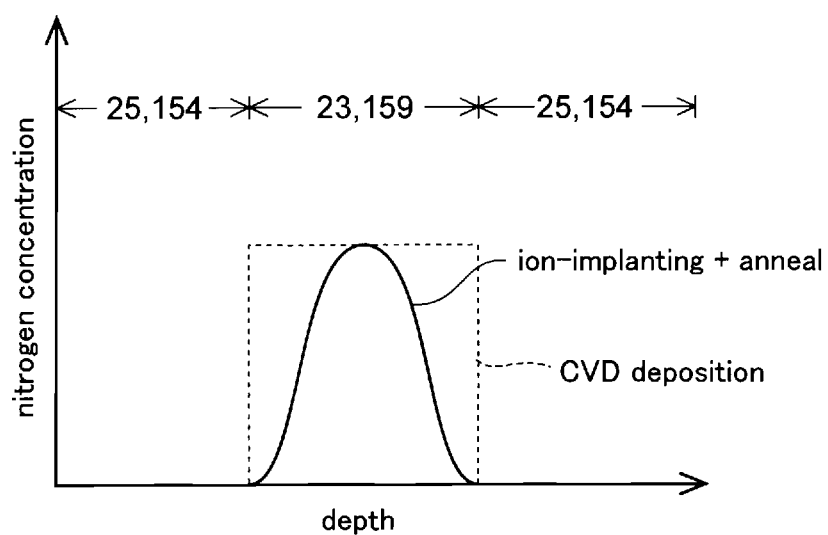
FIG. 25 is a graph schematically showing nitrogen concentrations of a barrier insulating film and an etching stopper film in each embodiment.

FIG. 25 is a graph schematically showing a relationship between a depth from the upper surface of the first insulating film 25 and a nitrogen concentration.

As shown by the solid line in FIG. 25, when the barrier insulating film 23 is formed by the ion implantation and the annealing as in the above, the nitrogen concentration continuously increases from the first insulating film 25 towards the barrier insulating film 23.

In contrast, when the barrier insulating film 23 is formed by the CVD method or the like, an interface between the first insulating film 25 and the barrier insulating film 23 becomes clear as shown by a dotted line in the same graph, so that the nitrogen concentration discontinuously increases decreases in the interface.

In this manner, the present embodiment is characterized in that the nitrogen concentration continuously increases from the first insulating film 25 towards the barrier insulating film 23, and accordingly, that there is no distinct interface between the first insulating film 25 and the barrier insulating film 23. Such characteristics can also be seen in the following second to fourth embodiments.

Figure 1E:
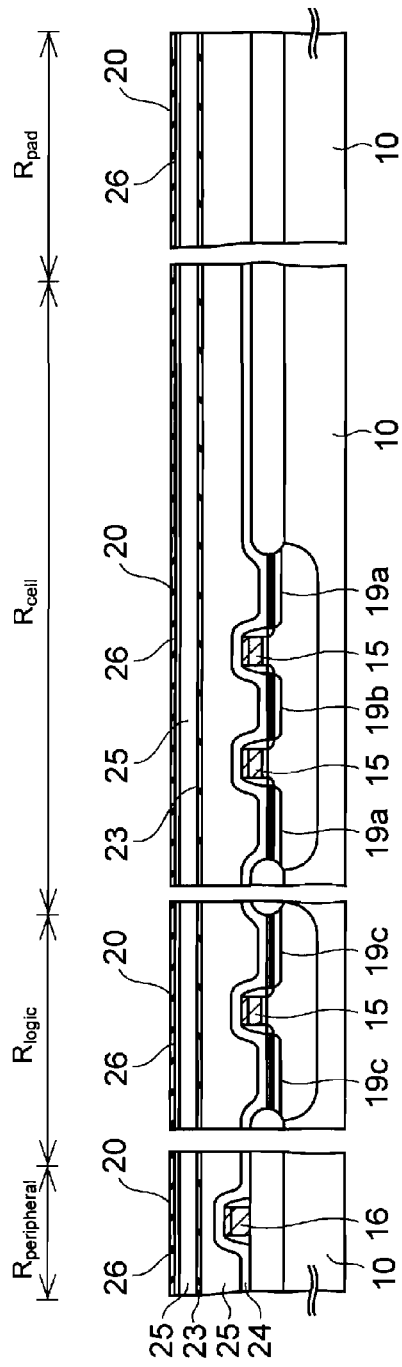

Next, as shown in FIG. 1E, a silicon oxide film is formed again with the thickness of approximately 100 nm on the first insulating film 25 by the plasma CVD method using the TEOS gas. This silicon oxide film is used as a first cap insulating film 26.

Then, annealing with the substrate temperature of approximately 650° C. is carried out in a nitrogen atmosphere for approximately 30 minutes, as dehydration processing of these insulating films 25 and 26. Thereafter, an alumina film 20 is formed with the thickness of approximately 20 nm on the first cap insulating film 26 by the sputtering method.

After that, RTA with the substrate temperature of 650° C. and a processing time of 60 seconds is carried out on this alumina film 20 in an oxygen atmosphere.

By forming the first cap insulating film 26 in advance in this manner, fine scars (micro scratches) on the upper surfaces of the first insulating film 25, which are made by coming in contact with a polishing pad during CMP on the first insulting film 25, are embedded by the first cap insulating film 26. Thus, the preferably-planarized alumina film 20 can be formed on the upper surface of the first cap insulating film 26.

Figure 1F:
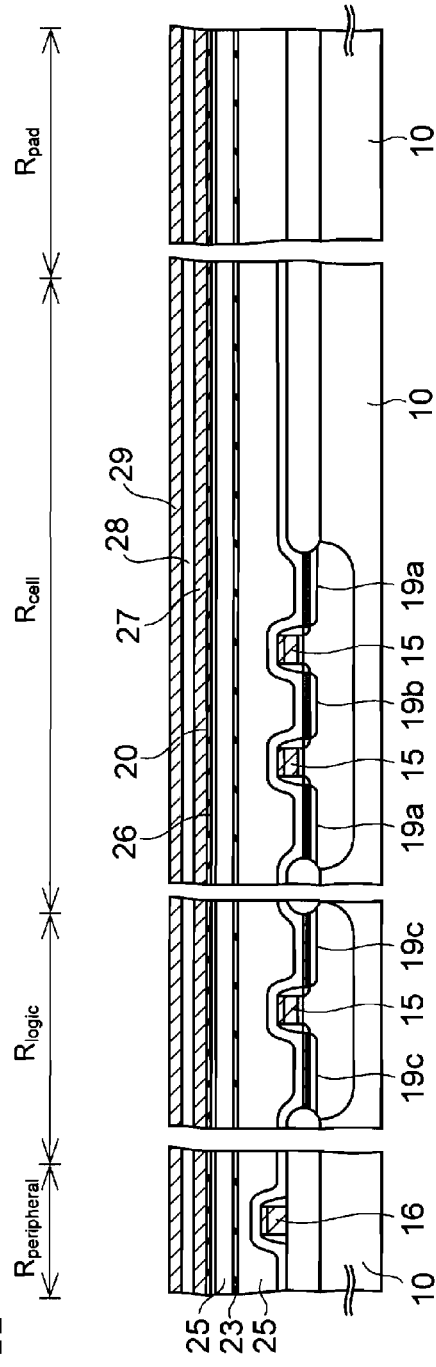

Next, processes for obtaining a cross-sectional structure shown in FIG. 1F will be described.

Firstly, a platinum film is formed as a first conductive film 27 on the alumina film 20 by the sputtering method. This first conductive film 27 is to be a capacitor lower electrode with the film thickness of approximately 155 nm by being patterned later.

Furthermore, a lead zirconate titanate (PZT: $PbZr_{1-x}Ti_xO_3$) film is formed with the thickness of 150 nm to 200 nm on the first conductive film 27 by the sputtering method as a ferroelectric film 28.

As a method for forming the ferroelectric film 28, there are a metal organic CVD (MOCVD) method and a sol-gel method in addition to the sputtering method. Furthermore, a material of the ferroelectric film 28 is not limited to the above-described PZT, and it may be formed of Bi layer structure compounds, such as SBT ($SrBi_2Ta_2O_9$), $SrBi_2(Ta_xNb_{1-x})_2O_9$, or $Bi_4Ti_2O_{12}$. Moreover, PLZT($Pb_{1-x}La_xZr_{1-y}Ti_yO_3$), which is formed by doping lanthanum into PZT, or other metal oxide ferroelectric substance may be used as the materials of the ferroelectric film 28.

Here, the PZT formed by the sputtering method is hardly crystallized just after being formed, and has poor ferroelectric characteristics. For this reason, as crystallization annealing for crystallizing PZT constituting the ferroelectric film 28, RTA with the substrate temperature of approximately 585° C. is carried out for approximately 90 seconds in an atmosphere containing oxygen with the oxygen flow rate of 0.025 liter per minute. Note that when the ferroelectric film 28 is formed by the MOCVD method, this crystallization annealing is not needed.

Subsequently, a first iridium oxide ($IrO_2$) film is formed with the thickness of approximately 50 nm on the above-described ferroelectric film 28 by the sputtering method, and RTA is carried out on this first iridium oxide film. The conditions for the RTA are not particularly limited. In the present embodiment, the RTA is carried out in the atmosphere containing oxygen with the oxygen flow rate of 0.025 liter per minute with the substrate temperature of 725° C. for a processing time of 20 seconds.

Thereafter, a second iridium oxide film is formed with the thickness of approximately 200 nm on the first iridium oxide film by the sputtering method. Then, a laminated film formed of these first and second iridium oxide films is used as a second conductive film 29.

Here, by forming the first conductive film 27 on the alumina film 20, the orientation of platinum constituting the first conductive film 27 becomes preferable when compared with the case where the first conductive film 27 is directly formed on the first cap insulating film 26 without the alumina film 20. Due to the effect of the orientation of the first conductive film 27, the orientation of the PZT constituting the ferroelectric film 28 is aligned, so that the ferroelectric characteristics of the ferroelectric film 28 are improved.

Figure 1G:
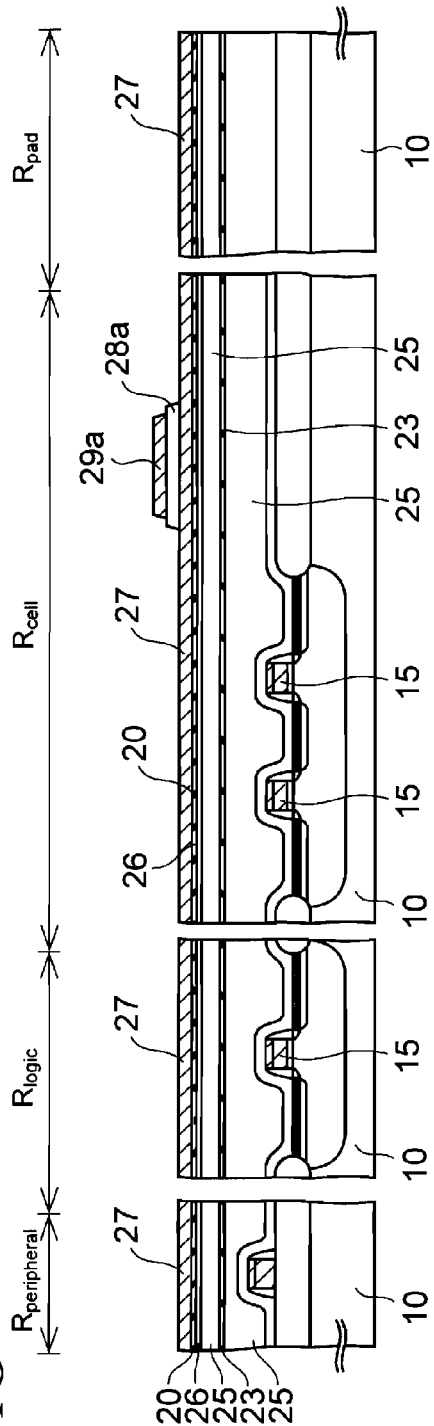

Next, processes for obtaining a cross-sectional structure shown in FIG. 1G will be described.

Firstly, an upper electrode 29a is formed by patterning the second conductive film 29 by photolithography. Then, in order to recover damages received in the ferroelectric film 28 due to this patterning, a recovery annealing is carried out on the ferroelectric film 28 in a vertical furnace. This recovery annealing is carried out in the atmosphere containing oxygen with the oxygen flow rate of 20 liters per minute. The recovery annealing is carried out under conditions that the substrate temperature is 650° C. and a processing time is 60 minutes.

Thereafter, the ferroelectric film 28 is patterned by photolithography to form a capacitor dielectric film 28a made of a ferroelectric material, such as PZT. Damages received in the capacitor dielectric film 28a due to this patterning are recovered by the recovery annealing. This annealing is carried out in the atmosphere containing oxygen by using the vertical furnace. The adopted conditions for the annealing are the oxygen flow rate of 20 liters per minute, the substrate temperature of 350° C., and a processing time of 60 minutes.

Figure 1H:
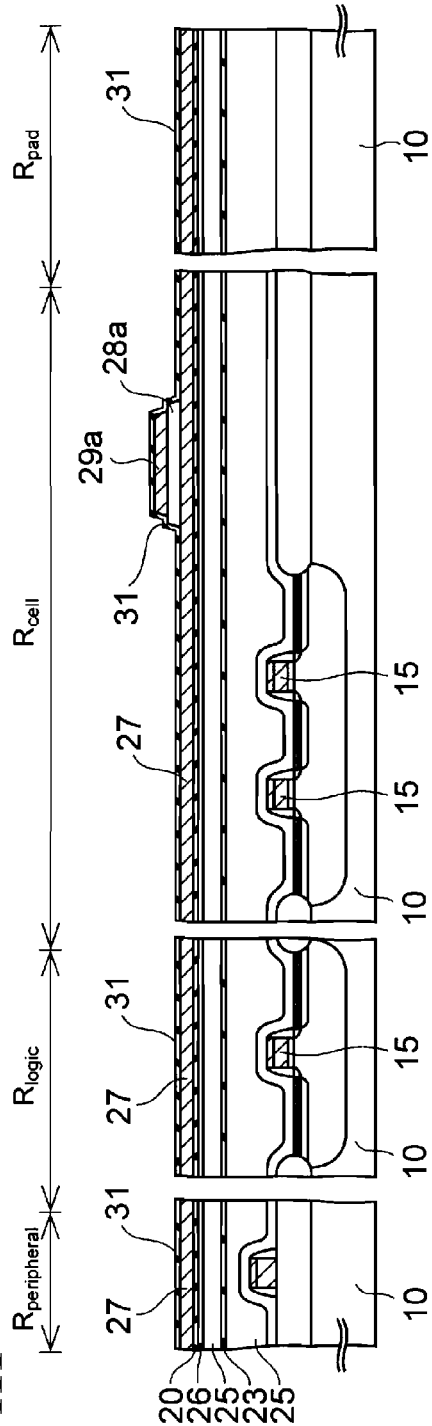

Next, as shown in FIG. 1H, an alumina film as a first capacitor protective insulating film 31 is formed with the thickness of approximately 50 nm on the entire upper surface of the silicon substrate 10 for protecting the capacitor dielectric film 28a from reductants, such as hydrogen and moisture.

In place of the alumina film, any one of a titanium oxide ($TiO_x$) film, a zirconium oxide ($ZrO_x$) film, a magnesium oxide ($MgO_x$) film, and a magnesium titanium oxide ($MgTiO_x$) film may be formed as the first capacitor protective insulating film 31.

Then, in order to recover damages received in the capacitor dielectric film 28a due to this sputtering, recovery annealing is carried out with the substrate temperature of 550° C. in the atmosphere containing oxygen with the oxygen flow rate of 20 liters per minute for approximately 60 minutes. This annealing is carried out by using the vertical furnace.

Figure 1I:
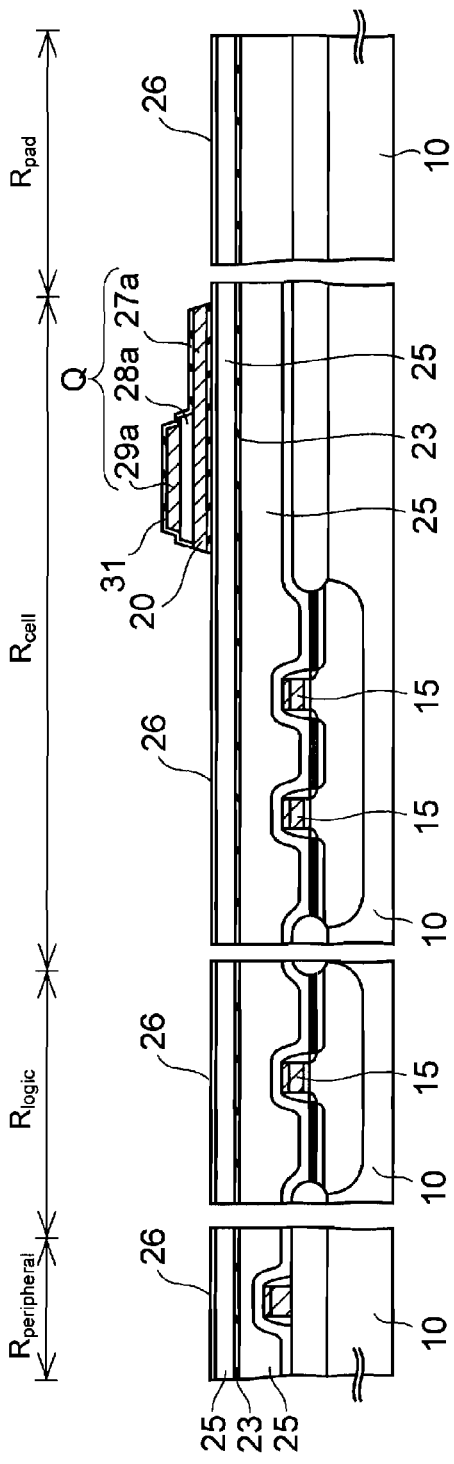

Next, as shown in FIG. 1I, the first conductive film 27 under the capacitor dielectric film 28a is made into a lower electrode 27a by patterning the first conductive film 27 and the first capacitor protective insulating film 31 by photolithography, while the first capacitor protective insulating film 31 is left so as to cover this lower electrode 27a.

Note that, in this patterning, the alumina film 20 which is not covered by the lower electrode 27a is also removed.

Thereafter, in order to recover damages received in the capacitor dielectric 28a during the processes, recovery annealing is carried out on the capacitor dielectric film 28a in the atmosphere containing oxygen with the oxygen flow rate of 20 liters per minute under conditions with the substrate temperature of 650° C. and a processing time of 60 minutes. This recovery annealing is carried out, for example, in a vertical furnace.

With the processes described so far, a capacitor Q, which is constructed by stacking the lower electrode 27a, the capacitor dielectric film 28a, and the upper electrode 29a in this order, is formed on the first insulating film 25. Note that although a plurality of capacitors Q is formed in a cell region $R_{cell}$, only one capacitor Q is shown in the figure for simplicity in this embodiment.

Figure 1J:
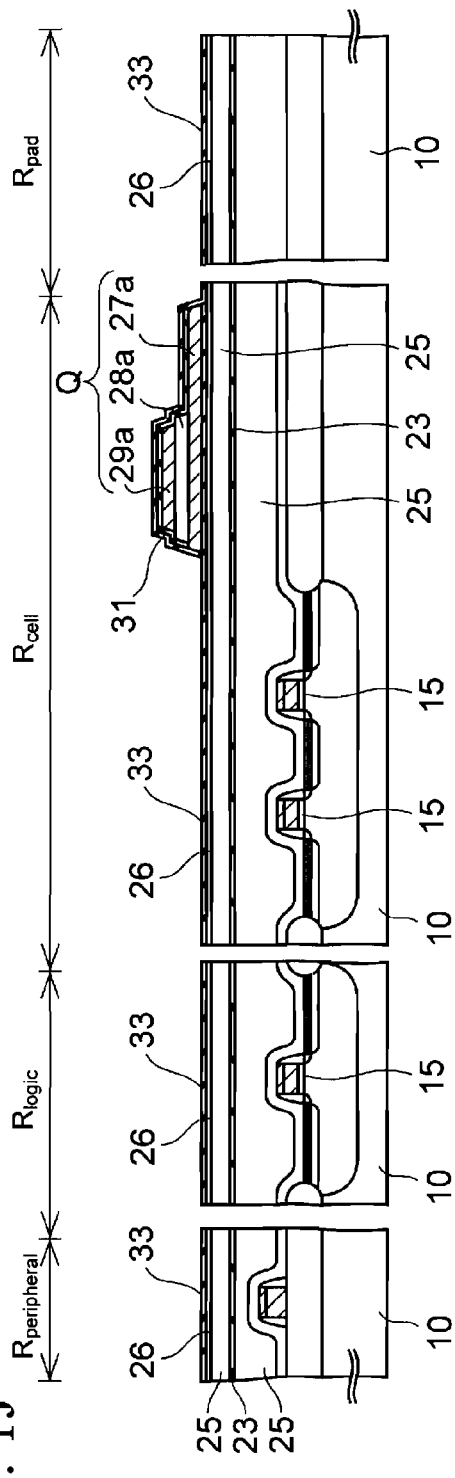

Next, as shown in FIG. 1J, an alumina film is formed with the thickness of approximately 20 nm on the entire upper surface of the silicon substrate 10 as a second capacitor protective insulating film 33 for protecting the capacitor Q by the sputtering method. This second capacitor protective insulating film 33, together with the first capacitor protective insulating film 31 thereunder, prevents reductants, such as hydrogen and moisture, from coming in contact with the capacitor dielectric film 28a, and has a function of suppressing deterioration of ferroelectric characteristics of the capacitor dielectric film 28a due to reduction thereof.

Films having such a function include a titanium oxide film, a zirconium oxide film, a magnesium oxide film, and a magnesium titanium oxide film in addition to the alumina film. The second capacitor protective insulating film 33 may be formed of any one of these films.

Then, the recovery annealing is carried out on the capacitor dielectric film 28a in the vertical furnace with the atmosphere containing oxygen, under conditions with the substrate temperature of 550° C. and a processing time of 60 minutes. The oxygen flow rate in this annealing is, for example, 20 liters per minute.

Figure 1K:
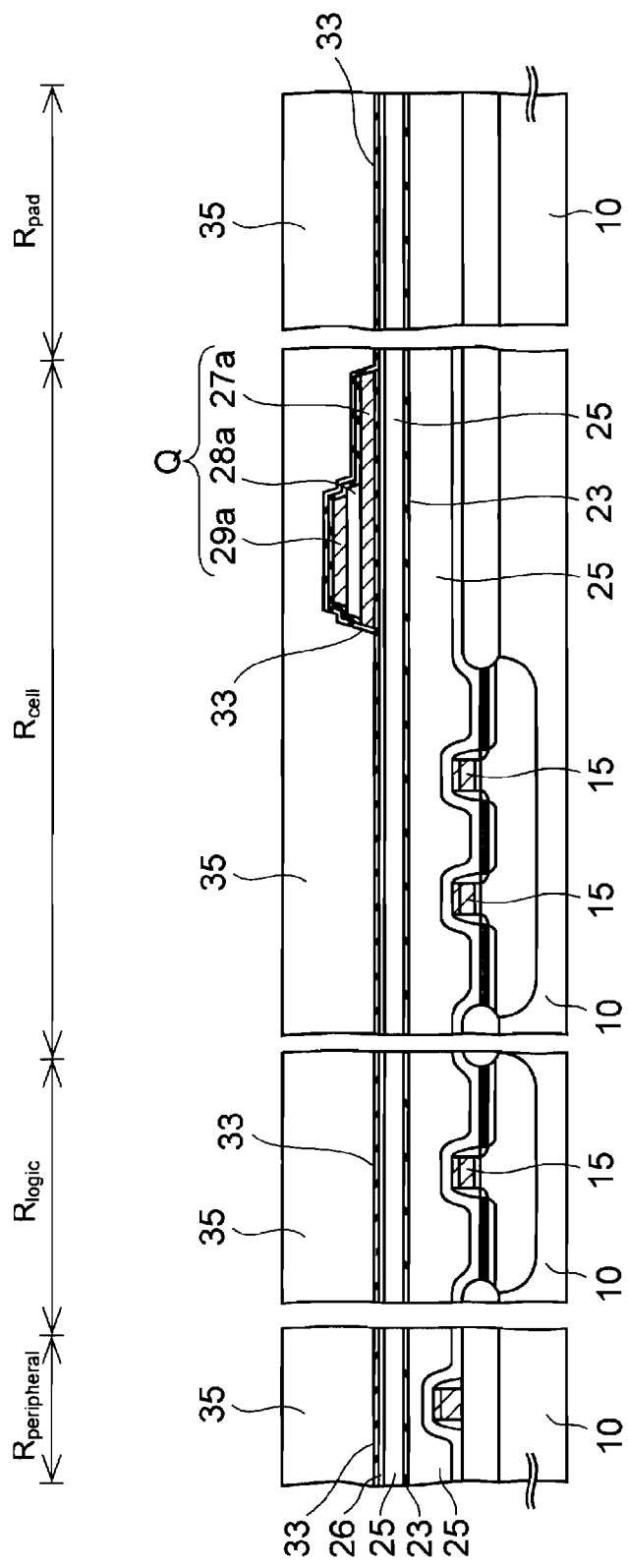

Next, as shown in FIG. 1K, a silicon oxide film is formed with the thickness of approximately 1500 nm on the above-described second capacitor protective insulating film 33 by the plasma CVD method using the TEOS gas. This silicon oxide film is used as a second insulating film 35.

Thereafter, $N_2O$ plasma processing (thermal processing) using a CVD equipment is carried out on the second insulating film 35 as dehydration processing. In this case, a substrate temperature is set to 350° C., and a processing time is set to two minutes.

With such $N_2O$ plasma processing, the second insulating film 35 is dehydrated, and the upper surface of the second insulating film 35 is nitrided. Thereby, moisture is prevented from being absorbed again into the second insulating film 35.

Figure 1L:
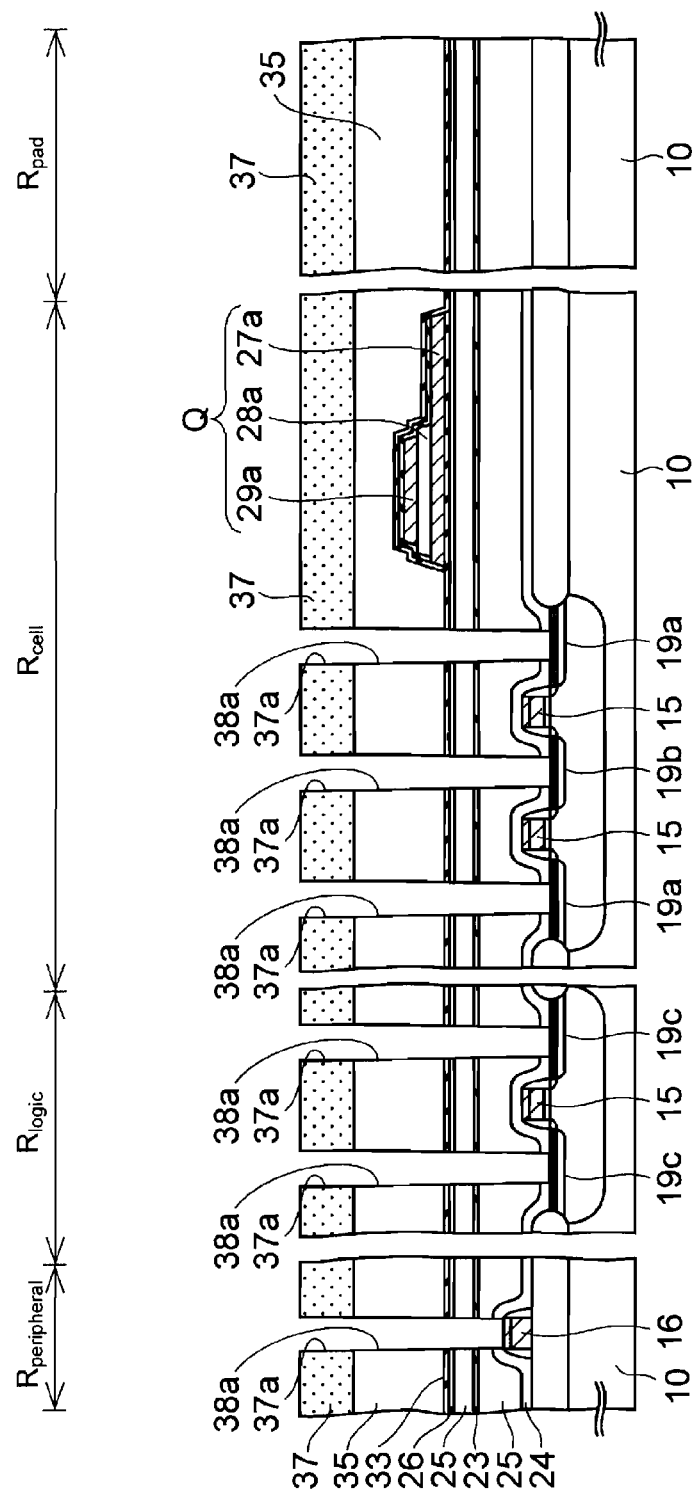

Next, processes for obtaining a cross-sectional structure shown in FIG. 1L will be described.

Firstly, a photoresist is coated on the second insulating film 35. The photoresist is exposed and developed to form a first resist pattern 37 provided with hole-shaped first windows 37a.

Subsequently, dry etching is carried out on films from the second insulating film 35 to the base insulating film 24 by using the first resist pattern as a mask. Thereby, first holes 38a are formed in these insulating films under the first windows 37a.

This dry etching is carried out in a parallel plate-type plasma etching equipment (not shown). Then, a mixed gas of $C_4F_8$, $O_2$, and Ar is used as an etching gas for the first and second insulating films 25 and 35 and the first cap insulating film 26 each made of silicon oxide. Note that a CO gas may be added to the mixed gas in some cases. In addition, the second capacitor protective insulating film 33 made of alumina is also etched by a sputtering effect of this etching gas.

In contrast, a mixed gas of $CHF_3$, $O_2$, and Ar is used as an etching gas for the barrier insulating film 23 containing silicon nitride and the base insulating film 24 made of silicon oxynitride.

After such etching is finished, the first resist pattern 37 is removed.

Figure 1M:
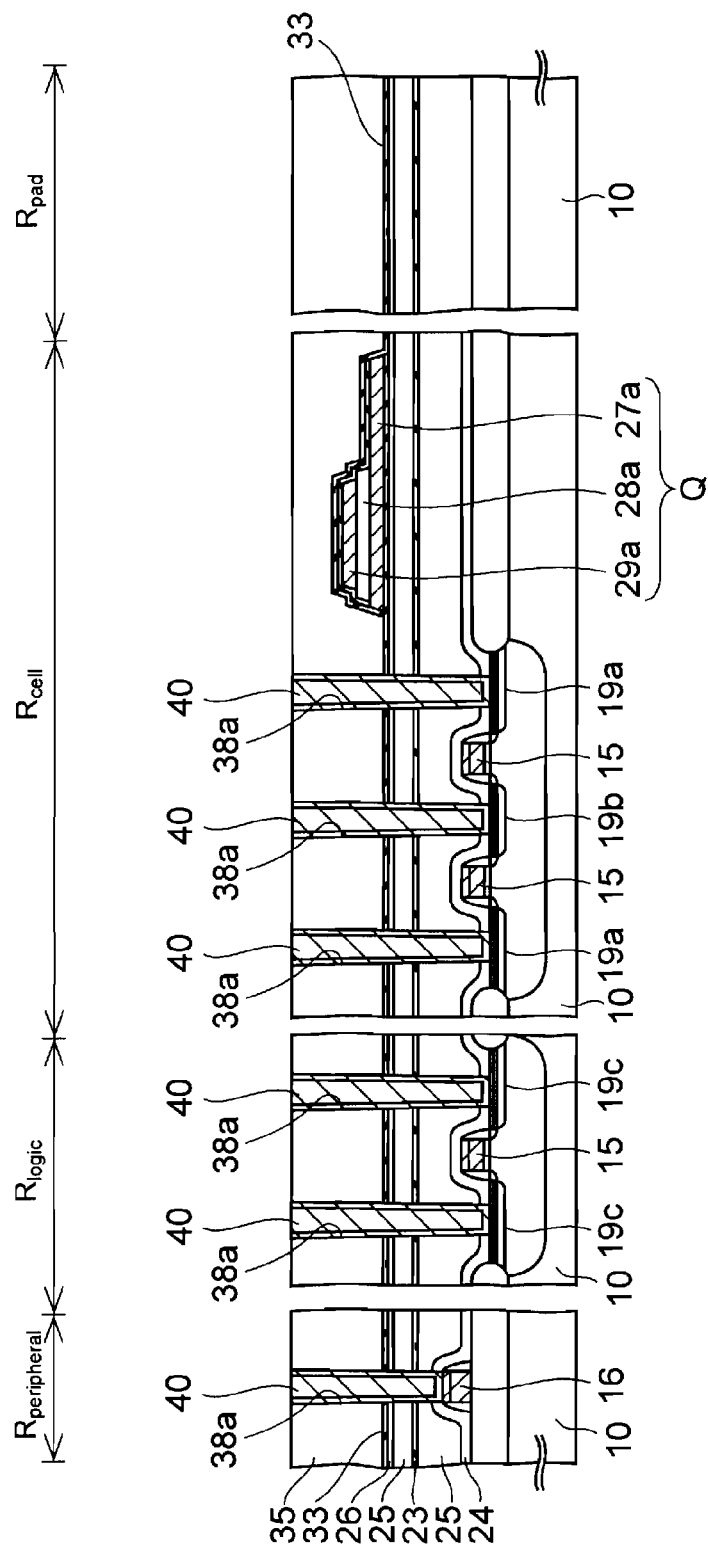

Next, processes for obtaining a cross-sectional structure shown in FIG. 1M will be described.

Firstly, a titanium (Ti) film with the thickness of 20 nm and a titanium nitride (TiN) film with the thickness of 50 nm are formed on the inner surfaces of the first holes 38a and the upper surface of the second insulating film 35 by the sputtering method. These films are used as a glue film. Then, a tungsten film is formed with the thickness of 500 nm on the glue film by the CVD method using a tungsten hexafluoride gas, and this tungsten film completely embeds the first holes 38a.

Thereafter, the excessive glue film and tungsten film on the second insulating film 35 are polished and removed by the CMP method, and these films are left in the first holes 38a as first conductive plugs (conductive materials) 40.

Among these conductive plugs, the first conductive plugs 40 formed in the cell reason are electrically connected to the first and second source/drain regions 19a and 19b. In contrast, the first conductive plugs 40 formed in the logic circuit region $R_{logic}$ are electrically connected to the third source/drain regions 19c. Then, the first conductive plug 40 formed in the peripheral circuit region $R_{peripheral}$ is electrically connected to the wiring 16.

Note that $N_2O$ plasma processing using the CVD equipment may be carried out on the second insulating film 35 after the first conductive plugs 40 are formed in order to dehydrate the second insulating film 35 and prevent the film 35 from absorbing moisture again. This dehydration processing is carried out under conditions with, for example, the substrate temperature of 350° C. and a processing time of two minutes.

Incidentally, the first conductive plugs 40 are mainly formed of tungsten which is oxidized very easily. For this reason, contact defect may possibly occur in the atmosphere containing oxygen.

Figure 1N:
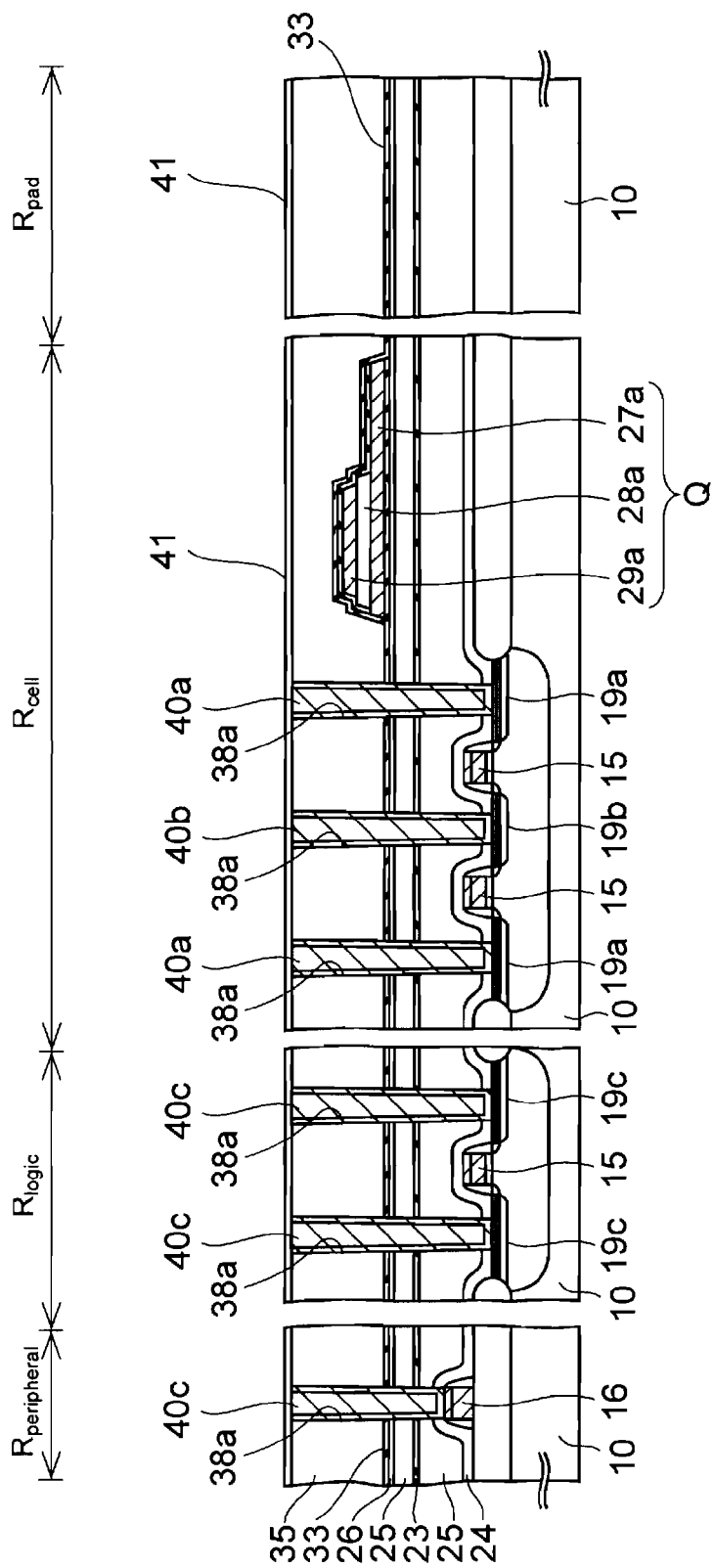

To deal with this problem, in the next process, as shown in FIG. 1N, to protect the first conductive plugs 40 from being oxidized, a silicon oxynitride film is formed by the CVD method with the thickness of approximately 100 nm as an oxidation prevention insulating film 41 on each of the upper surfaces of the first conductive plugs 40 and second insulating film 35.

Next, processes for obtaining a cross-sectional structure shown in FIG. 1O will be described.

Firstly, a photoresist is coated on the oxidation prevention insulating film 41. The photoresist is then exposed and developed to form a second resist pattern 43. As shown in the drawing, hole-shaped second and third windows 43a and 43b are formed in the second resist pattern 43 on each of the upper and lower electrodes 29a and 27a.

Subsequently, while using the second resist pattern 43 as a mask, the oxidation prevention insulating film 41, the second insulating film 35, and the first and second capacitor protective insulating films 31 and 33 are etched. Thereby, a second hole 35a is formed on the upper electrode 29a, and a third hole 35b is formed on the contact region of the lower electrode 27a.

Then, after the second resist pattern 43 is removed, to recover damages received in the capacitor dielectric film 28a during the processes so far, the silicon substrate 10 is placed in the vertical furnace with the atmosphere containing oxygen, and the recovery annealing is carried out on the capacitor dielectric film 28a under conditions with the substrate temperature of 500° C. and a processing time of 60 minutes. At this time, a flow rate of oxygen is set to be, for example, 20 liters per minute.

Thereafter, the oxidation prevention insulating film 41 is etched back and removed.

Figure 1P:
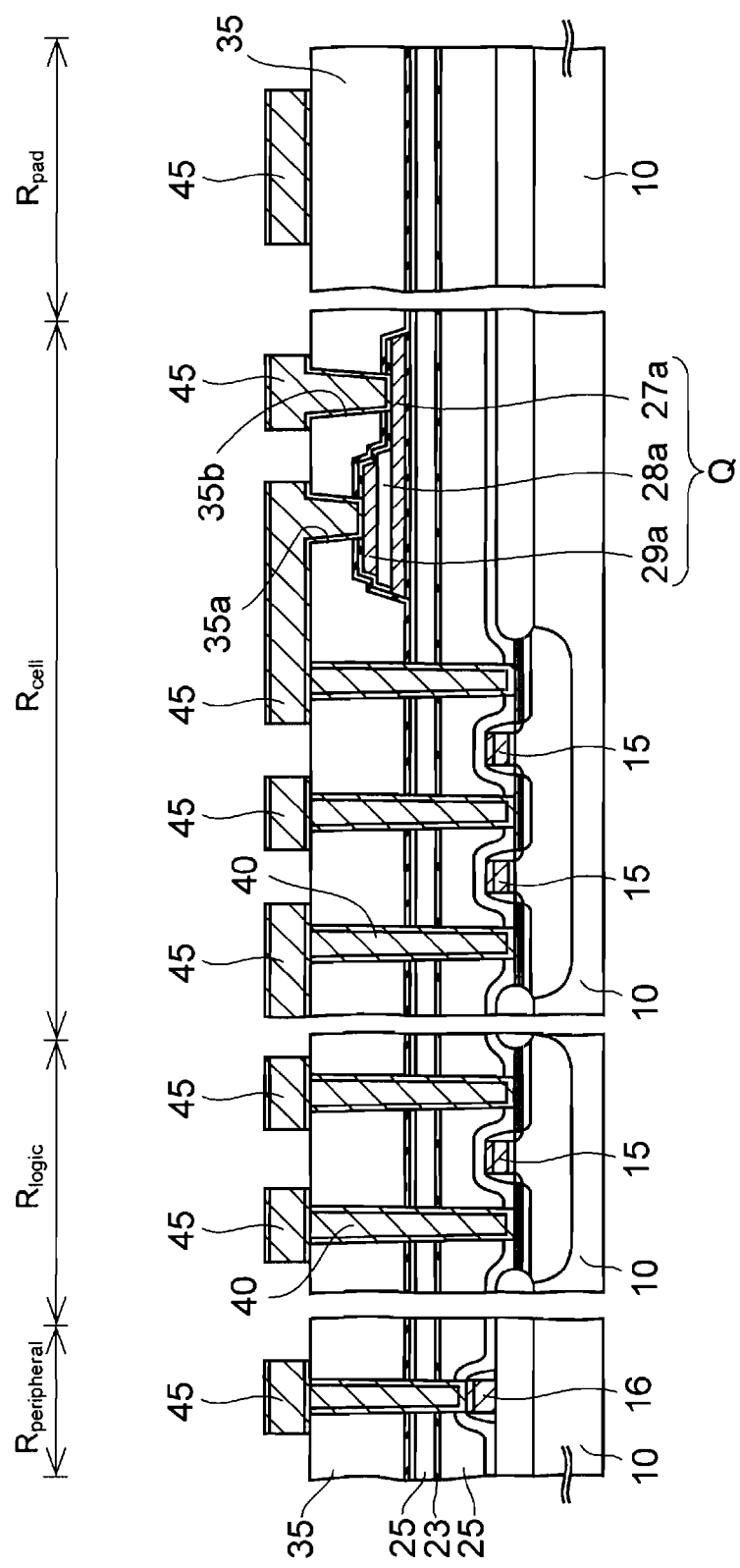

Next, processes for obtaining a cross-sectional structure shown in FIG. 1P will be described.

Firstly, a metal laminated film is formed by the sputtering method on each of the upper surfaces of the second insulating film 35 and first conductive plugs 41 and the inner surfaces of the second and third holes 35a and 35b. In the present embodiment, a titanium nitride film with the thickness of approximately 150 nm, a copper-containing aluminum film with the thickness of approximately 550 nm, a titanium film with the thickness of approximately 5 nm, and a titanium nitride film with the thickness of approximately 150 nm are formed in this order as the metal laminated film.

Then, the metal laminated film is patterned by photolithography to form first metal wirings 45 on the second insulating film 35. Among these first metal wirings 45, those formed on the capacitor Q are electrically connected to the upper and lower electrodes 29a and 27a through the above-described first and second holes 35a and 35b, respectively.

Note that the first metal wirings 45 formed in the first and second holes 35a and 35b serve as conductive plugs (conductive materials).

Figure 1Q:
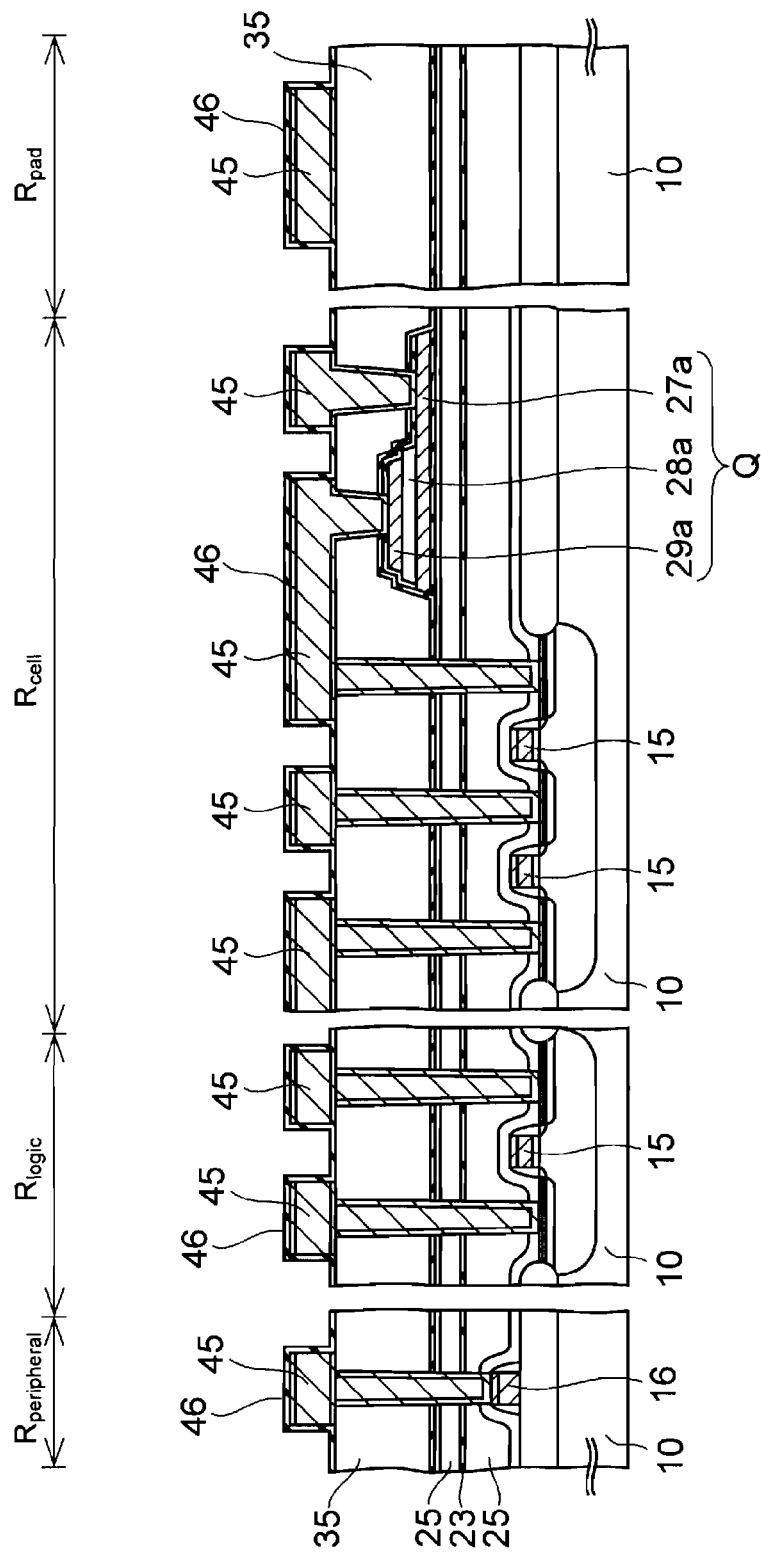

Next, as shown in FIG. 1Q, an alumina film is formed with the thickness of 20 nm by the sputtering method as a third capacitor protective insulating film 46 which covers the first metal wirings 45 and the second insulating film 35.

This third capacitor protective insulating film 46 has a function to protect the capacitor dielectric film 28a by blocking reductants, such as hydrogen and moisture. Films having such a function include a titanium oxide film, a zirconium oxide film, a magnesium oxide film, and a magnesium titanium oxide film in addition to the alumina film. The third capacitor protective insulating film 46 may be formed of any one of these films.

Figure 1R:
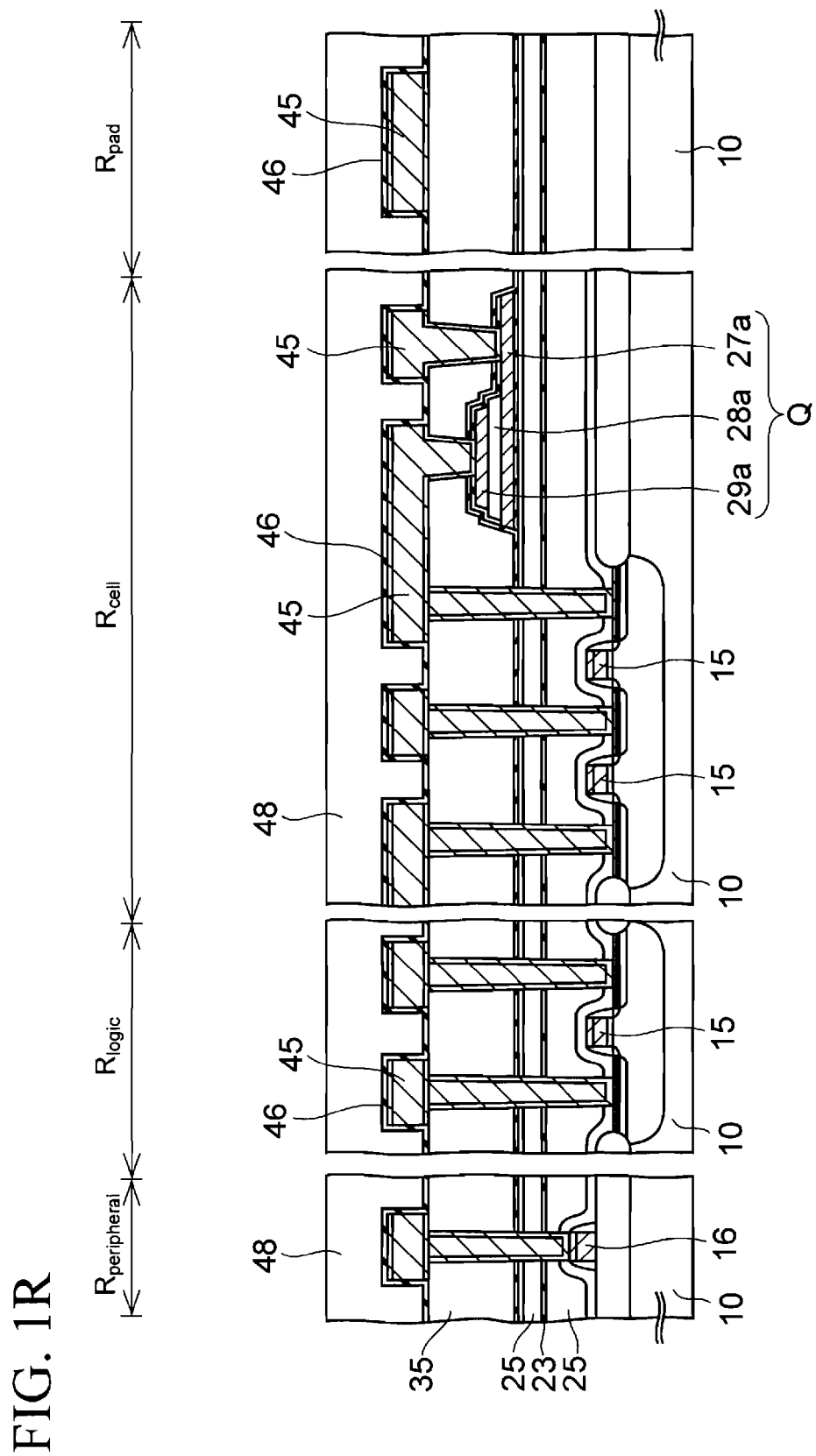

Next, as shown in FIG. 1R, a silicon oxide film is formed on the third capacitor protective insulating film 46 by the plasma CVD method using the TEOS gas and oxygen as a reactant gas, and the silicon oxide film is used as a third insulating film 48. The film thickness of this third insulating film 48 is, for example, approximately 2600 nm on the first metal wirings 45.

Then, after the upper surface of the third insulating film 48 is polished by CMP to planarize the upper surface thereof, $N_2O$ plasma processing is carried out on the surface of the third insulating film 48 in CVD equipment under conditions with the substrate temperature of approximately 350° C. and a processing time of approximately 4 minutes. By performing this $N_2O$ plasma processing, the third insulating film 48 is dehydrated. Furthermore, the upper surface thereof is nitrided by the $N_2O$ plasma processing, so that the silicon oxide with high hydrophilicity is prevented from absorbing moisture.

Figure 1S:
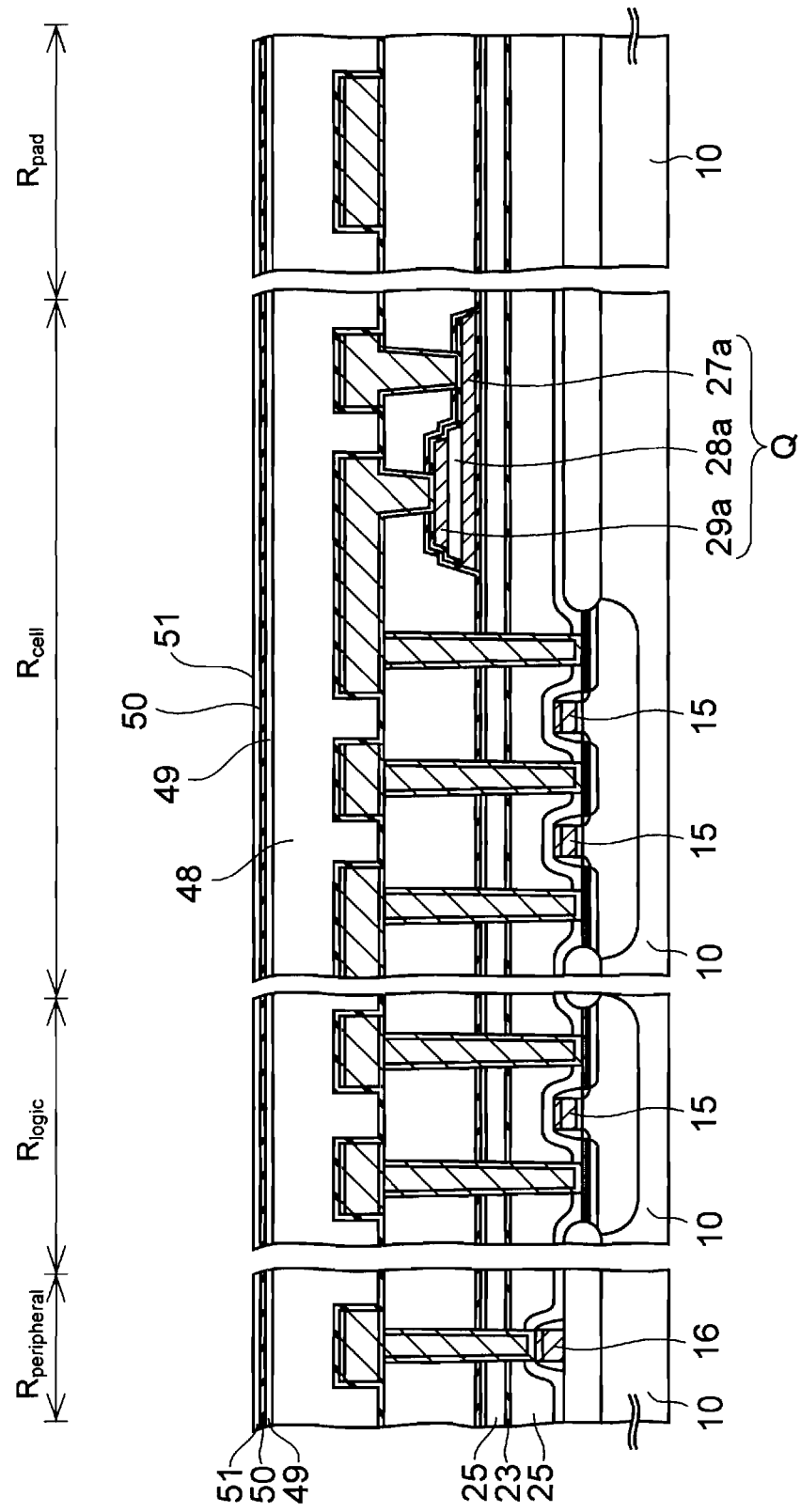

Next, as shown in FIG. 1S, a silicon oxide film is formed as a second cap insulating film 49 with the thickness of approximately 100 nm on the third insulating film 48 by the plasma CVD method using the TEOS gas.

Here, fine scars (micro scratches) caused by coming in contact with a pad of the CMP equipment during the CMP are formed on the upper surface of the third insulating film 48. The second cap insulating film 49 serves to embed the scars and planarize the upper surface of the third insulating film 48.

After that, an alumina film with excellent blocking capability against reductants, such as hydrogen and moisture, is formed with the thickness of approximately 20 nm on the second cap insulating film 49 as a fourth capacitor protective insulating film 50 for protecting the capacitor dielectric film 28*a* from the reductants.

Furthermore, a silicon oxide film is formed as a first cover insulating film 51 with the thickness of approximately 100 nm on the fourth capacitor protective insulating film 50 by the plasma CVD method using the TEOS gas.

$N_2O$ plasma processing may be carried out on the first cover insulating film 51 in the CVD equipment in order to dehydrate the film 51 and to prevent it from absorbing moisture again. The $N_2O$ plasma processing is carried out under conditions with, for example, the substrate temperature of 350° C. and a processing time of 2 minutes.

Figure 1T:
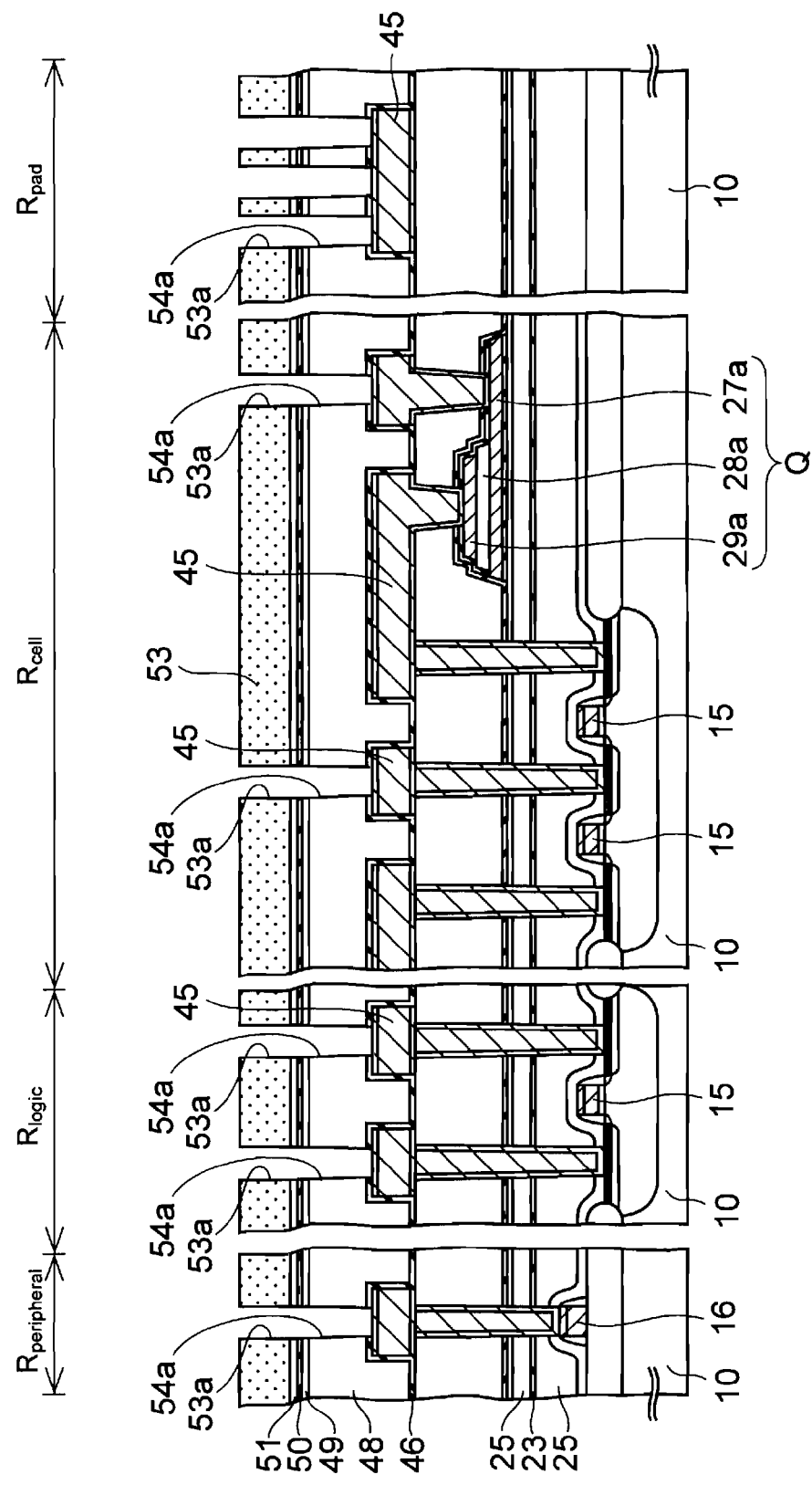

Next, processes for obtaining a cross-sectional structure shown in FIG. 1T will be described.

Firstly, a photoresist is coated on the first cover insulating film 51. The photoresist is then exposed and developed to form a third resist pattern 53 provided with hole-shaped fourth windows 53*a* over the first metal wirings 45.

Subsequently, each of the insulating films 46 and 48 to 51 under the fourth windows 53*a* is etched by using a parallel plate-type plasma etching chamber (not shown) using a mixed gas of $C_4F_8$, Ar, and $O_2$ as an etching gas. Thereby, fourth holes 54*a* are formed over the first metal wirings 45.

After this etching is finished, the third resist pattern 53 is removed.

Figure 1U:
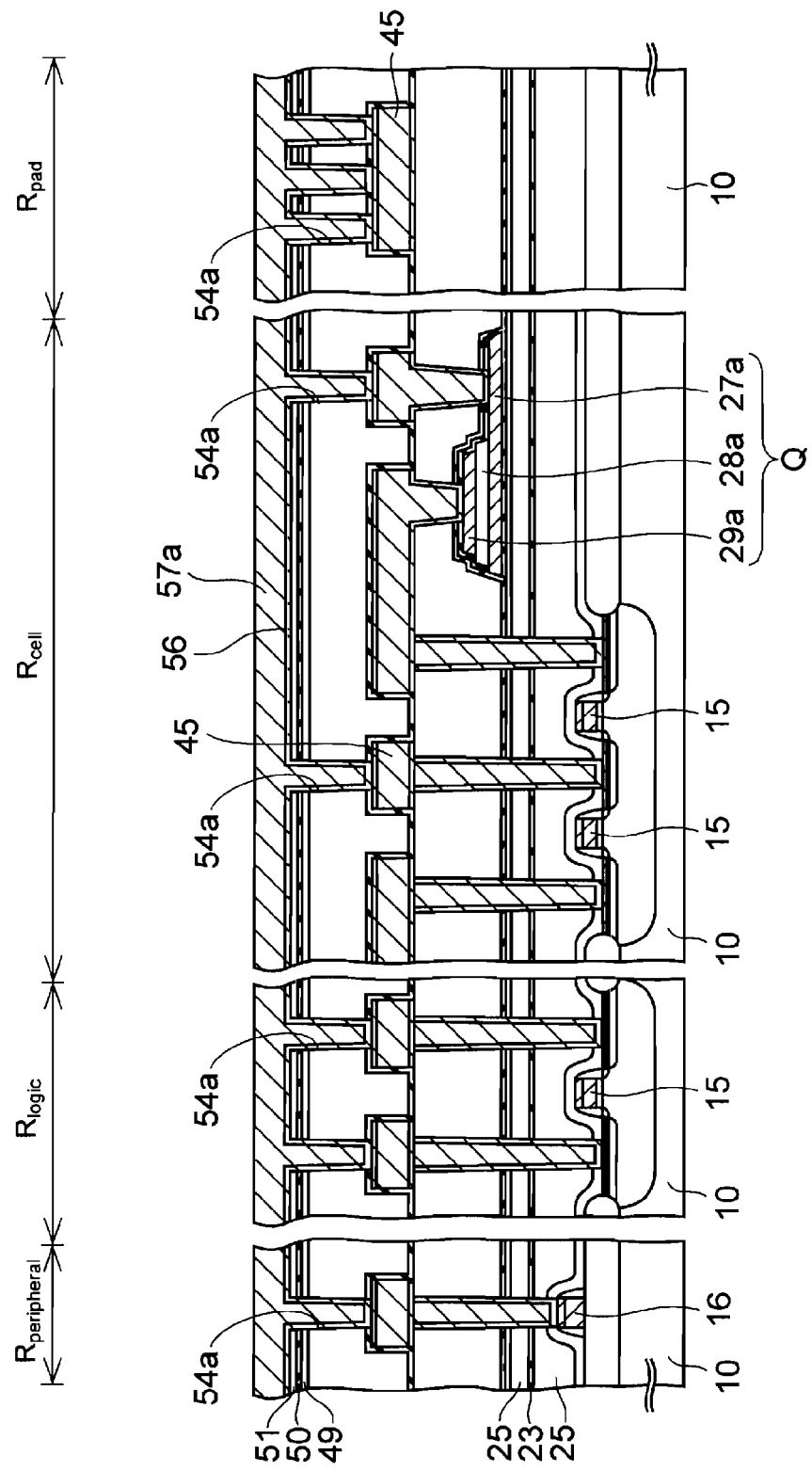

Next, as shown in FIG. 1U, while maintaining the substrate temperature at approximately 200° C., a titanium nitride film is formed with the thickness of approximately 150 nm on inner surfaces of the fourth holes 54*a* and on the upper surface of the first cover insulating film 51 by the sputtering method. The titanium nitride film thus formed is used as a first glue film 56.

Subsequently, a tungsten film 57*a* is formed with the thickness that the fourth holes 54*a* are completely embedded, for example, the thickness of approximately 650 nm, on the first glue film 56 by the plasma CVD method using a tungsten hexafluoride gas.

Figure 1V:
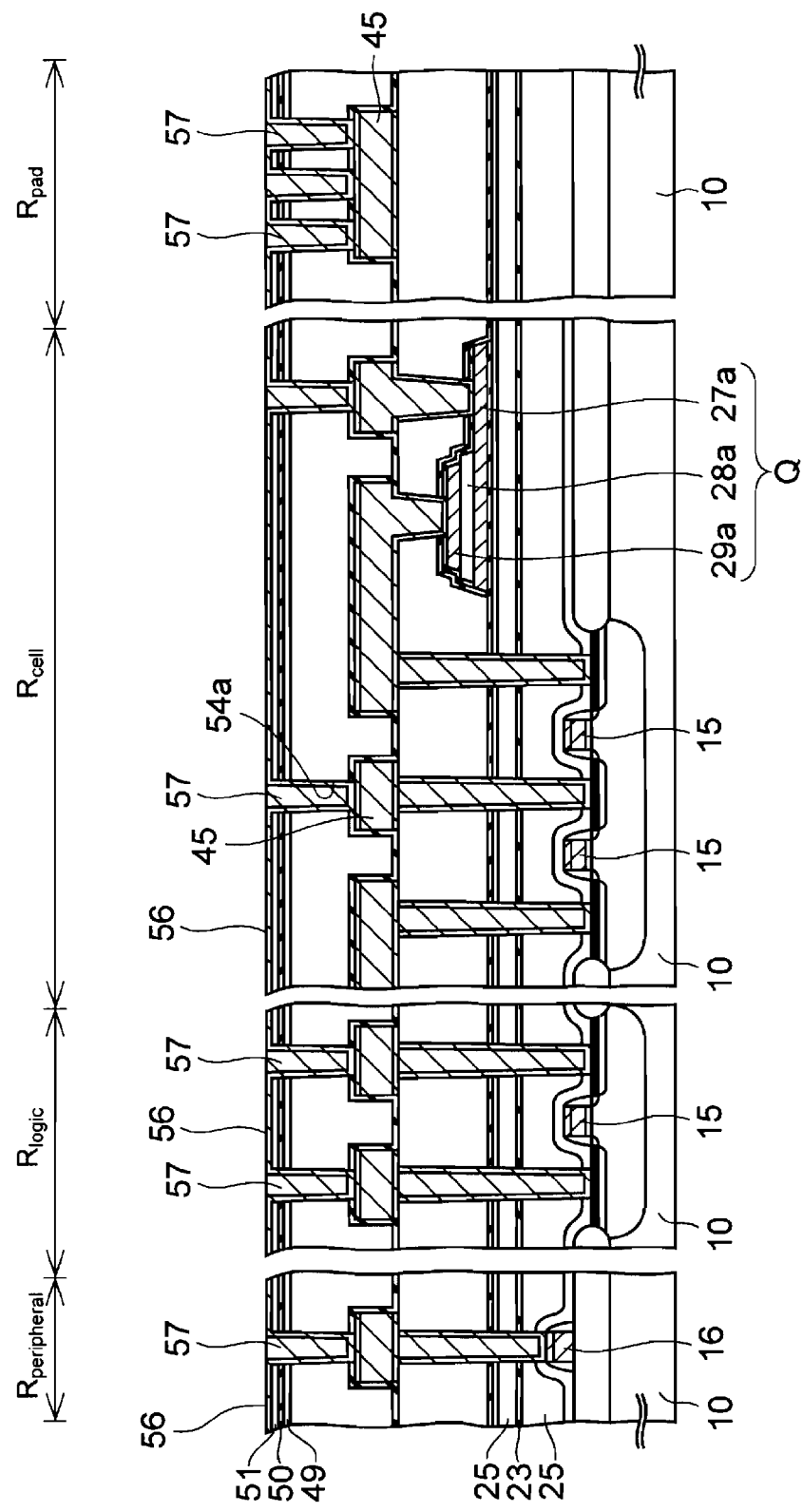

Next, as shown in FIG. 1V, the above-described tungsten film 57*a* is etched back and removed from the upper surface of the first cover insulating film 51 to be left only in the fourth holes 54*a*. With this, second conductive plugs (conductive materials) 57, which are electrically connected to the first metal wirings 45 and are mainly formed of tungsten, are formed in the fourth holes 54*a*.

Note that the tungsten film is etched back in the present example, but CMP may be employed in place of etching back.

Next, processes for obtaining a cross-sectional structure shown in FIG. 1W will be described.

Firstly, a metal laminated film is formed on each of the upper surfaces of the above-described second conductive plugs 57 and the first glue film 56 by the sputtering method.

The metal laminated film is formed of, for example, a copper-containing aluminum film with the thickness of approximately 550 nm, a titanium film with the thickness of approximately 5 nm, and a titanium nitride film with the thickness of approximately 150 nm in this order from the bottom thereof.

Thereafter, this metal laminated film and the first glue film 56 are patterned by photolithography to form, on the first cover insulating film 51, second metal wirings 58 constructed from these films.

During this patterning, the metal laminated film and the first glue film 56 are over-etched in order not to leave residual films of etching on the first cover insulating film 51.

Since the fourth capacitor protective insulating film 50 is coved by the first cover insulating film 51, the thickness of the fourth capacitor protective insulating film 50 is prevented from being thinned due to etching at the time of the patterning even when such an over etching is carried out. Accordingly, the thickness of the fourth capacitor protective insulating film 50 can be sufficiently maintained, and the reductants, such as hydrogen, can be effectively blocked by the fourth capacitor protective insulating film 50 even after the patterning is finished.

Figure 1W:
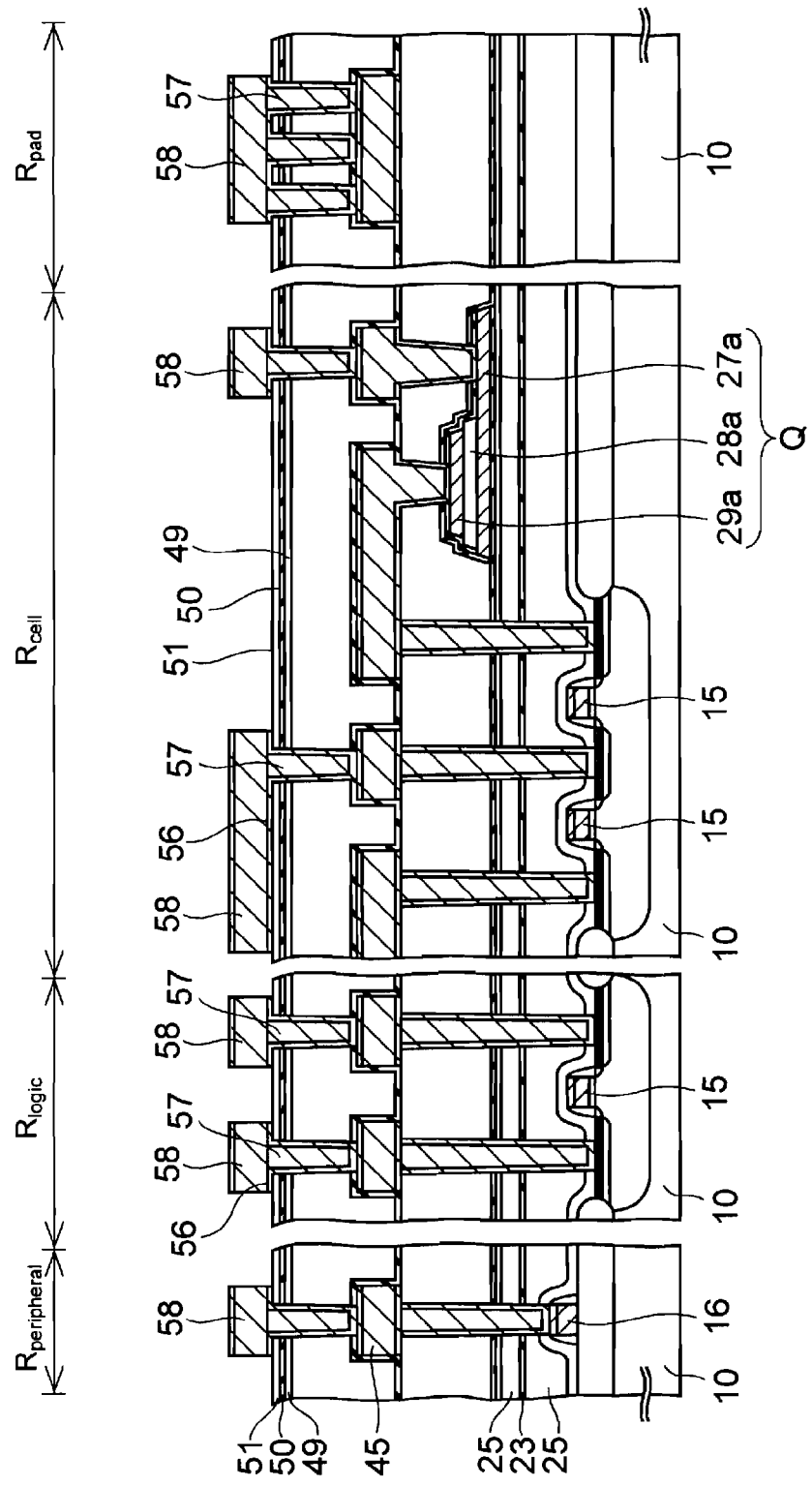
Figure 1X:
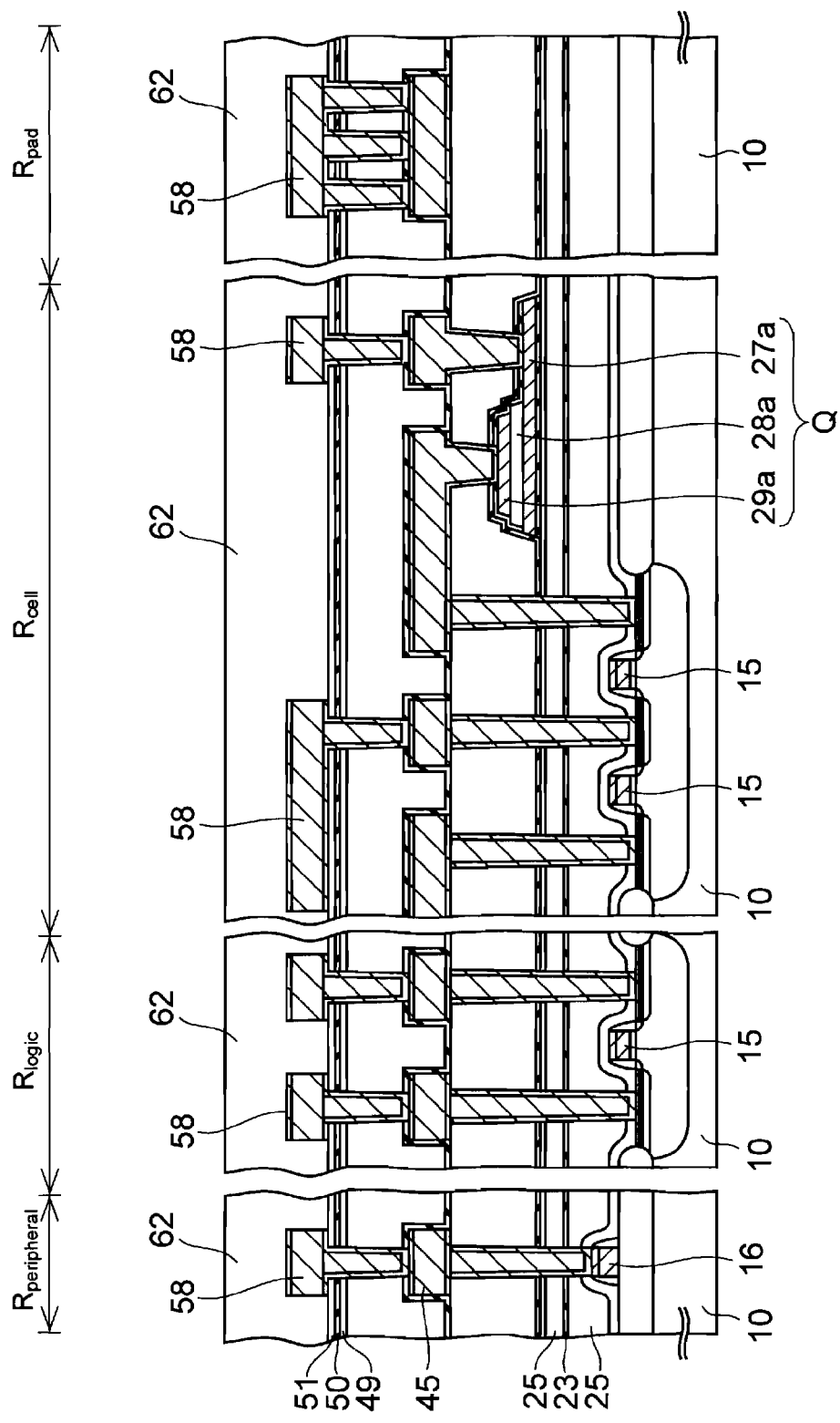

Next, as shown in FIG. 1X, a silicon oxide film is formed with the thickness of approximately 2200 nm on each of the first cover insulating film 51 and the second metal wirings 58 by the plasma CVD method using a mixed gas of the TEOS gas and oxygen. The silicon oxide film thus formed is used as a fourth insulating film 62.

Then, after the upper surface of the fourth insulating film 62 is polished and planarized by the CMP method, $N_2O$ plasma processing is carried out on the fourth insulating film 62 under conditions with the substrate temperature of 350° C. and a processing time of 4 minutes. Thereby, this fourth insulating film 62 is dehydrated and the upper surface thereof is nitrided, so that the fourth insulating film 62 is prevented from absorbing moisture again. The $N_2O$ plasma processing is carried out by using, for example, CVD equipment.

Figure 1Y:
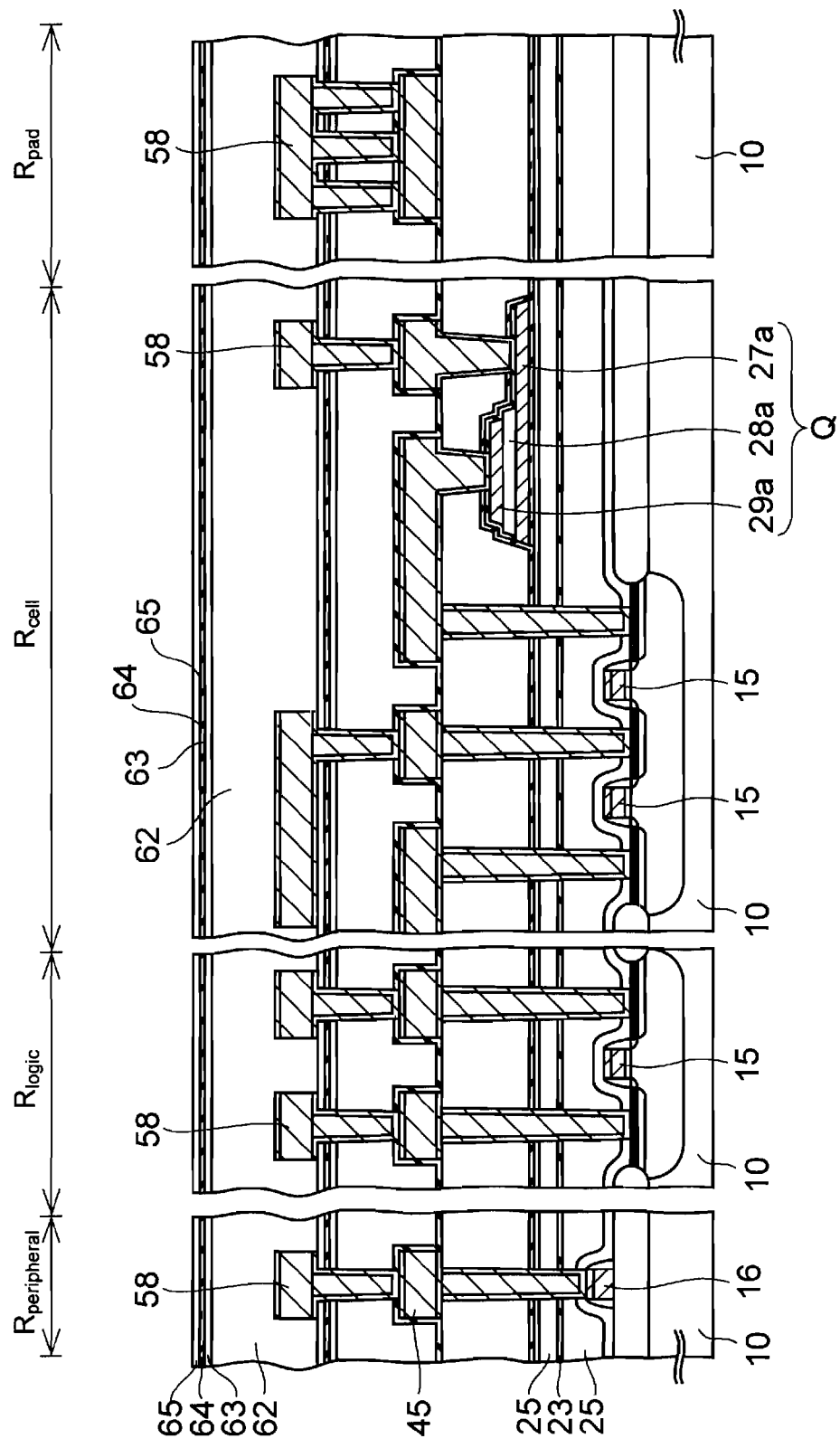

Next, as shown in FIG. 1Y, similar to the above-described insulating films 49 to 51, a third cap insulating film 63, a fifth capacitor protective insulating film 64, and a second cover insulating film 65 are formed on the fourth insulating film 62.

Among these films, the third cap insulating film 63 and the second cover insulating film 65 are formed with the film thickness of approximately 100 nm by the plasma CVD using the TEOS gas. In contrast, the fifth capacitor protective insulating film 64 is formed of an alumina film with the thickness of approximately 50 nm formed by the sputtering method.

Note that the third cap insulating film 63 and the second cover insulating film 65 may be dehydrated by carrying out the $N_2O$ plasma processing thereon after forming these films. Such a $N_2O$ plasma processing is carried out at, for example, the substrate temperature of 350° C. for 2 minutes.

Figure 1Z:
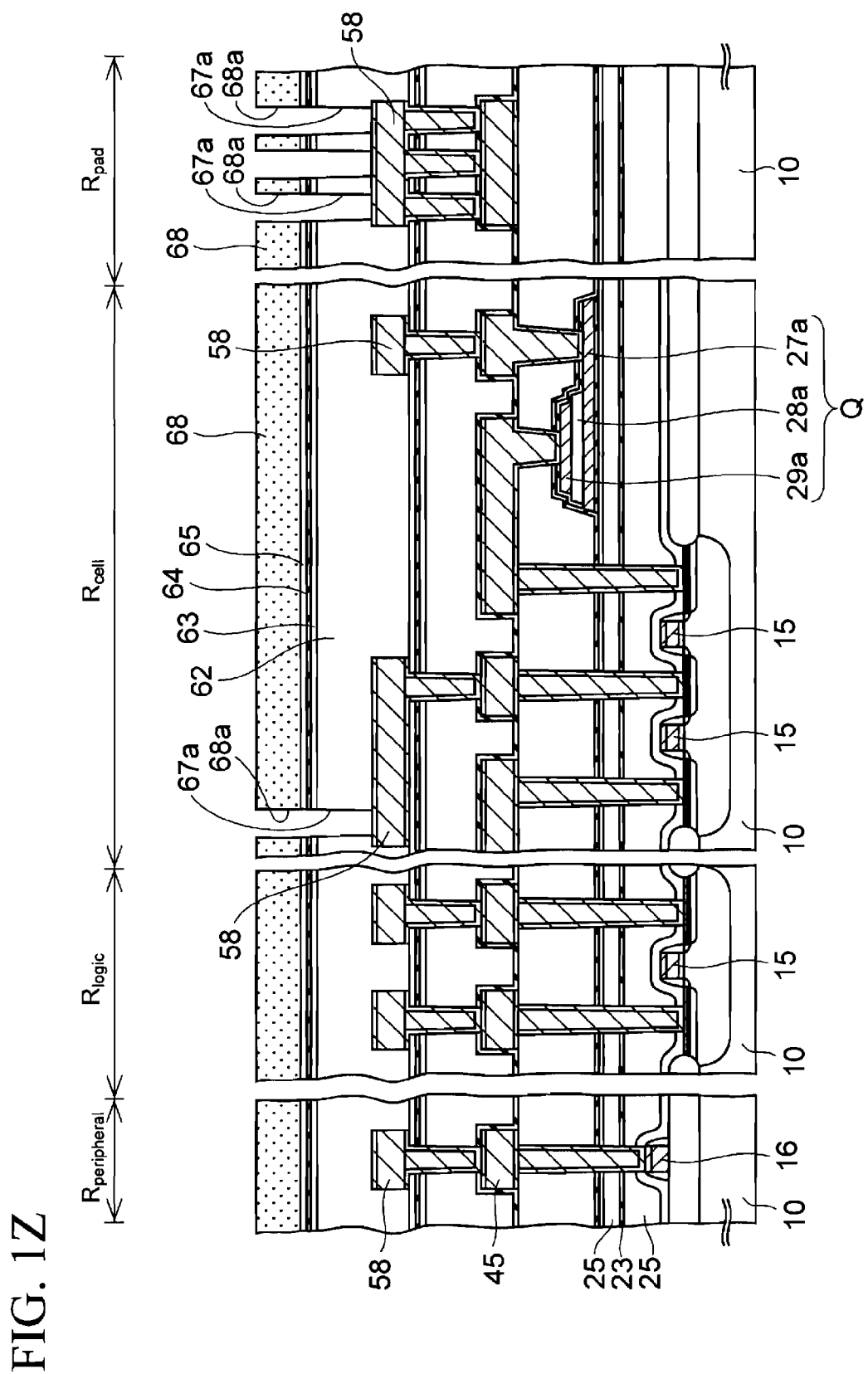

Next, as shown in FIG. 1Z, a photoresist is coated on the second cover insulating film 65. The coated photoresist is then exposed and developed to form a fourth resist pattern 68 provided with fifth hole-shaped windows 68*a* on the second metal wirings 58.

After that, while using the fourth resist pattern 68 as a mask, each of the insulating films 62 to 65 is etched in a parallel plate-type plasma etching chamber to form fifth holes 67*a* in these insulating films on the second metal wirings 58. The etching uses, for example, a mixed gas of $C_4F_8$, Ar, and $O_2$ as an etching gas.

After this etching is finished, the fourth resist pattern 68 is removed.

Figure 2A:
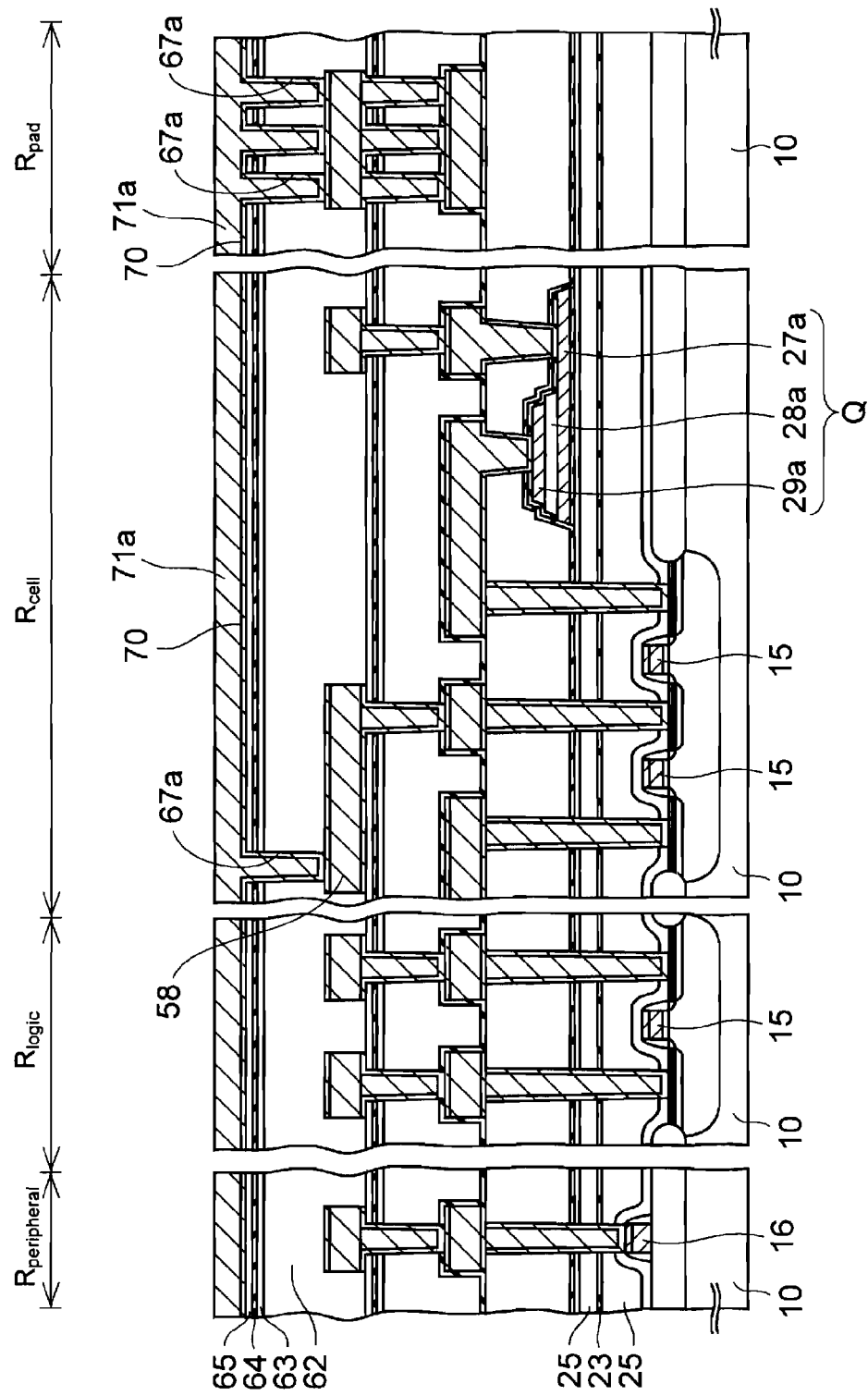

Next, as shown in FIG. 2A, a titanium nitride film is formed by the sputtering method with the thickness of approximately 50 nm on inner surfaces of the fifth holes 67a and on the upper surface of the second cover insulating film 65 as a second glue film 70. Then, a tungsten film 71a is formed on the second glue film 70 by the CVD method, and this tungsten film 71a completely embeds the fifth holes 67a. The tungsten film 71a is formed with the thickness of, for example, approximately 650 nm.

Figure 2B:
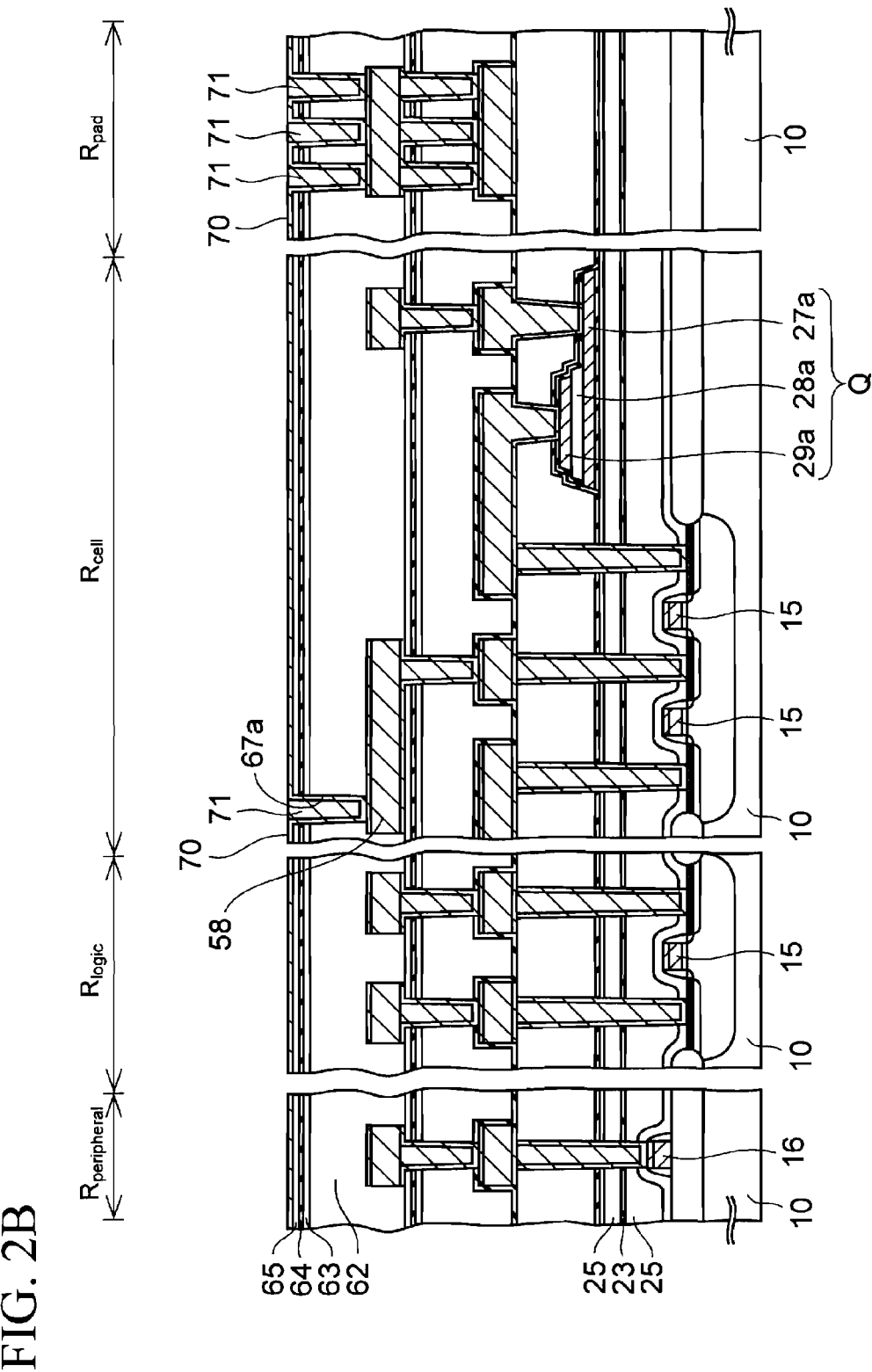

Next, as shown in FIG. 2B, the excessive tungsten film 71a on the second cover insulating film 65 is etched back and removed and leave it only in the fifth holes 67a as third conductive plugs (conductive materials) 71. Note that the tungsten film 71a may be removed by the CMP method in place of etching back.

Figure 2C:
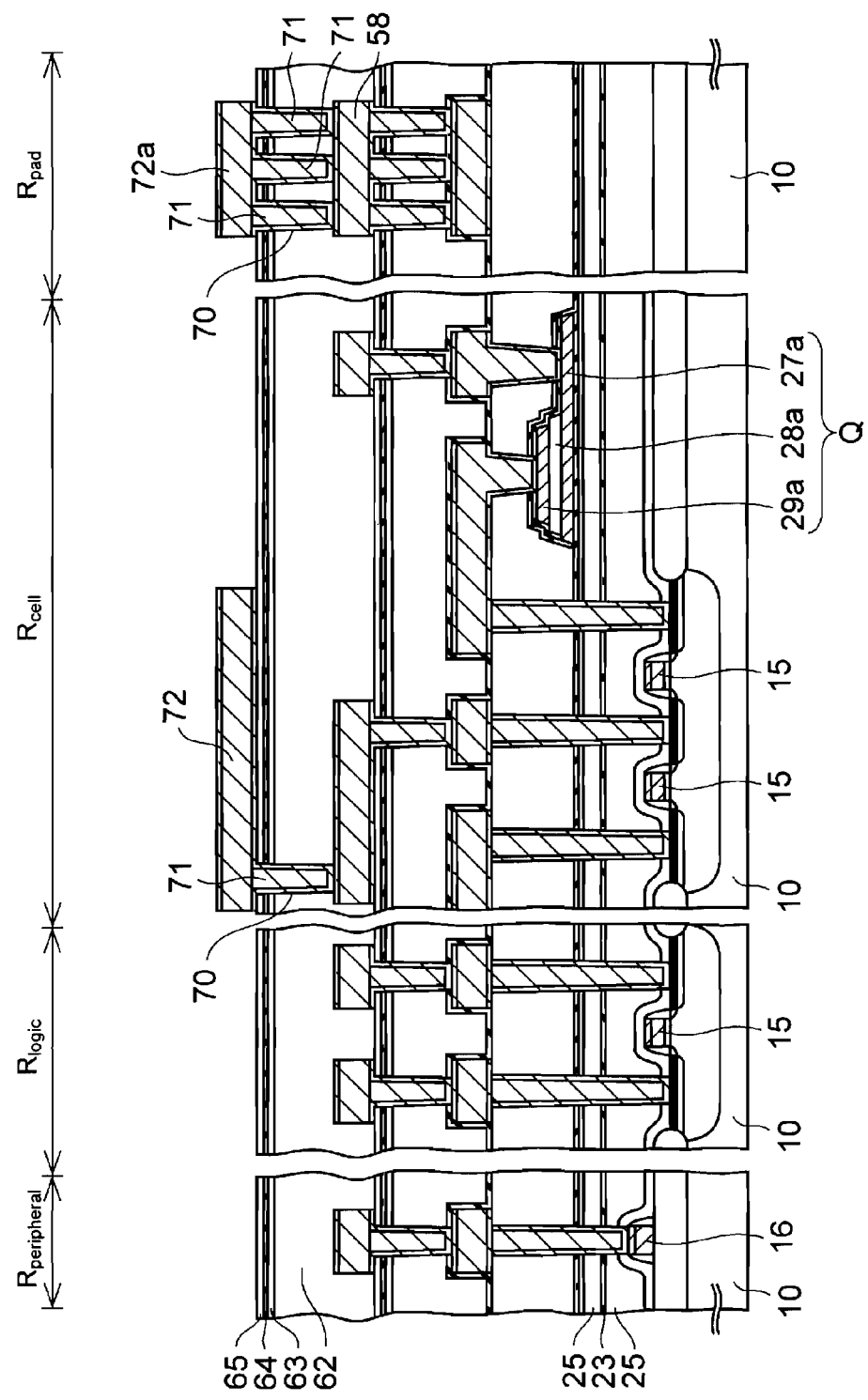

Next, processes for obtaining a cross-sectional structure shown in FIG. 2C will be described.

Firstly, a copper-containing aluminum film with the thickness of approximately 500 nm and a titanium nitride film with the thickness of approximately 150 nm are formed in this order by the sputtering method on each of the upper surfaces of the second glue film 70 and the third conductive plugs 71. Then, this metal laminated film and the second glue film 70 thereunder are patterned by photolithography to from a third metal wiring 72 in the cell region $R_{cell}$ and a bonding pad 72a in the pad region $R_{pad}$.

Figure 2D:
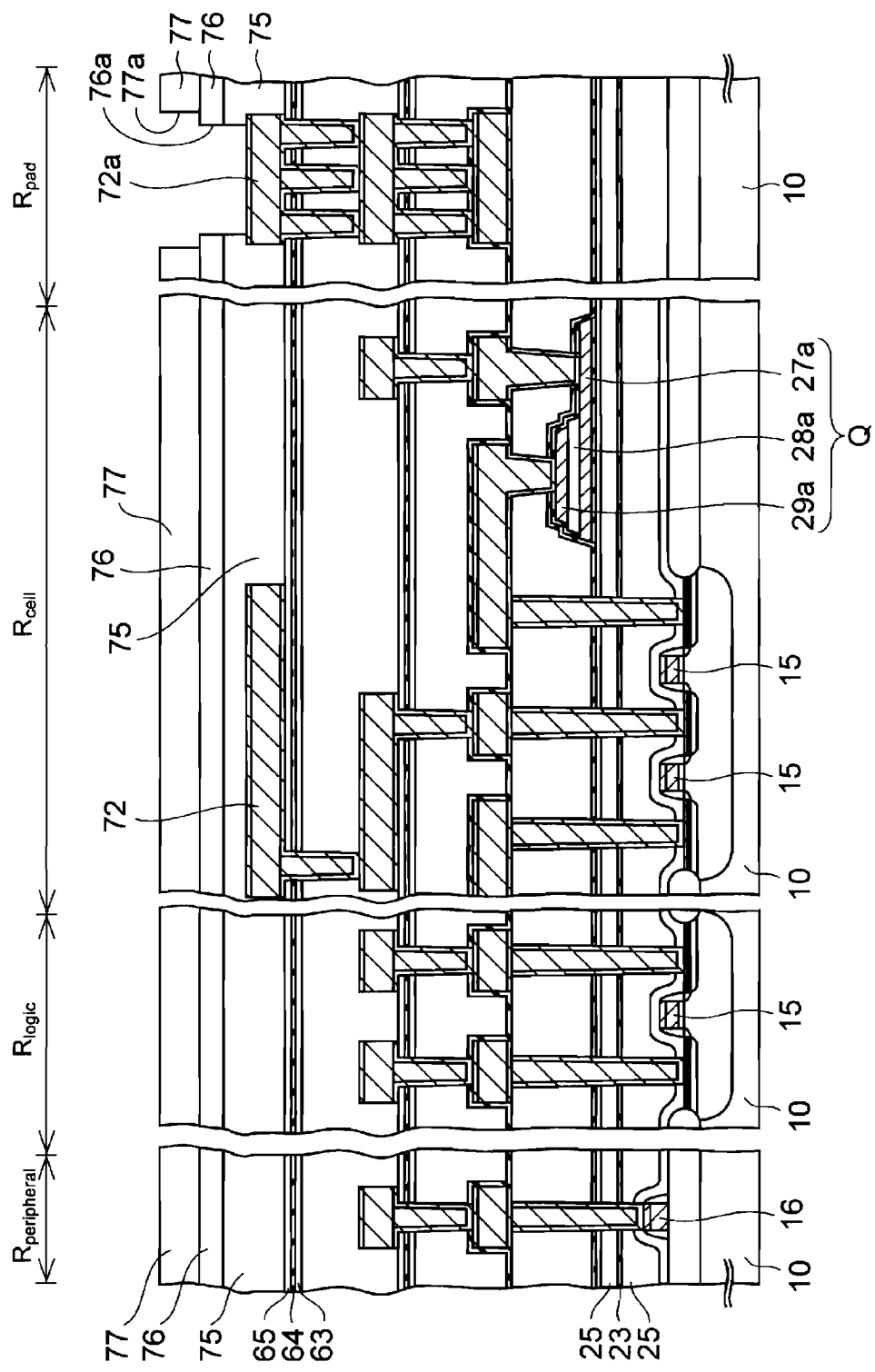

Next, processes for obtaining a cross-sectional structure shown in FIG. 2D will be described.

Firstly, a silicon oxide film is formed as an insulating film constituting a first passivation film 75 with the thickness of approximately 100 nm on each of the second cover insulating film 65 and the third metal wiring 72 by the CVD method.

Note that $N_2O$ plasma processing for dehydration and preventing moisture absorption may be carried out on the first passivation film 75. The $N_2O$ plasma processing is carried out, for example, in the CVD equipment, and the adopted conditions for the processing are the substrate temperature of 350° C. and a processing time of 2 minutes.

Furthermore, a silicon nitride film is formed as a second passivation film 76 with the thickness of approximately 350 nm on the first passivation film 75 by the CVD method.

Then, these first and second passivation films 75 and 76 are selectively dry-etched to form a sixth hole 76a in which the bonding pad 72a in the pad region $R_{pad}$ is exposed.

Subsequently, a photosensitive polyimide is formed with the thickness of approximately 3 μm on the entire upper surface of the silicon substrate 10 to form a protective layer 77 made of the polyimide coating film. After that, the protective layer 77 is exposed and developed to form a seventh hole 77a in which the bonding pad 72a is exposed. Thereafter, the protective layer 77 is thermally cured under conditions with the substrate temperature of 310° C., the $N_2$ flow rate of 100 liters per minute, and a processing time of 40 minutes.

Figure 3:
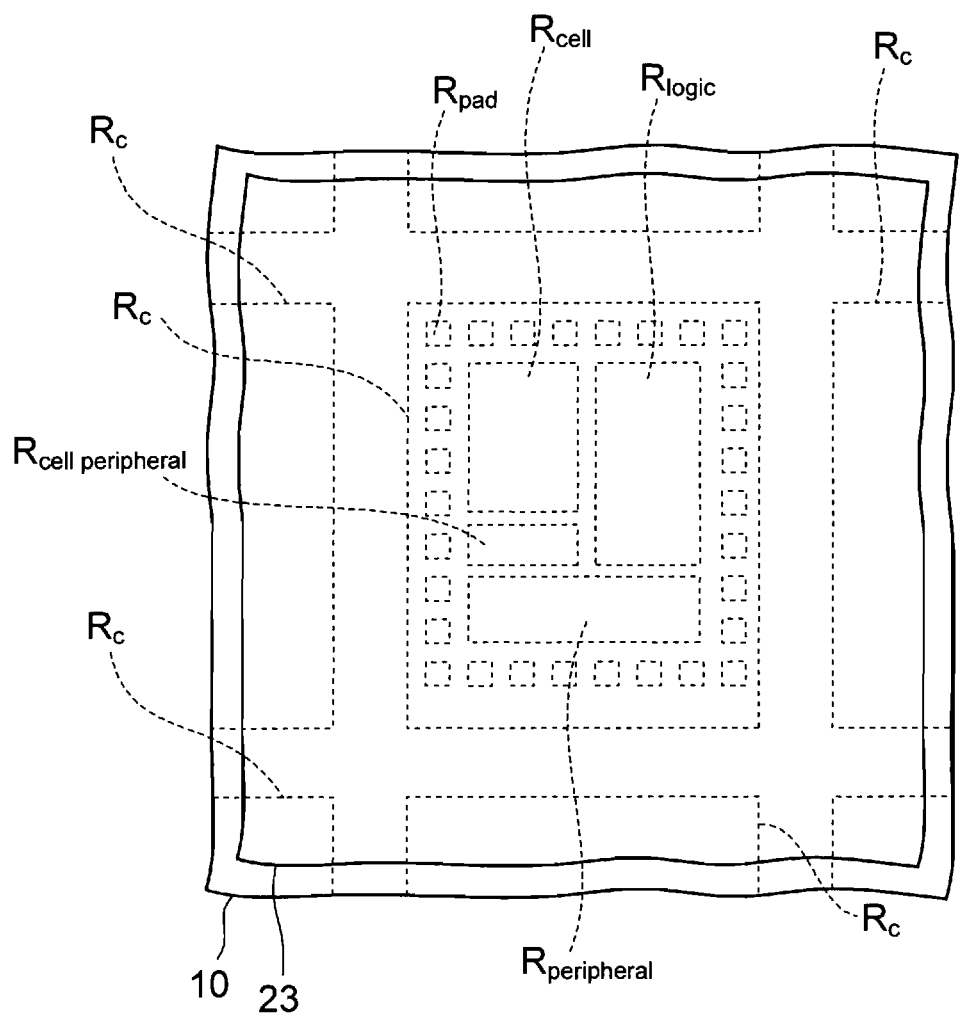
FIG. 3 is a view showing a plan layout of a barrier insulating film in the first embodiment.

FIG. 3 is an enlarged plan view of the silicon substrate 10 after the manufacturing processes described so far are finished.

As shown in FIG. 3, a plurality of chip regions $R_c$ are defined in the silicon substrate 10. The above-described peripheral circuit region $R_{peripheral}$, logic circuit region $R_{logic}$, cell region $R_{cell}$, and pad regions $R_{pad}$ are further defined in each of the plurality of chip regions $R_c$. In addition, a cell peripheral circuit region $R_{cell\ peripheral}$ in addition to these regions is also defined in each of the chip regions $R_c$ for controlling an input/output of signal to the cell region $R_{cell}$.

Then, in the present embodiment, the above-described barrier insulating film 23 is formed on the entire surface of the chip region $R_c$.

Figure 4:
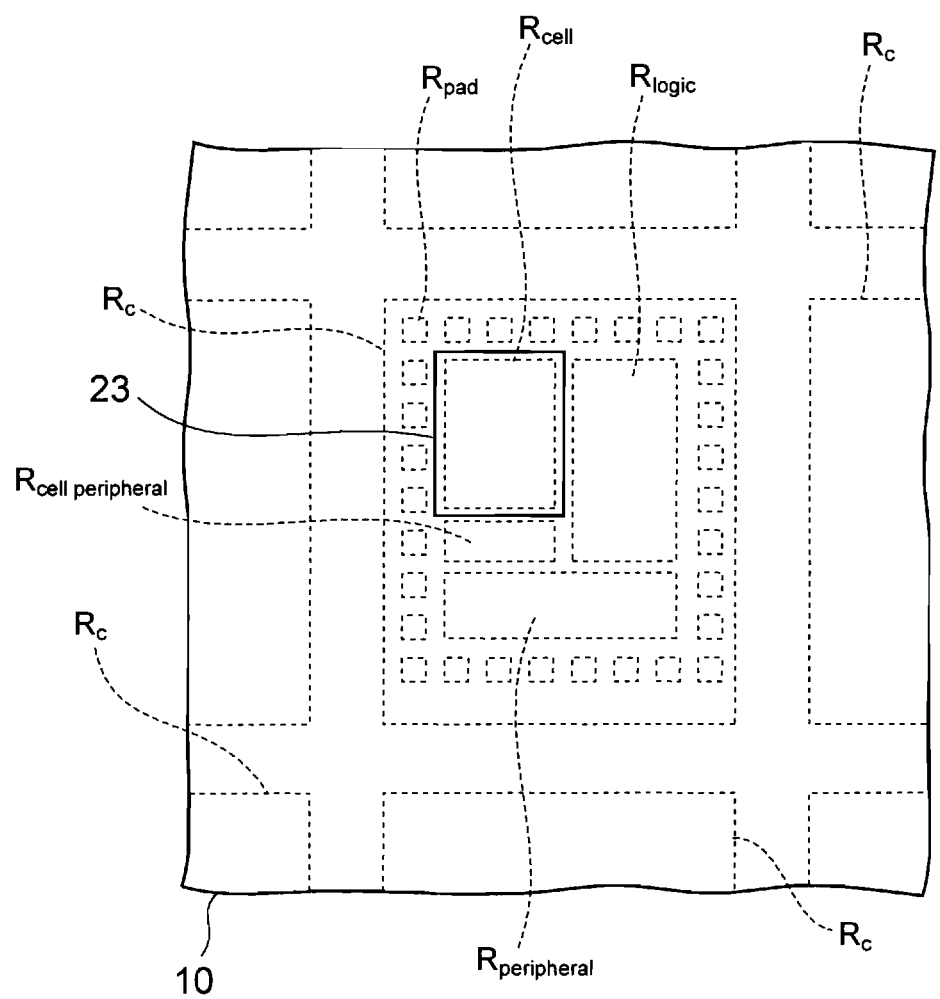
FIG. 4 is a view showing another example of a plan layout of a barrier insulating film in the first embodiment.

However, the plan layout of the barrier insulating film 23 is not limited to this. For example, as shown in FIG. 4, the barrier insulating film 23 may be formed only in the cell regions $R_{cell}$ as long as moisture penetrating from the silicon substrate 10 towards the capacitor Q can be blocked.

To selectively form the barrier insulating film 23 only in the cell region $R_{cell}$ in this manner, it is only needed that, during the process of ion implantation shown in FIG. 1C, a resist pattern (not shown) covering a region other than the cell region $R_{cell}$ is formed on the first insulating film 25, and nitrogen is selectively ion-implanted only into the cell region $R_{cell}$ while using the resist pattern as a mask.

After the above steps are completed, dicing is carried out on the silicon substrate 10 along scribe regions between the chip regions $R_c$, so that a plurality of semiconductor chips (semiconductor devices) are cut out from the silicon substrate 10. Then, the main manufacturing processes of the present embodiment are finished.

According to the present embodiment described above, as described by referring to FIGS. 1C and 1D, nitrogen is ion-implanted into the first insulating film 25 to form an impurity layer 22. Thereafter, annealing is carried out on the impurity layer 22, and the impurity layer 22 is converted to a barrier insulating film 23 for preventing hydrogen and moisture penetration.

The barrier insulating film 23 formed in this process is mainly formed of silicon nitride, so that it can be etched with a chemical reaction with an etching gas. Accordingly, this etching is easier than that of an alumina film, which is difficult to be etched. For this reason, at the time of forming the first holes 38a described in FIG. 1L by etching, the cross-sectional shapes of the holes 38a are hardly distorted, and reaction products resulted from the alumina film are not generated. Thus, contact resistance between the conductive patterns, such as the first to third source/drain regions 19a to 19c, and the first conductive plugs 40 (see, FIG. 1M) formed in the first holes 38a is stabilized, so that the yield of semiconductor devices is improved.

Note that if the barrier insulating film 23 were to be formed by the CVD method or the sputtering method, it would be required to form a cover insulating film, such as the first and second cover insulating film 51 and 65, on the upper surface of the barrier insulating film 23 in order to prevent the barrier insulating film 23 from being thinned by the etching thereof at the time of patterning the lower electrode 27a.

On the contrary, when the barrier insulating film 23 is formed in the first insulating film 25 by means of the ion implantation as in the present embodiment, the first insulating film 25 on the barrier insulating film 23 serves as the above-described cover insulating film. Thus, it is not required to form a cover insulating film on the upper surface of the barrier insulating film 23. In addition, $N_2O$ plasma processing for dehydrating the cover insulating film can be omitted, and thus increase in the number of manufacturing processes and damages to the device due to the $N_2O$ plasma processing can be prevented.

Note that in the forgoing description, nitrogen is ion-implanted in the process of FIG. 1D in order to from the impurity layer 22. However, carbon or fluorine may be ion-implanted in place of nitrogen. This is also applicable to each modification and each embodiment to be described later.

Among these films, the barrier insulating film 23 made by modifying the impurity layer 22 containing carbon by annealing is excellent in preventing moisture penetration, similar to the barrier insulating film 23 mainly formed of silicon nitride as described above.

In addition, the barrier insulating film 23 formed by modifying the impurity layer 22 containing fluorine by annealing has a function to prevent moisture penetration by absorbing moisture by itself.

The barrier insulating film 23 is applied for FeRAM in the present embodiment, but a semiconductor device with a high moisture resistance can be obtained even when the barrier insulating film 23 is applied to other semiconductor device. This is also applicable to second to fourth embodiments to be described later.

Furthermore, in the above-described present embodiment, the barrier insulating film 23 is formed in the first insulating film 25. However, the forming position of the barrier insulating film 23 is not limited to this, and the barrier insulating film 23 may be formed in positions like those of following first to fifth modifications of the present embodiment. Note that methods for forming barrier insulating films 23 in these modifications are similar to the method described above, and hence, the description thereof will be omitted.

First Modification

Figure 5:
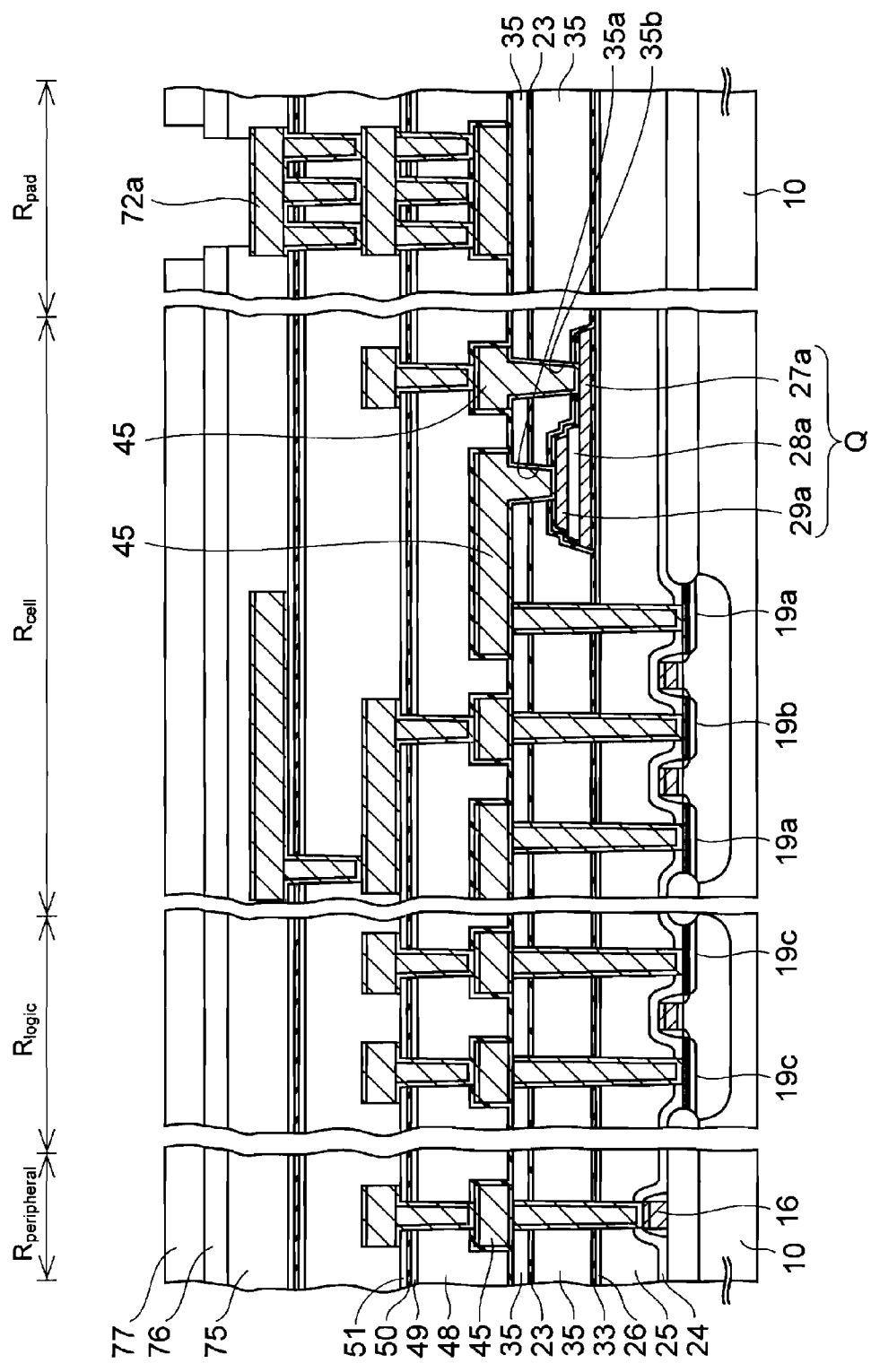
FIG. 5 is a cross-sectional view of a semiconductor device according to a first modification of the first embodiment.

FIG. 5 is a cross-sectional view of a semiconductor device according to a first modification of the present embodiment.

In the present modification, the barrier insulating film 23 described above is formed in a predetermined depth of the second insulating film 35. According to this, second and third holes 35a and 35b can be easily formed by using a mixed gas of $CHF_3$, $O_2$, and Ar as an etching gas for the barrier insulating film 23 containing silicon nitride at the time when the second and third holes 35a and 35b are formed on conductive patterns, such as an upper electrode 29a and a lower electrode 27a, by etching. Thereby, contact resistance between first metal wirings 45 and these electrodes 27a and 29a is stabilized.

Moreover, by forming the barrier insulating film 23 over the capacitor Q in this manner, the capacitor dielectric film 28a can be effectively prevented from being penetrated by moisture contained in an atmosphere from above the capacitor Q.

Furthermore, if the barrier insulating film 23 were to be formed over the capacitor Q by the CVD method, the capacitor dielectric film 28a would be reduced and deteriorated by hydrogen contained in the film-forming atmosphere of the barrier insulating film 23. However, in the present modification, the barrier insulating film 23 is formed by ion implantation of nitrogen and annealing. Thus, it is unlikely that the capacitor dielectric film 28a deteriorates. This is also the case for second to fifth modifications to be described later.

Note that in the case where the barrier insulating film 23 is formed over the capacitor Q like the present modification, it is preferable that a substrate temperature be set to low in a range of 450° C. to 500° C. when annealing the impurity layer 22 (see, FIG. 1C) to modify it to the barrier insulating film 23, because the capacitor dielectric film 28a may be deteriorated by heat during the annealing if the substrate temperature is excessively high.

Second Modification

Figure 6:
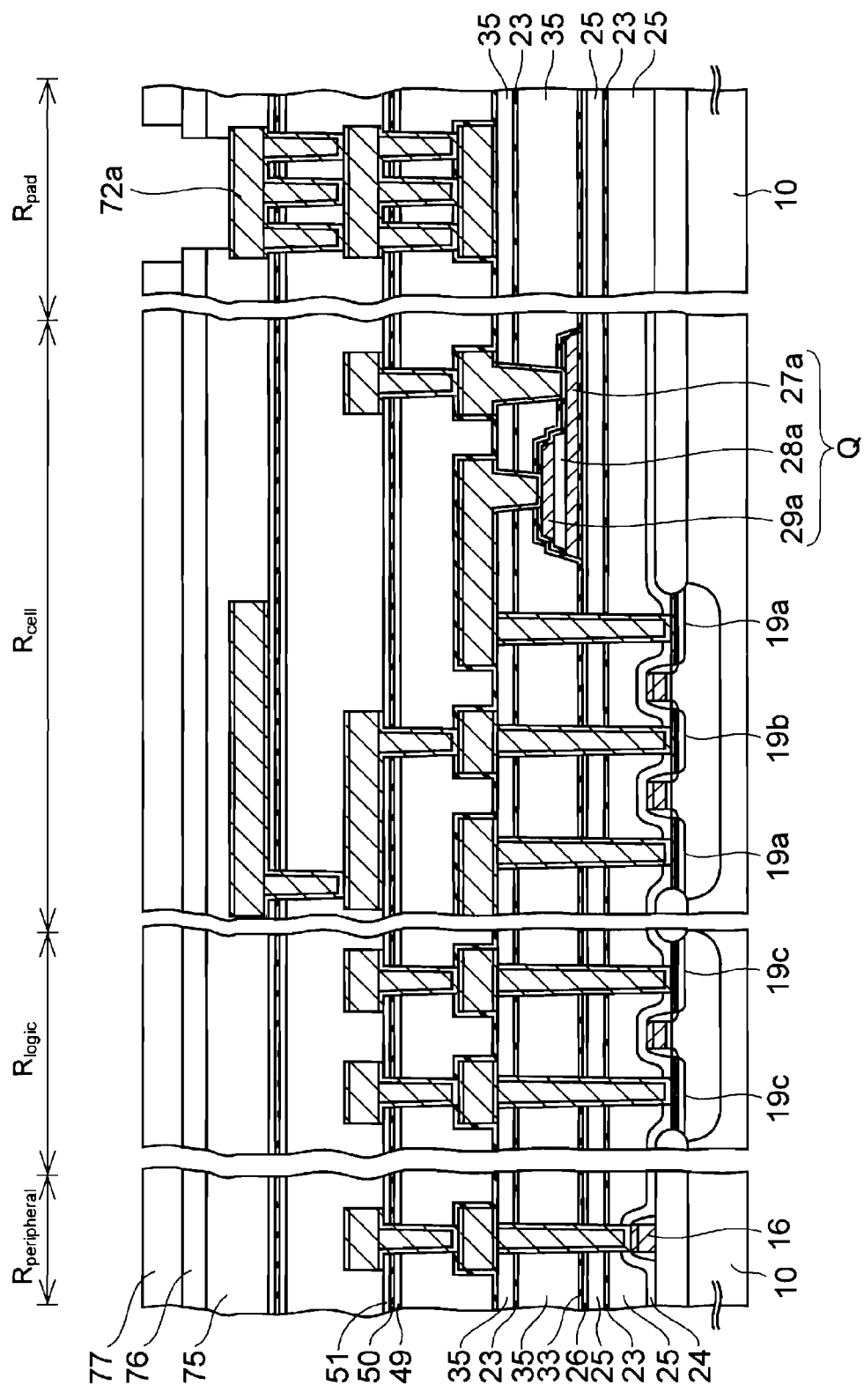
FIG. 6 is a cross-sectional view of a semiconductor device according to a second modification of the first embodiment.

FIG. 6 is a cross-sectional view of a semiconductor device according to a second modification of the present embodiment.

In the second modification, a barrier insulating film 23 is formed in a predetermined depth of each of the first and second insulating films 25 and 35.

By forming the barrier insulating films 23 in two layers in this manner, barrier performance against moisture can be improved when compared with the case where the barrier insulating film 23 is formed only in one layer.

Third Modification

Figure 7:
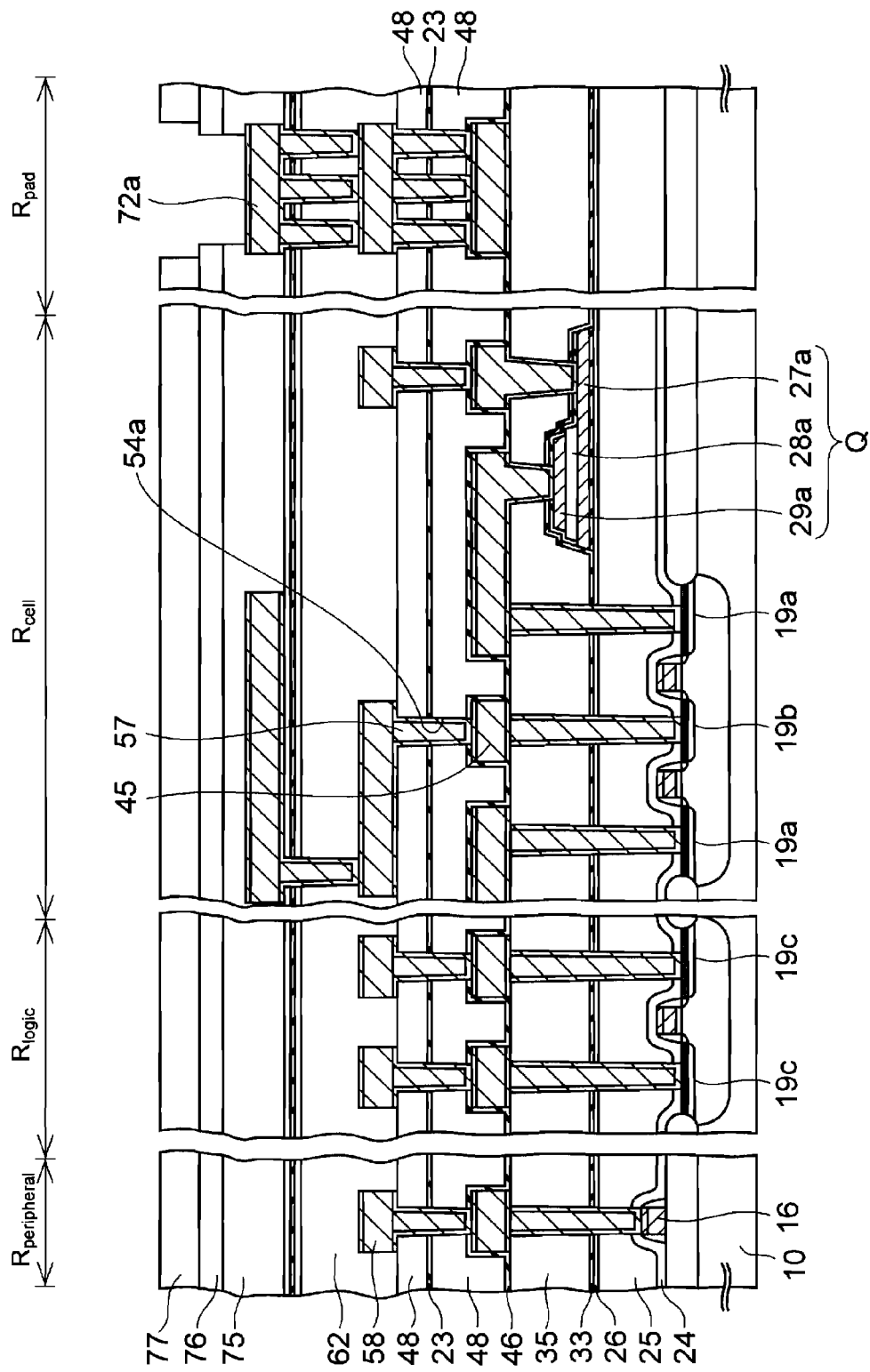
FIG. 7 is a cross-sectional view of a semiconductor device according to a third modification of the first embodiment.

FIG. 7 is a cross-sectional view of a semiconductor device according to a third modification of the third embodiment.

In the third modification, a barrier insulating film 23 is formed in a predetermined depth of the third insulating film 48. In this case, by using an etching gas for silicon nitride, such as the above-described mixed gas of $CHF_3$, $O_2$, and Ar, in the process of forming a fourth hole 54a by etching (FIG. 1T), the barrier insulating film 23 can be easily opened, and thus, contact resistance between the conductive pattern, such as a first metal wiring 45, and the second conductive plug 57, is stabilized.

In addition, in the present modification, penetration of moisture and hydrogen is prevented by the barrier insulating film 23. Thus, the fourth capacitor protective insulating film 50 (see, FIG. 1W) for preventing penetration of reductants is unnecessary. In addition, the second cap insulating film 49 is also unnecessary for embedding micro-crutches on the third insulating film 48 before the fourth capacitor protective insulating film 50 is formed.

Furthermore, the barrier insulating film 23 is protected by the third insulating film 48 formed thereon from being etched at the time of patterning the second metal wirings 58 (FIG. 1W). Thus, the first cover insulating film 51 formed for the purpose of absorbing the etching is also unnecessary.

In this manner, in the present modification, these films 49 to 51 are not required, so that the number of manufacturing processes can be reduced.

Note that, in the case where the barrier insulating film 23 is formed over the first metal wiring 45 like the present modification, it is preferable that a substrate temperature be set to low in a range of 450° C. to 500° C. at the time of annealing the impurity layer 22 to modify it to the barrier insulating film 23. This is because the first metal wiring 45 mainly formed of aluminum with a low melting point may be deteriorated during the annealing if the substrate temperature is excessively high. This is also the case for fourth and fifth modifications to be described later.

Fourth Modification

Figure 8:
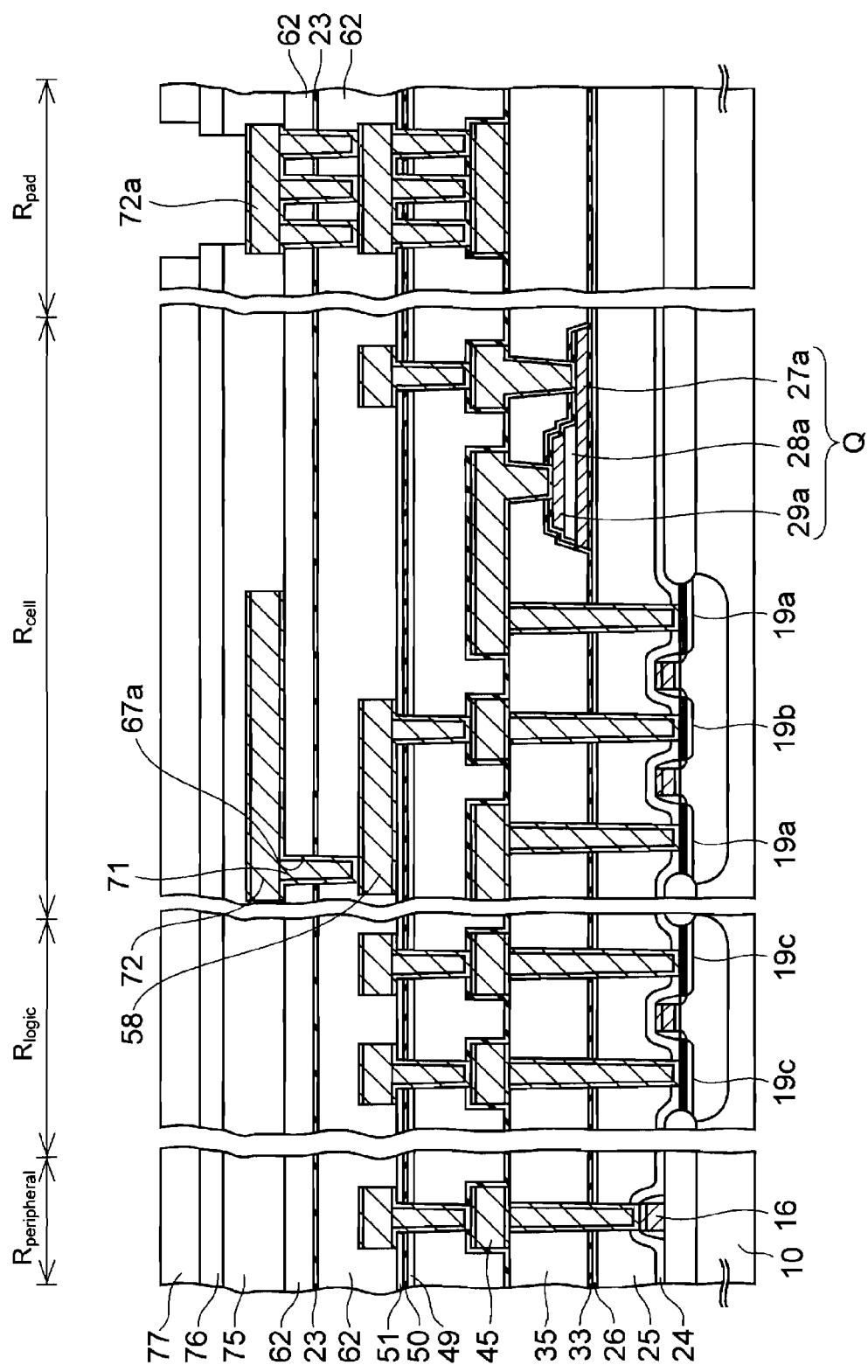
FIG. 8 is a cross-sectional view of a semiconductor device according to a fourth modification of the first embodiment.

FIG. 8 is a cross-sectional view of a semiconductor device according to a fourth modification of the present embodiment.

In the fourth modification, a barrier insulating film 23 is formed in a predetermined depth of a fourth insulating film 62. In this case, it is required to etch and open the barrier insulating film 23 containing silicon nitride at the time of forming a fifth hole 67a. However, the etching can be easily carried out by using the above-described mixed gas of $CHF_3$, $O_2$, and Ar as an etching gas. Therefore, contact resistance between the third conductive plug 71 and a conductive pattern, such as a second metal wiring 58, can be stabilized.

In addition, for a reason similar to that of the third modification, a third cap insulating film 63, a fifth capacitor protective insulating film 64, and a second cover insulating film 65 (see, FIG. 2C) can also be omitted.

Fifth Modification

Figure 9:
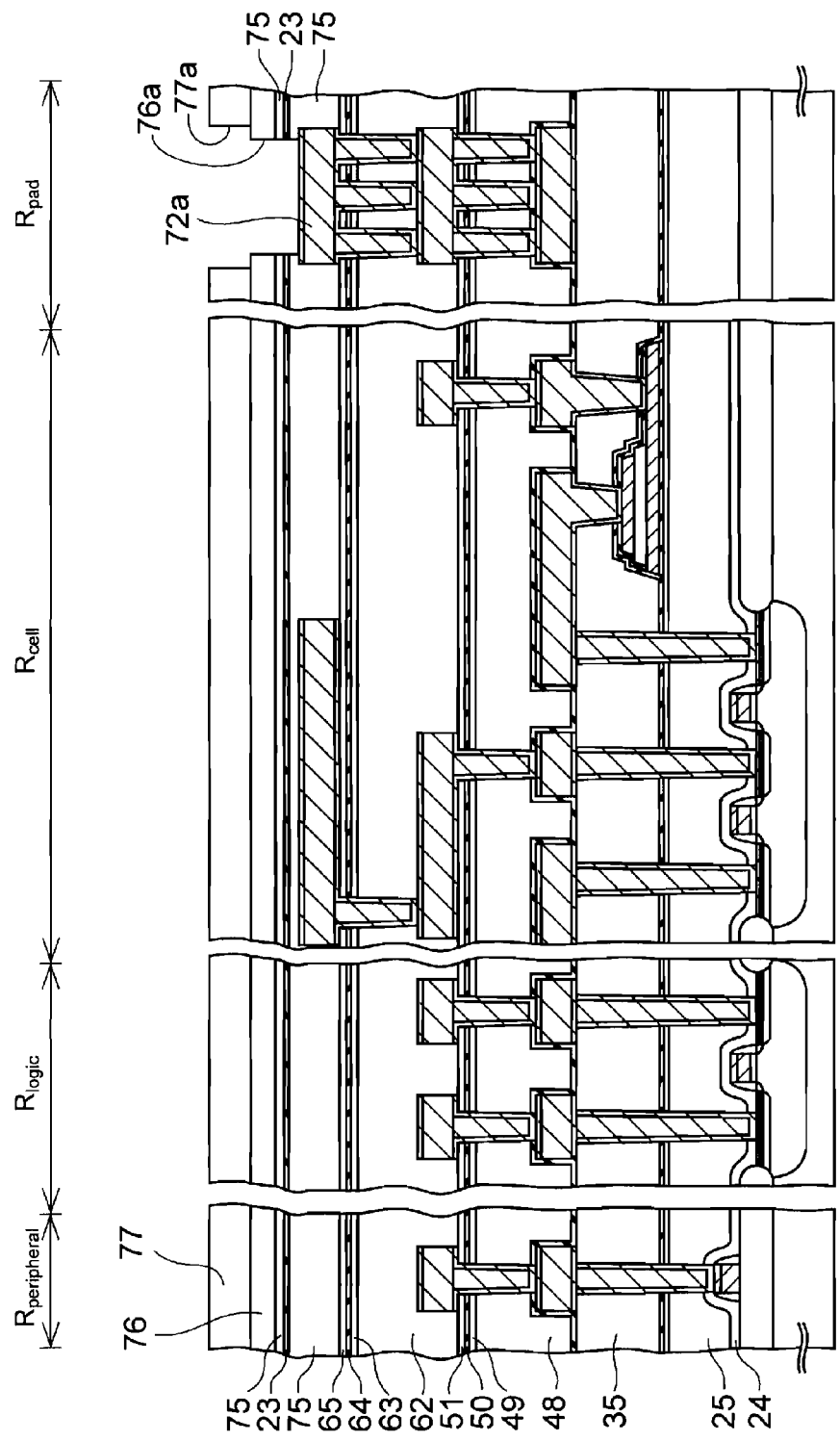
FIG. 9 is a cross-sectional view of a semiconductor device according to a fifth modification of the first embodiment.

FIG. 9 is a cross-sectional view of a semiconductor device according to a fifth modification of the present embodiment.

In the present modification, the barrier insulating film 23 is formed in a predetermined depth of the first passivation film 75.

By forming the barrier insulating film 23 in the first passivation film that is closer to the atmosphere than the first to fourth insulating films 25, 35, 48, and 62 in this manner, it becomes easier, by the barrier insulating film 23, to prevent the first to fourth insulating films 25, 35, 48, and 62 from absorbing moisture. Thus, it becomes easier to suppress the moisture deterioration of the ferroelectric capacitor Q.

Moreover, even with this configuration, the barrier insulating film 23 containing silicon nitride can be easily etched by using the above-described mixed gas of $CHF_3$, $O_2$, and Ar as an etching gas in the step (FIG. 2D) of forming, by etching, a sixth hole 76a in which a bonding pad 72a is exposed.

(2) Second Embodiment

Next, a semiconductor device according to a second embodiment of the present invention will be described along with manufacturing processes thereof.

In the first embodiment, one barrier insulating film is formed in one insulating film. On the contrary, in the present embodiment, two barrier insulating films are formed in one insulating film.

FIGS. 10A to 10D are cross-sectional views of a manufacturing semiconductor device according to the present embodiment. Note that in these drawings, reference numerals same as those of the first embodiment are given to denote components described in the first embodiment, and the description thereof will be omitted.

Figure 10:
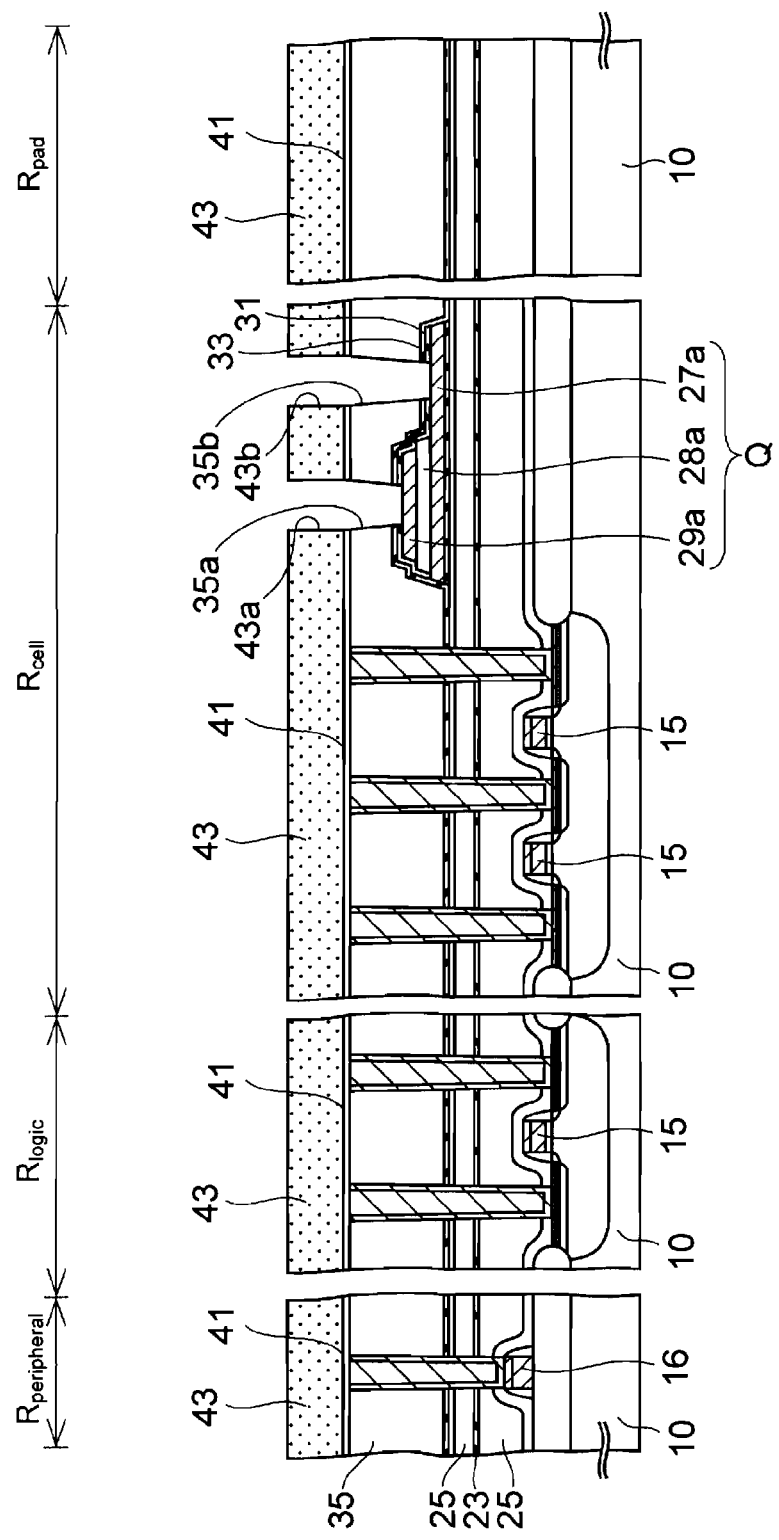
FIGS. 10A to 10D are cross-sectional views of a manufacturing semiconductor device according to a second embodiment.
Figure 10A:
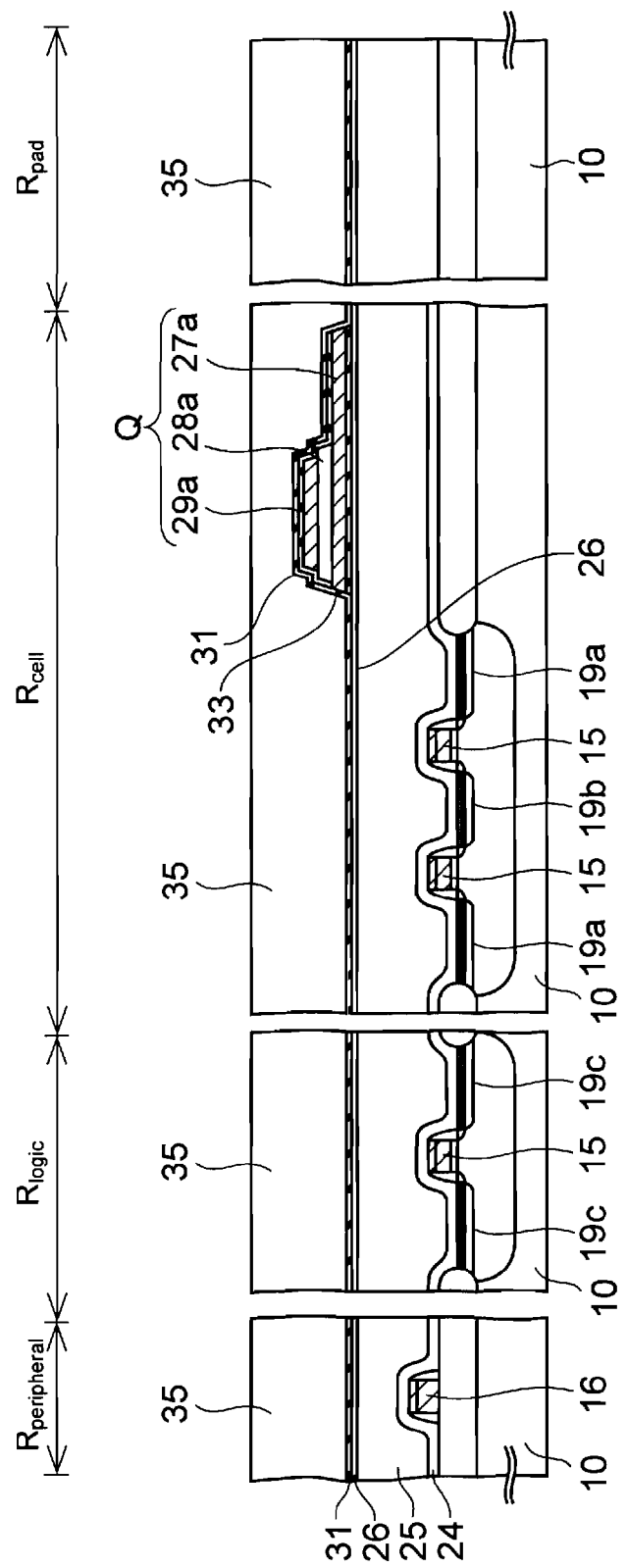

To manufacture this semiconductor device, the processes of FIGS. 1A to 1K described in the first embodiment are firstly carried out to obtain a cross-sectional structure shown in FIG. 10A. However, in the present embodiment, the barrier insulating film 23 is not formed in the first insulating film 25.

Next, as shown in FIG. 10B, nitrogen is ion-implanted twice by changing acceleration energy to form two layers of impurity layers 22 in the portions of a second insulating film 35 of different depths. The condition of the ion implantation is not particularly limited. In the present embodiment, the first ion implantation is carried out under conditions with acceleration energy of 25 keV and a dose amount of $1 \times 10^{15}$ cm$^{-2}$, while the second ion implantation is carried out under conditions with acceleration energy of 25 keV to 50 keV and a dose amount of $1 \times 10^{15}$ cm$^{-2}$.

With such acceleration energy, the impurity layer 22 having a peak concentration of impurities in a depth of approximately 20 nm from the upper surface of the second insulating film 25 is formed by the first ion implantation, and the impurity layer 22 is formed in a depth of 100 nm to 200 nm by the second ion implantation.

Figure 10C:
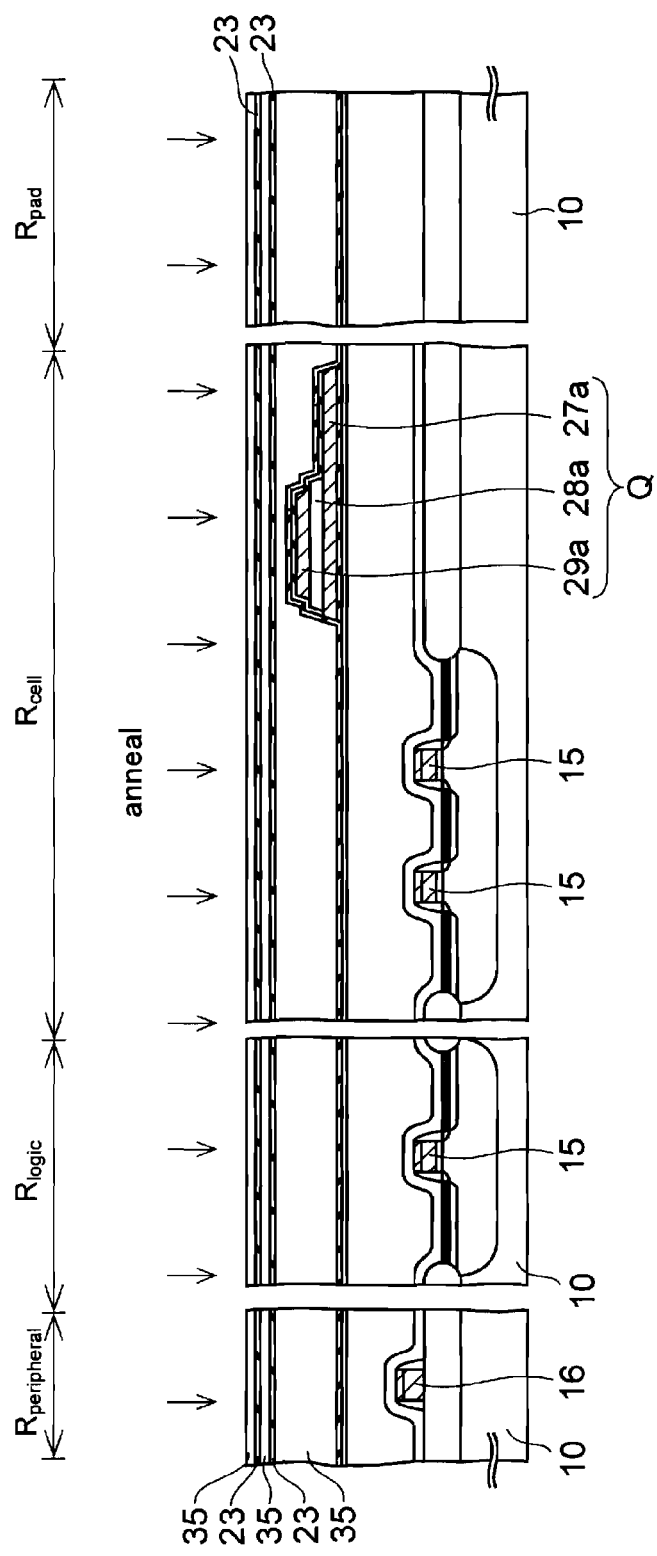

After that, as shown in FIG. 10C, annealing is carried out on the impurity layers 22 in the atmosphere of an inert gas, such as argon or nitride, to cause nitrogen contained in the impurity layers 22 to react with silicon contained in the second insulating film 35. Thereby, each of the two layers of the impurity layers 22 is modified into the barrier insulating films 23 containing silicon nitride.

It is preferable that this annealing be carried out with a temperature as low as possible, for example with the substrate temperature of 450° C. to 500° C., in order to reduce thermal damages onto a capacitor dielectric film 28a. In addition, an annealing time is also not particularly limited. When a vertical or lateral furnace is used, an annealing time is set to be approximately 30 to 60 minutes. Furthermore, when RTA equipment is used as annealing equipment, the annealing time can be shortened to be in a range of 2 to 20 seconds, so that the thermal damages onto the capacitor dielectric film 28a can be easily reduced.

Figure 10D:
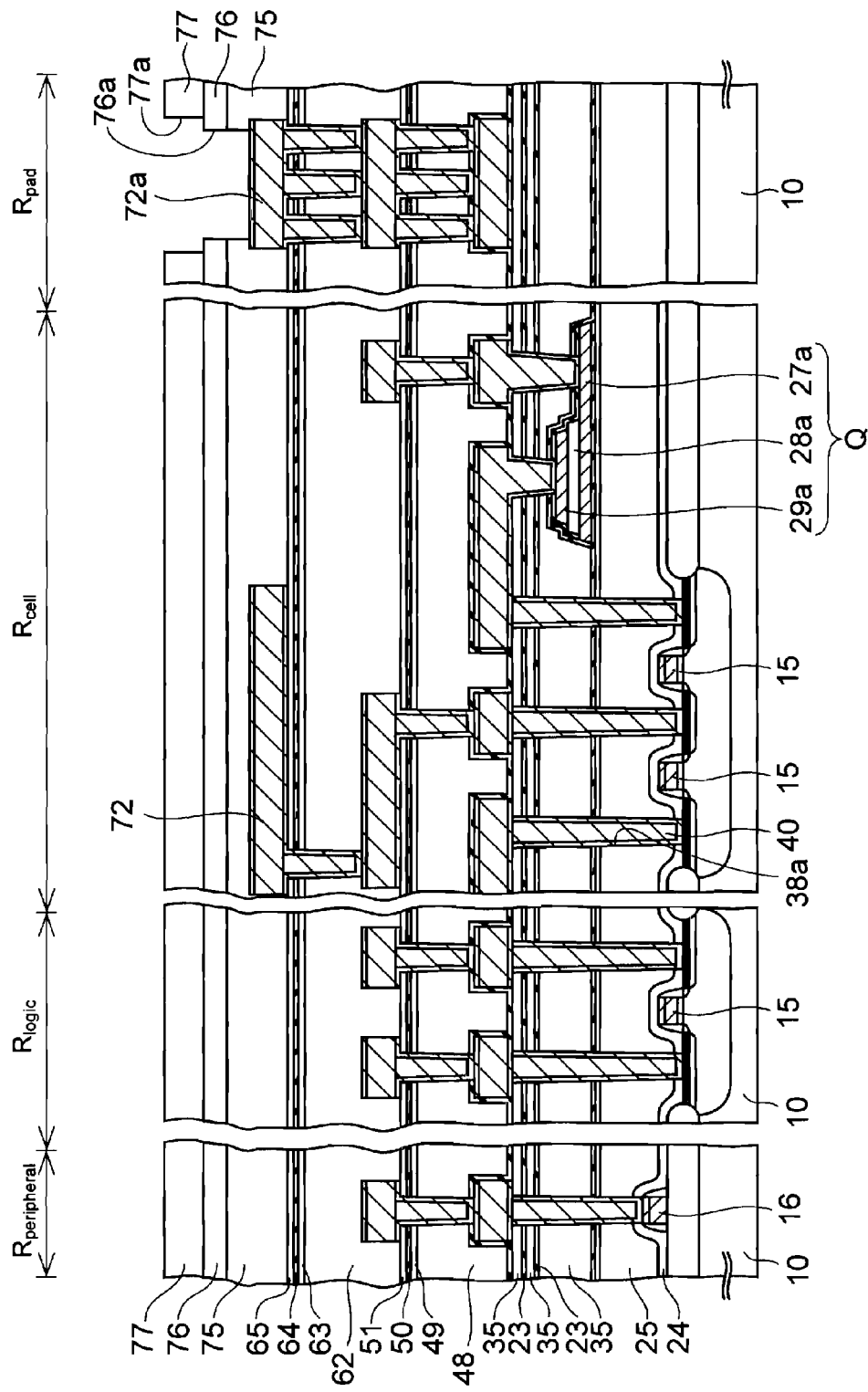

After that, the manufacturing processes of FIGS. 1L to 1Z and 2A to 2D described in the first embodiment are carried out to complete a basic structure of the semiconductor device according to the present embodiment as shown in FIG. 10D.

According to the present embodiment described above, as described by referring to FIGS. 10B and 10C, the two layers of the impurity layers 22 are formed by ion-implanting nitrogen twice into the second insulating film 35 by changing acceleration energy. Thereafter, the impurity layers 22 are annealed to be converted into the two layers of the barrier insulating films 23 containing silicon nitride.

By forming the two layers of the barrier insulating films 23 in this manner, barrier performance against moisture is improved and elements, such as a ferroelectric capacitor Q, become easier to be prevented from being deteriorated by moisture, when compared with the case where an only one barrier insulating film 23 is formed.

Note that the number of the barrier insulating films 23 is not limited to two, and three layers or more of barrier insulating films 23 may be formed by ion-implanting nitrogen for more than three times.

In addition, forming positions of the barrier layers 23 are also not limited to be in the second insulating film 35, and barrier insulating films 23 may be formed in positions like those to be described in the following modifications.

First Modification

Figure 11:
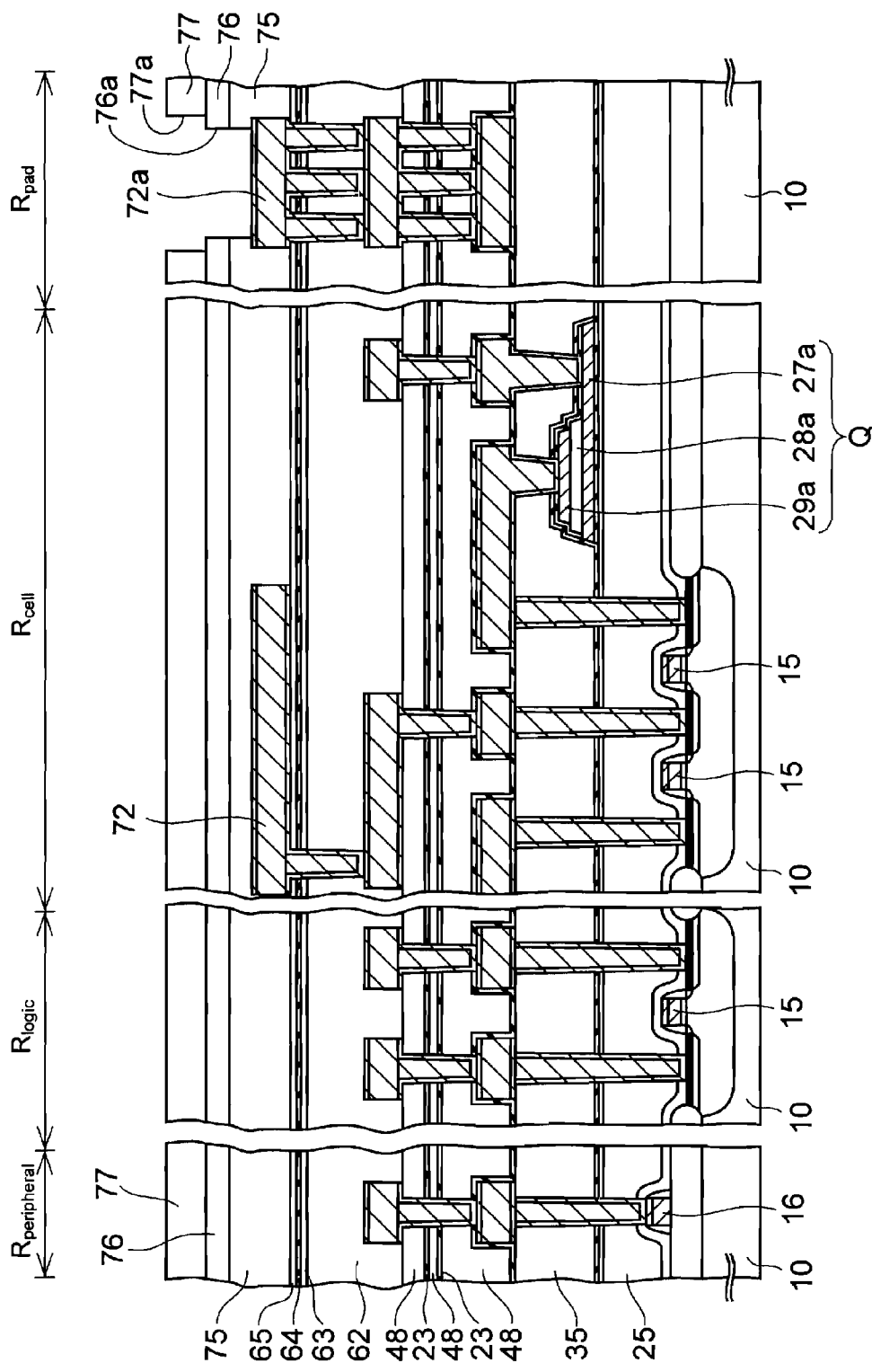
FIG. 11 is a cross-sectional view of a semiconductor device according to a first modification of the second embodiment.

FIG. 11 is a cross-sectional view of a semiconductor device according to a first modification of the present embodiment.

In this modification, two layers of barrier insulating films 23 are formed in predetermined depths of the third insulating film 48. Since the barrier insulating films 23 are formed in the third insulating film 48 that is closer to the atmosphere than a second insulating film 35, it becomes easier that the barrier insulating films 23 effectively protect a capacitor Q from being reached by moisture contained in the atmosphere.

Second Modification

Figure 12:
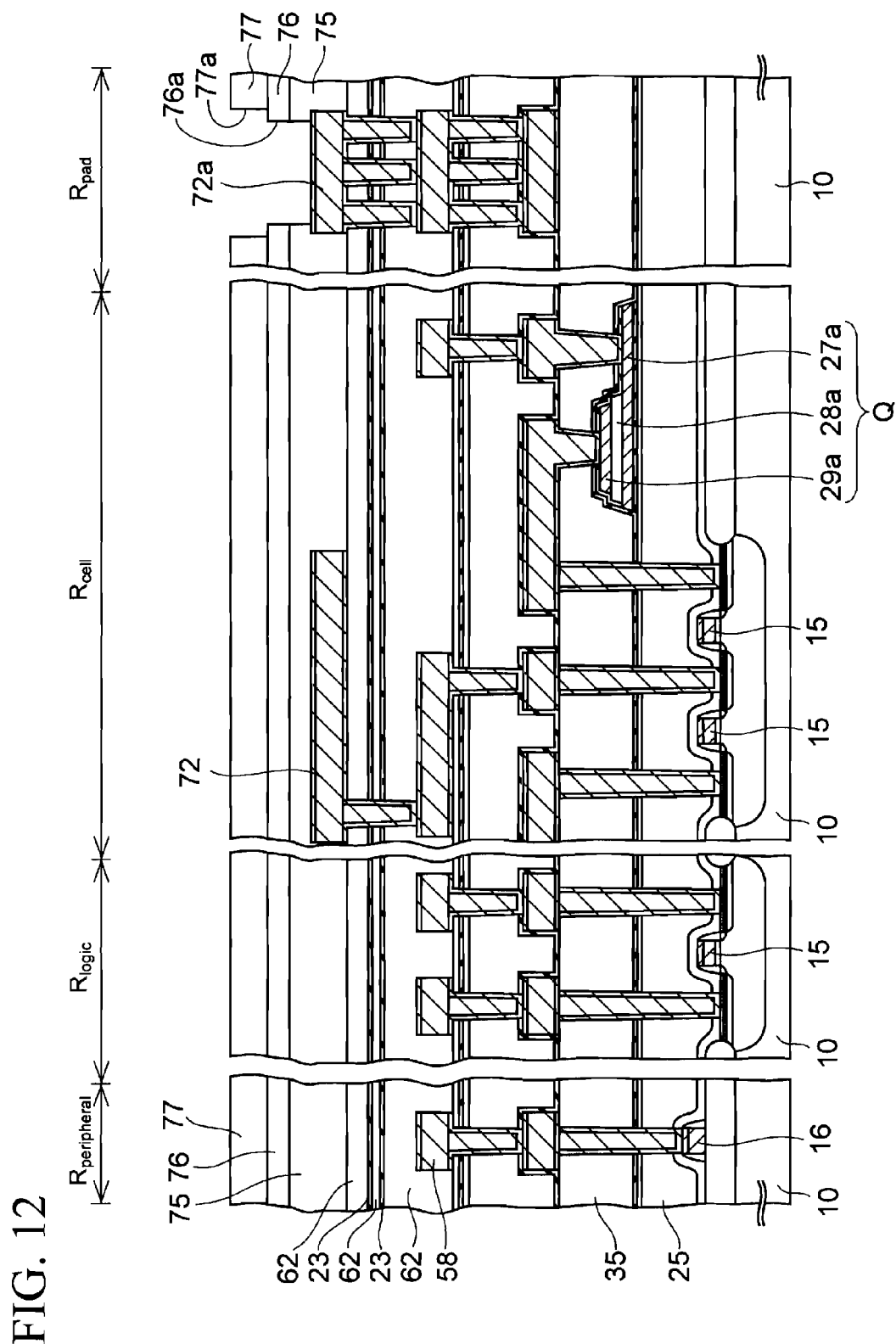
FIG. 12 is a cross-sectional view of a semiconductor device according to a second modification of the second embodiment.

FIG. 12 is a cross-sectional view of a semiconductor device according to a second modification of the present embodiment.

In this modification, two layers of barrier insulating films 23 are formed in predetermined depths of a fourth insulating film 62 that is closer to the atmosphere than a third insulating film 48. With this, the barrier insulating films 23 can prevent moisture penetration at the portion separated from the capacitor Q than the above-described first modification, so that it becomes easier to prevent the deterioration of the capacitor Q due to the moisture.

(3) Third Embodiment

As described by referring to FIG. 1C, the impurity layer 22 is formed before the first conductive plugs 40 (see, FIG. 1H) are formed in the first embodiment. However, the order of the processes of forming the conductive plugs 40 and the impurity layer 22 is not limited to this. In the present embodiment, as will be described below, the order of these processes is reversed.

FIGS. 13A to 13L are cross-sectional views of a manufacturing semiconductor device according to the present embodiment.

To manufacture this semiconductor device, the processes of FIGS. 1A and 1B described in the first embodiment are firstly carried out.

Figure 13A:
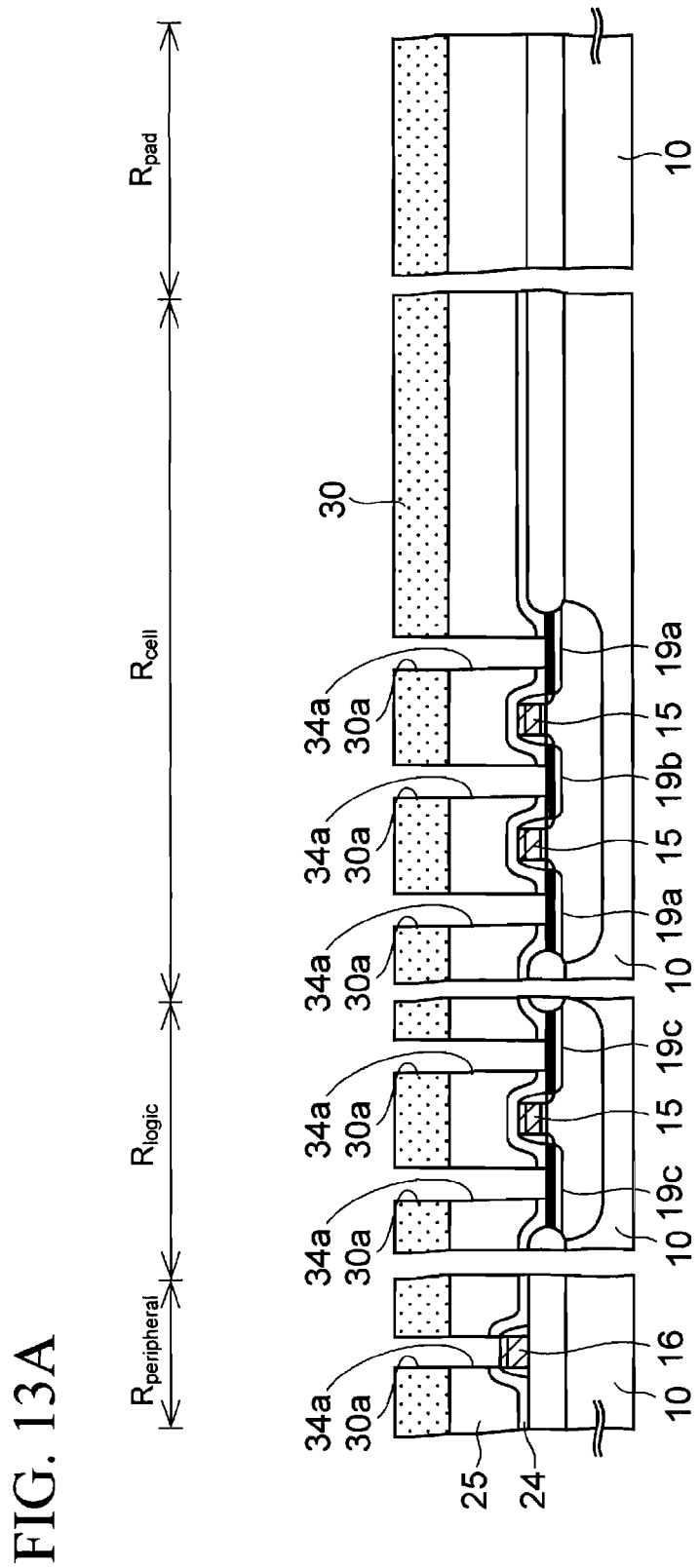
FIGS. 13A to 13L are cross-sectional views of a manufacturing semiconductor device according to a third embodiment.

Next, as shown in FIG. 13A, a photoresist is coated on the first insulating film 25. The coated photoresist is then exposed and developed to form the first resist pattern 30 provided with first windows 30a on conductive patterns, such as the first to third source/drain regions 19a to 19c and the wiring 16.

Subsequently, while the first resist pattern 30 is used as a mask, the base insulating film 24 and the first insulating film 25 are etched to form first holes 34a in these insulating films. During this etching, a mixed gas of $C_4F_8$, $O_2$, and Ar is used as an etching gas for the first insulating film 25 formed of silicon oxide, while a mixed gas of $CHF_3$, $O_2$, and Ar is used as an etching gas for the base insulating film 24 formed of silicon oxynitride.

After that, the first resist pattern 30 is removed.

Figure 13B:
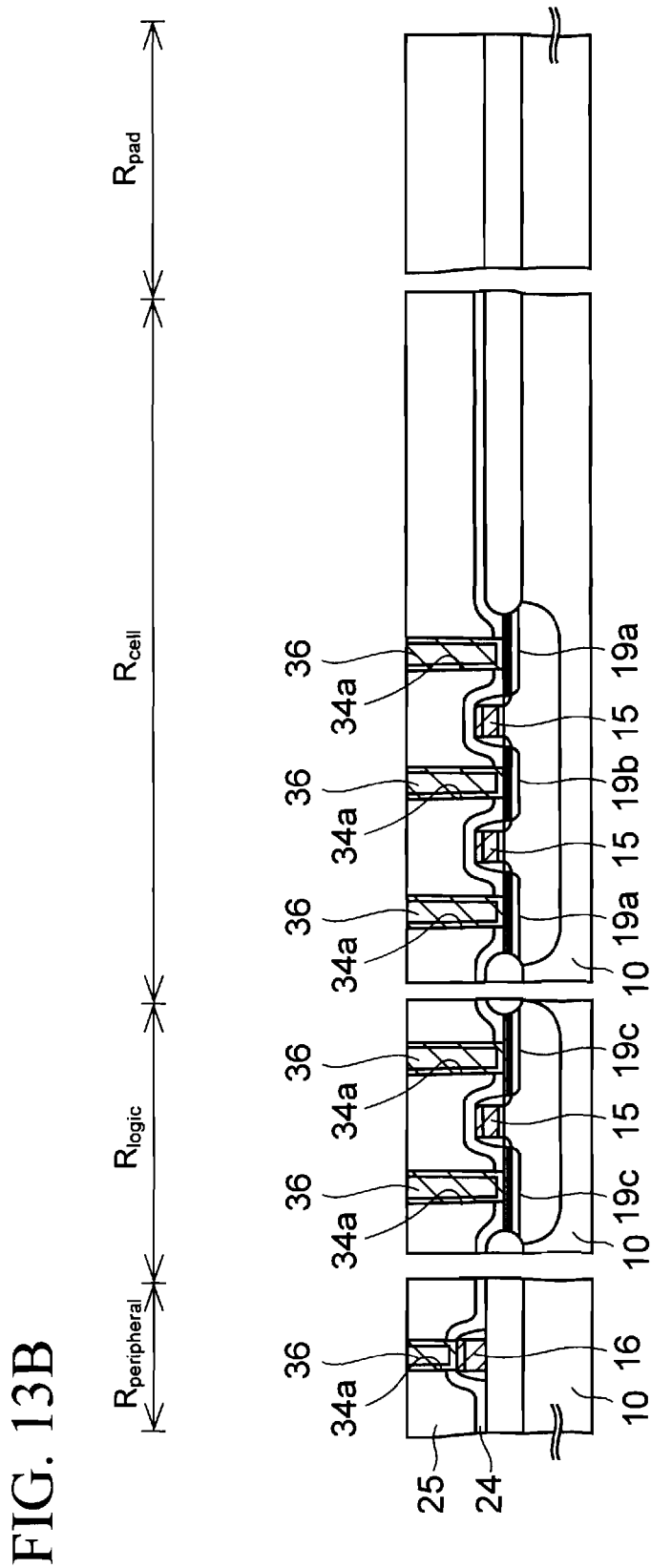

Next, processes for obtaining a cross-sectional structure shown in FIG. 13B will be described.

Firstly, a titanium film and a titanium nitride film are formed with the thicknesses of 20 nm and 50 nm respectively on inner surfaces of the first holes 34a and on an upper surface of the first insulating film 25 by a sputtering method. These films are used as a glue film. Then, a tungsten film is formed with the thickness of 500 nm on the glue film by a CVD method using a tungsten hexafluoride gas. This tungsten film completely embeds the first holes 34a.

After that, the excessive glue film and tungsten film on the first insulating film 25 are polished and removed by a CMP method, and these films are left in the first holes 34a as first conductive plugs 36.

Figure 13C:
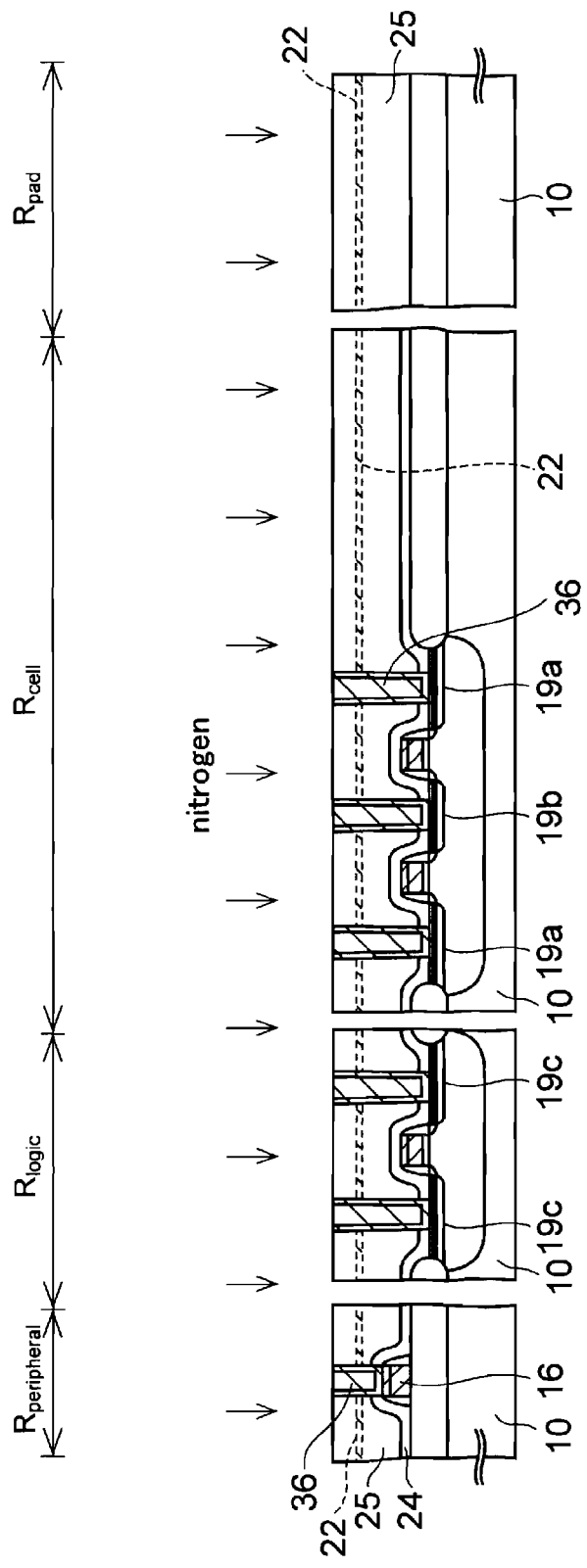

Next, as shown in FIG. 13C, nitride is ion-implanted into the first insulating film 25 to form an impurity layer 22 containing nitrogen in a predetermined depth of the first insulating film 25. The adopted conditions for this ion implantation are, for example, acceleration energy of 5 keV and a dose amount of $1 \times 10^{15}$ cm$^{-2}$.

Figure 13D:
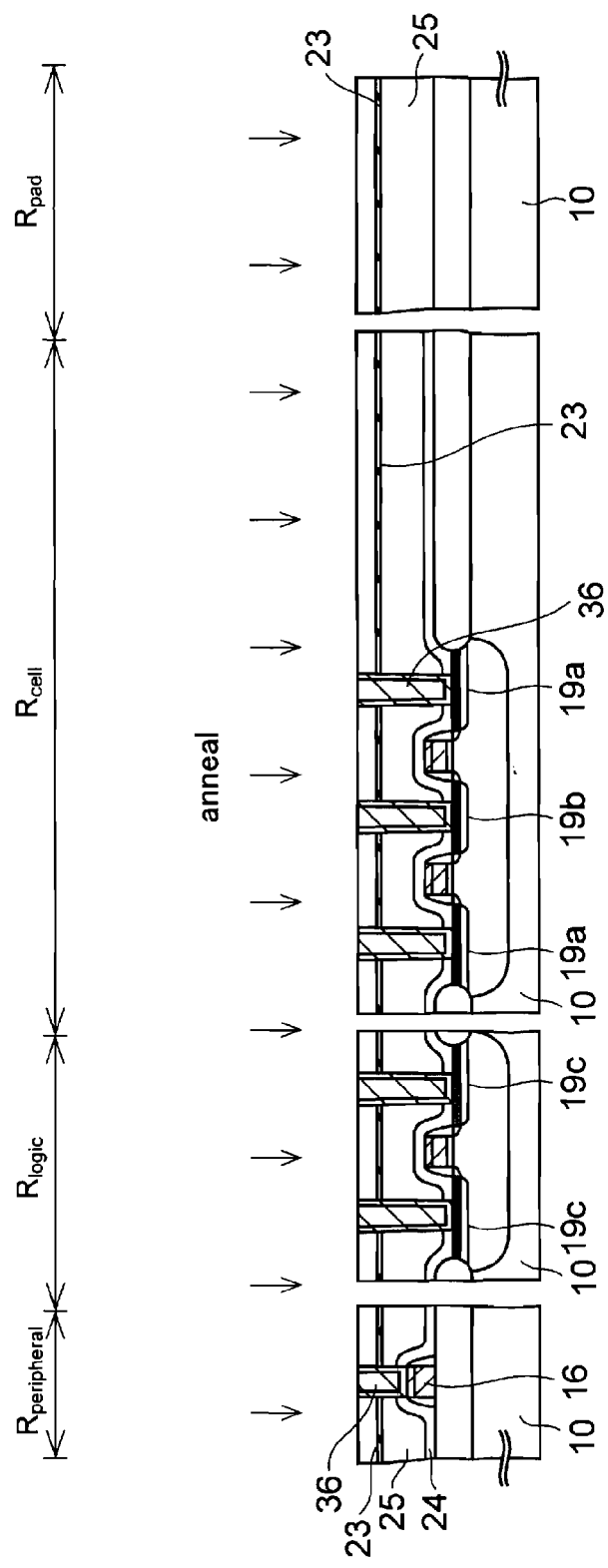

Next, as shown in FIG. 13D, the impurity layer 22 is annealed in a vertical or lateral finance at the substrate temperature of 800° C. to 1000° C. to cause nitrogen contained in the impurity layer 22 to react with silicon contained in the first insulating film 25. Thereby, the barrier insulating film 23 containing silicon nitride is formed.

Here, in order to prevent occurrence of contact defect due to oxidation of the first conductive plugs 36 containing tungsten which is oxidized very easily, it is preferable that this annealing be carried out in the atmosphere of an inert gas, such as argon or nitrogen, from which oxygen is excluded.

Figure 13E:
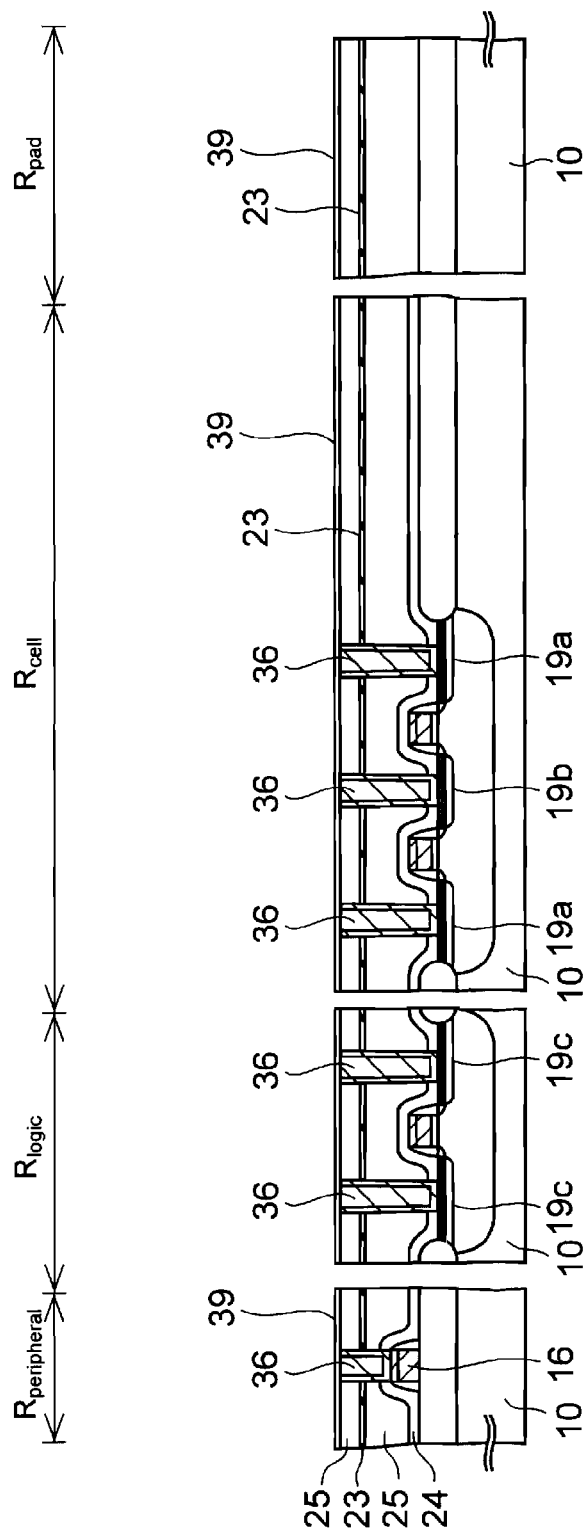

Next, processes for obtaining a cross-sectional structure shown in FIG. 13E will be described.

Firstly, a high-frequency power is applied to an argon gas to generate argon plasma in sputtering equipment, which is used in place of an RF plasma processing equipment. Then, the upper surfaces of the above-described first conductive plugs 36 are exposed to this argon plasma, and are etched by a few nanometers. Thereby, oxidants adhered onto the upper surfaces of the first conductive plugs 36 are removed and cleaned.

Note that this plasma processing may be carried out in equipment in which a bias voltage is applied to the silicon substrate 10, like the RF plasma preprocessing equipment and the plasma etching equipment attached to the sputtering equipment.

Subsequently, a silicon oxynitride film is formed as an oxidation prevention insulating film 39 for preventing oxidation of the first conductive plugs 36 with the thickness of approximately 100 nm on each of the first conductive plugs 36 and the first insulating film 25 by the CVD method.

Figure 13F:
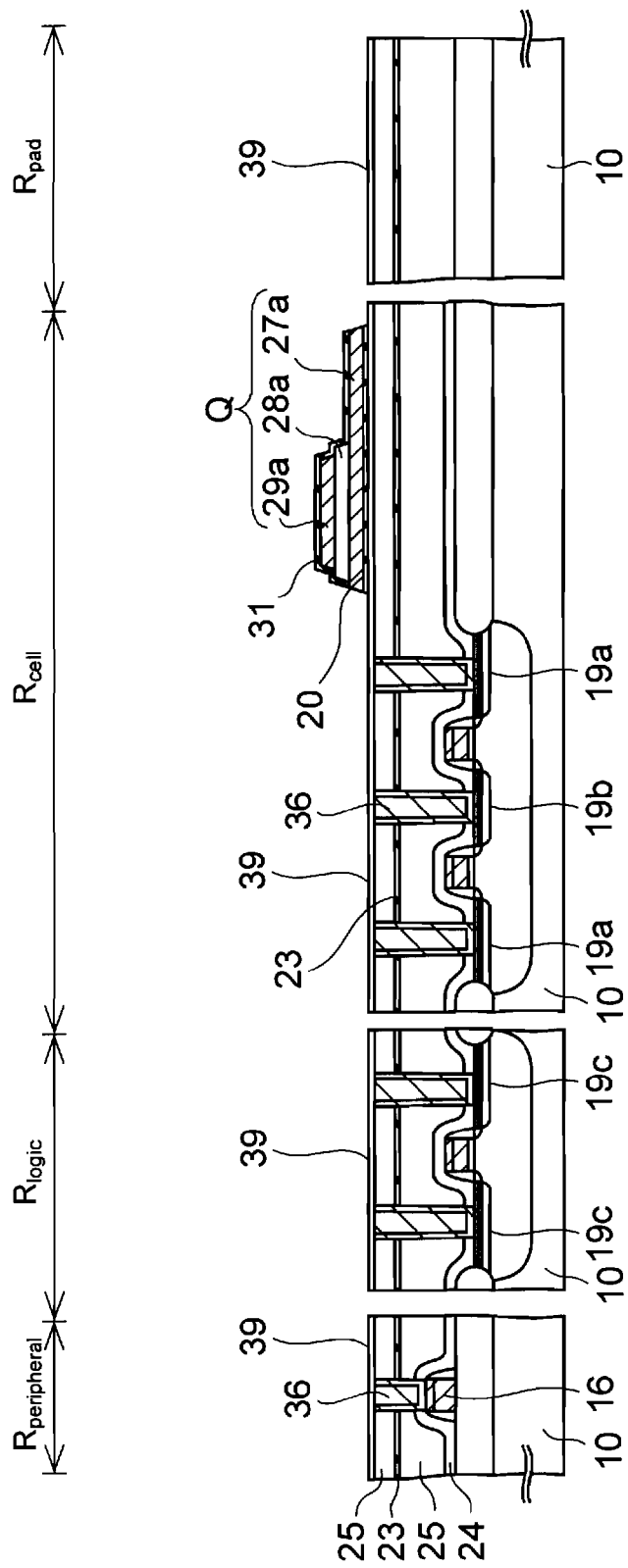

Next, as shown in FIG. 13F, an alumina film 20 and a capacitor Q are formed on the oxidation prevention insulating film 39 by carrying out the processes of FIGS. 1E to 1I described in the first embodiment.

Note that the first cap insulating film 26 described in the first embodiment is not necessary, since the role of the first cap insulating film 26 is played by the oxidation prevention insulating film 39.

Figure 13G:
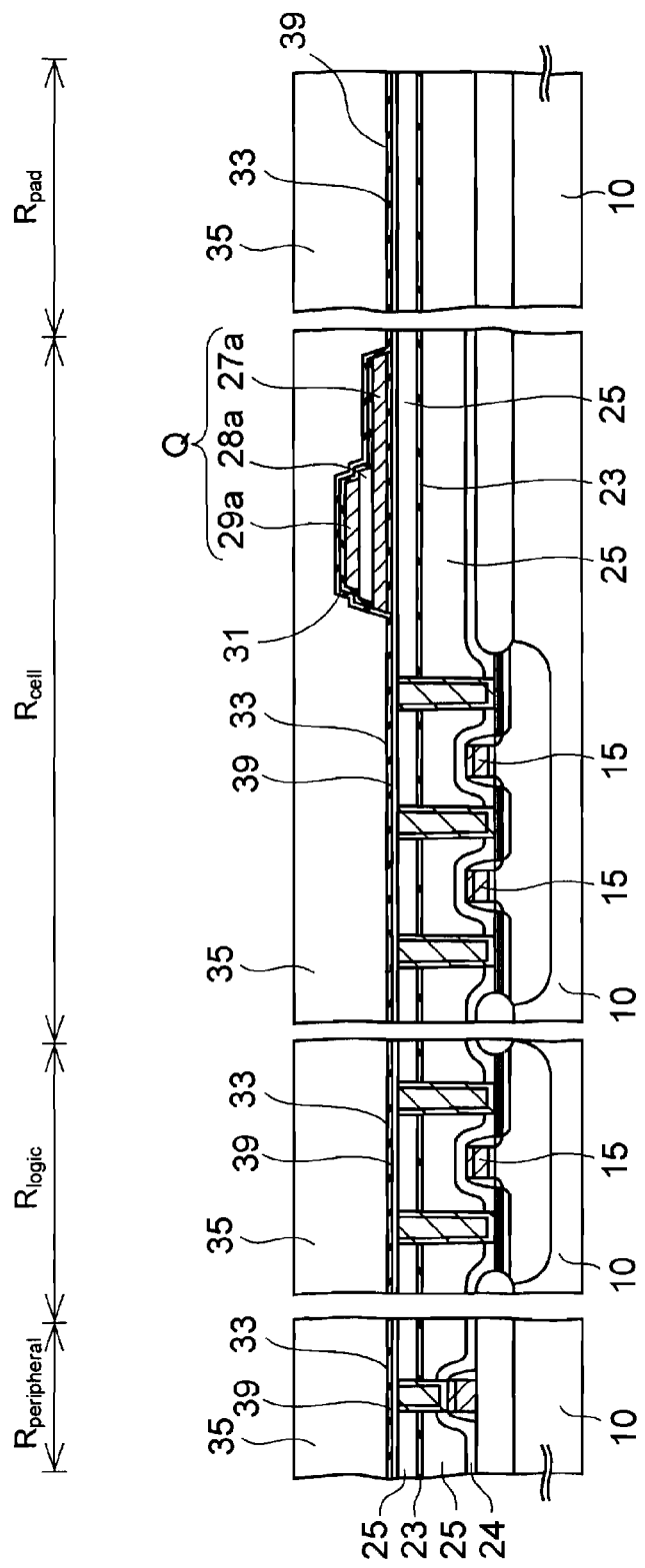

Next, as shown in FIG. 13G, a second capacitor protective insulating film 33 and a second insulating film 35 are sequentially formed on the capacitor Q by carrying out the processes of FIGS. 1J and 1K described in the first embodiment.

Figure 13H:
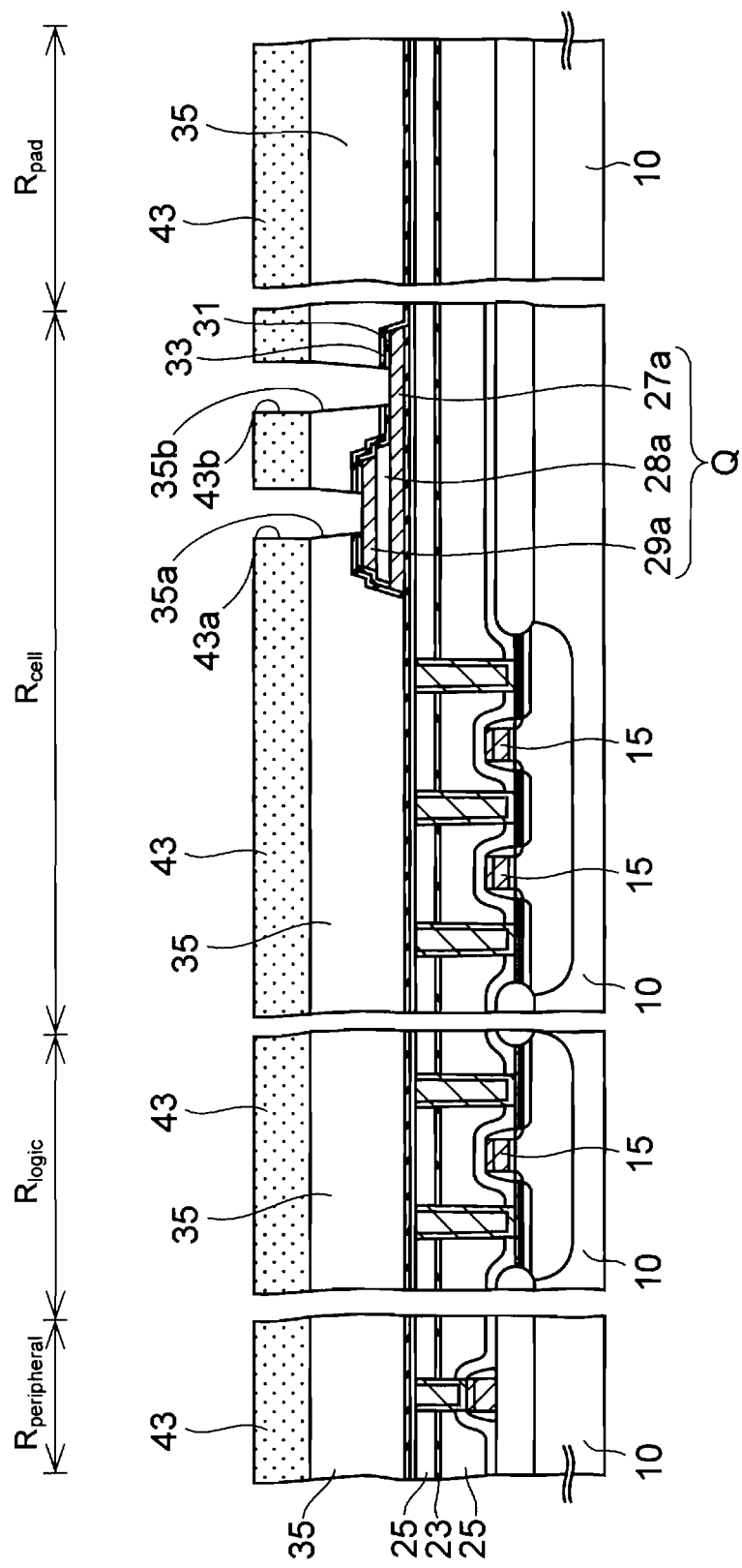

Subsequently, as shown in FIG. 13H, a photoresist is coated on the second insulating film 35. The coated photoresist is then exposed and developed to form a second resist pattern 43 provided with second and third hole-shaped windows 43a and 43b on each of upper and lower electrodes 29a and 27a.

Then, the second insulating film 35 and the first and second capacitor protective insulating films 31 and 33 are etched by using the second resist pattern 43 as a mask. Thereby, a second hole 35a is formed on the upper electrode 29a, and a third hole 35b is formed on a contact region of the lower electrode 27a.

After that, the second resist pattern 43 is removed.

Figure 13I:
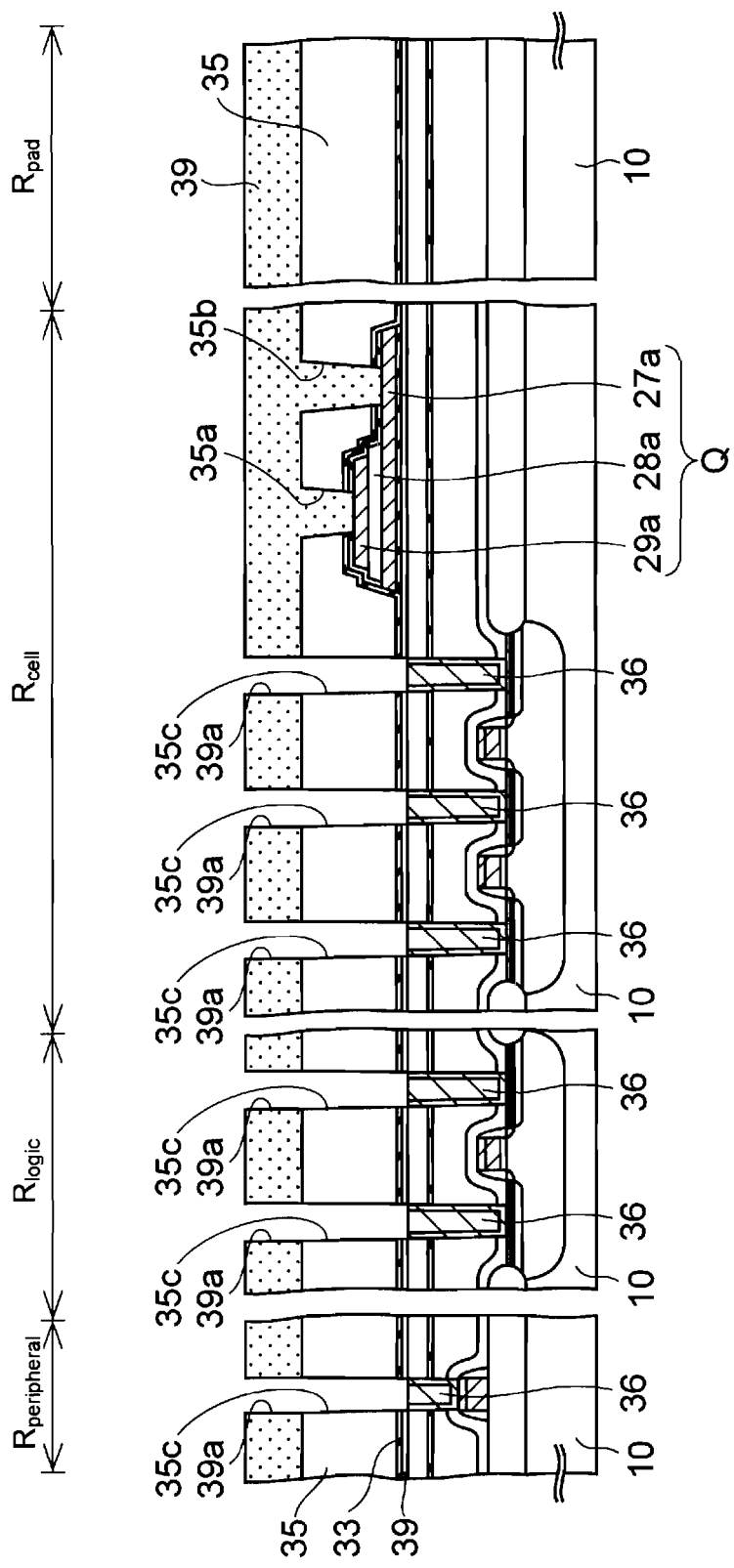

Next, processes for obtaining a cross-sectional structure as shown in FIG. 13I will be described.

Firstly, a third resist pattern 39 provided with fourth windows 39a on the first conductive plugs 36 is formed on the second insulating film 35.

Subsequently, the second insulating film 35 made of silicon oxide is dry-etched by using the mixed gas of $C_4F_8$, $O_2$, and Ar as an etching gas while the third resist pattern is used as a mask. At the same time, the second capacitor protective insulating film 33 made of alumina is etched by a sputtering effect of the etching gas.

Furthermore, the oxidation prevention insulating film 39 made of silicon oxynitride is dry-etched by switching the etching gas to the mixed gas of $CHF_2$, $O_2$, and Ar.

With such etching, fourth holes 35c, in each of which the upper surface of the first conductive plug 36 is exposed, are formed in the insulating films 33, 35, and 39 on the first conductive plugs 36.

Then, the third resist pattern 39 is removed after this etching is finished.

Figure 13J:
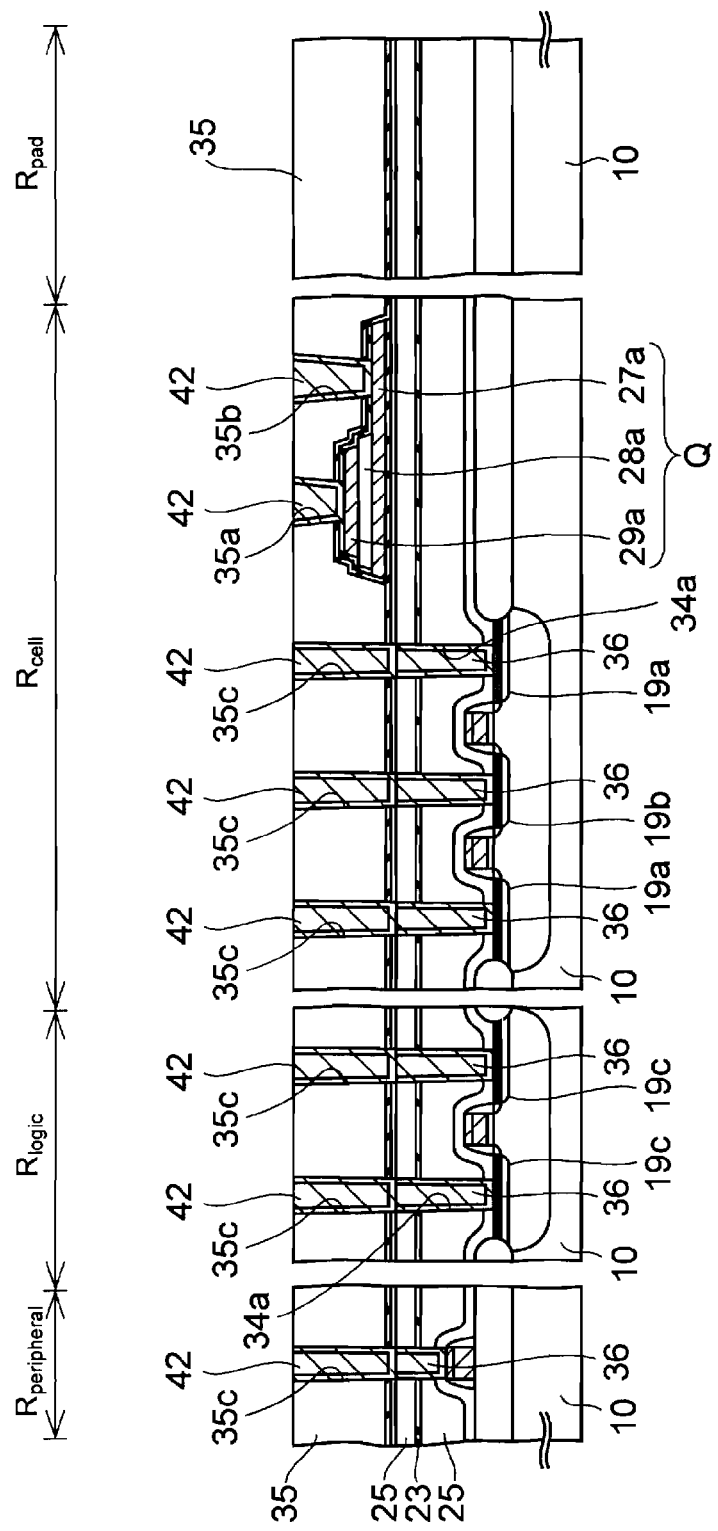

Next, processes for obtaining a cross-sectional structure shown in FIG. 13J will be described.

Firstly, a titanium nitride film is formed as a glue film with the thickness of approximately 150 nm on inner surfaces of the second to fourth holes 35a to 35c and on the upper surface of the second insulating film 35 by the sputtering method.

Subsequently, a tungsten film is formed on this glue film 56 by the plasma CVD method using a tungsten hexafluoride gas, and this tungsten film completely embeds the holes 35a to 35c.

After that, the excessive glue film and tungsten film on the upper surface of the second insulating film 35 are polished and removed by the CMP method to leave these films in the second to fourth holes 35a to 35c as second conductive plugs 42.

Among the second conductive plugs 42 formed in this manner, those formed on the capacitor Q are electrically connected to the lower and upper electrodes 27a and 29a.

In contrast, the second conductive plugs 42 formed on the first conductive plugs 36 are electrically connected to first to third source/drain regions 19a to 19c and a wiring 16 through the first conductive plugs 36.

The structure having two steps of the first and second conductive plugs 36 and 42 in this manner is referred to as a via-to-via structure. In the via-to-via structure, the first and fourth holes 34a and 35c in which the conductive plugs 36 and 42 are respectively embedded are separately formed. Thereby, etching of the holes 34a and 35c becomes easier than the case where these holes are simultaneously etched.

Furthermore, if these holes 34a and 35c were to be simultaneously formed, entire aspect ratios of the holes 34a and 35c would become large, so that it would become difficult to embed the conductive plugs in these holes. On the contrary, in the via-to-via structure, each of the aspect ratios of the holes 34a and 35c can be made small. Thus, the first and second conductive plugs 36 and 42 are easily embedded in these holes 34a and 35c.

Figure 13K:
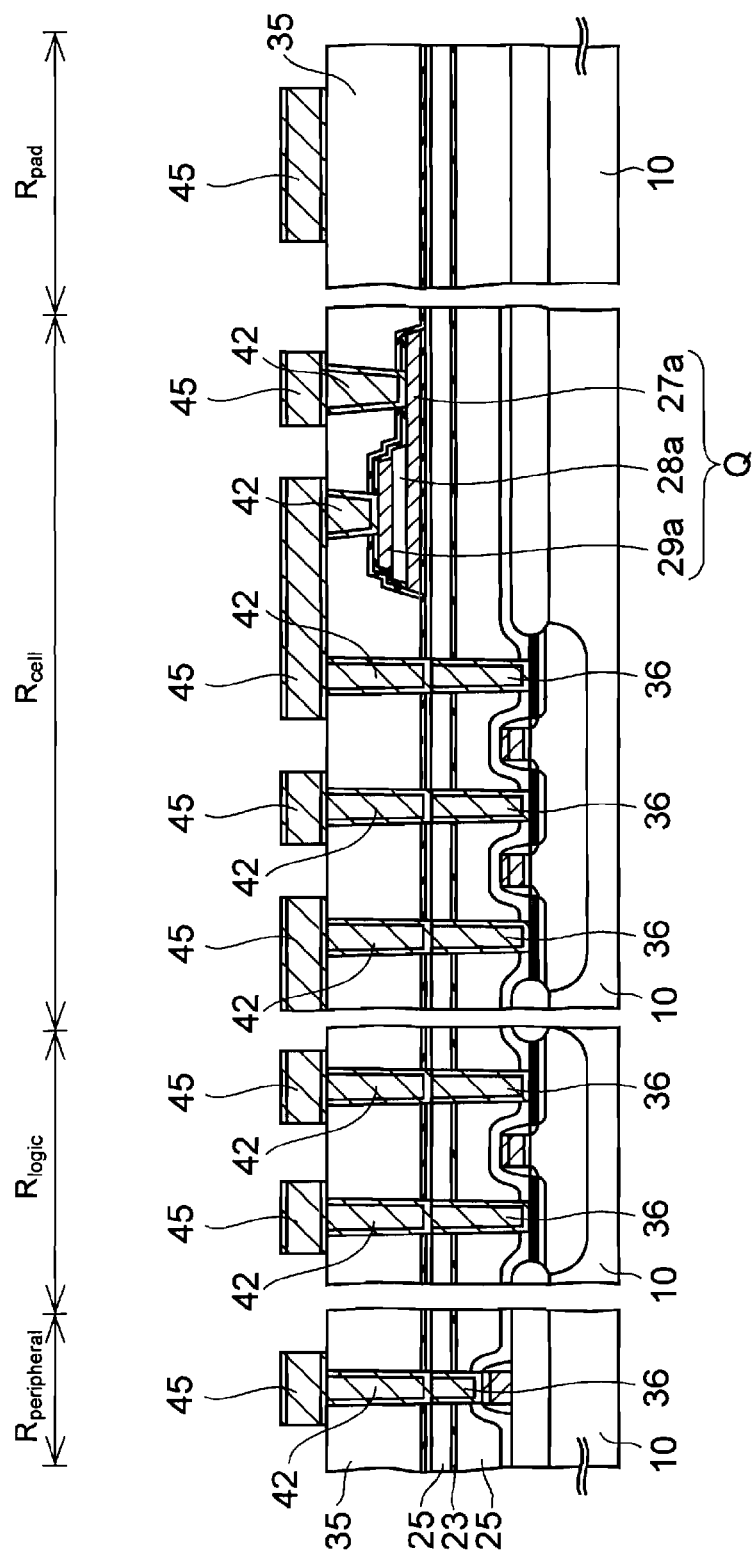

Next, as shown in FIG. 13K, a metal laminated film is formed on each of the second conductive plugs 42 and the second insulating film 35. Thereafter, this metal laminated film is pattered by photolithography to form first metal wirings 45. The metal laminated film is formed by sputtering, for example, a titanium nitride film, a copper-containing aluminum film, and a titanium nitride film in this order.

Figure 13L:
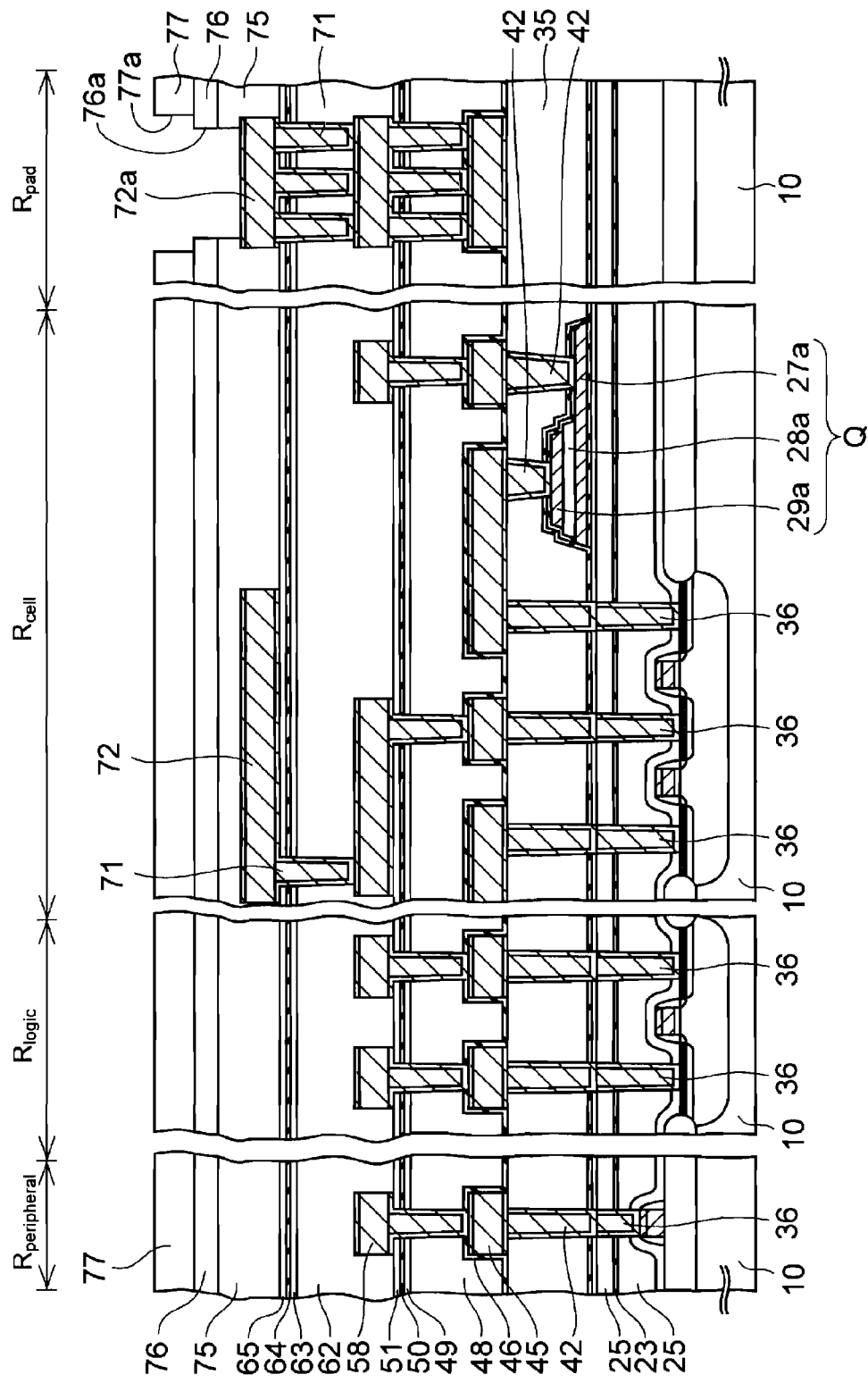

After that, by carrying out the processes of FIGS. 1Q to 1Z and 2A to 2D described in the first embodiment, a basic structure of the semiconductor device according to the present embodiment as shown in FIG. 13L is completed.

In the above-described present embodiment, as described by referring to FIG. 13C, the impurity layer 22 is formed by ion-implanting nitrogen into the first insulating film 25 after the first conductive plugs 36 are formed. Then, this impurity layer 22 is annealed to be converted into the barrier insulating film 23.

According to this, the first holes 34a, in which the first conductive plugs 36 are embedded, do not pass through the barrier insulating film 23 at the step (FIG. 13A) of forming the first holes 34a by etching. Therefore, it is not needed to switch the etching gas to a gas for the barrier insulating film 23 in this etching, and thus the manufacturing processes can be simplified.

Note that the present embodiment is not limited to the above. For example, ion implantation of FIG. 13C may be performed after removing the first resist pattern 30 in the step shown in FIG. 13A. In this case, an optional photoresist is coated onto the first insulating film 25 to fill the first holes 34a with this photoresist. Then, the photoresist is etched back to be left only in the first holes 34a. After that, the above-described ion implantation may be performed. According to such process, increase in the contact resistance between the first conductive plugs 36 and the source/drain regions 19a to 19c can be prevented, because the ions are not implanted into the substrate 10 under the first holes 34a by the resist left therein.

(4) Fourth Embodiment

Figure 14A:
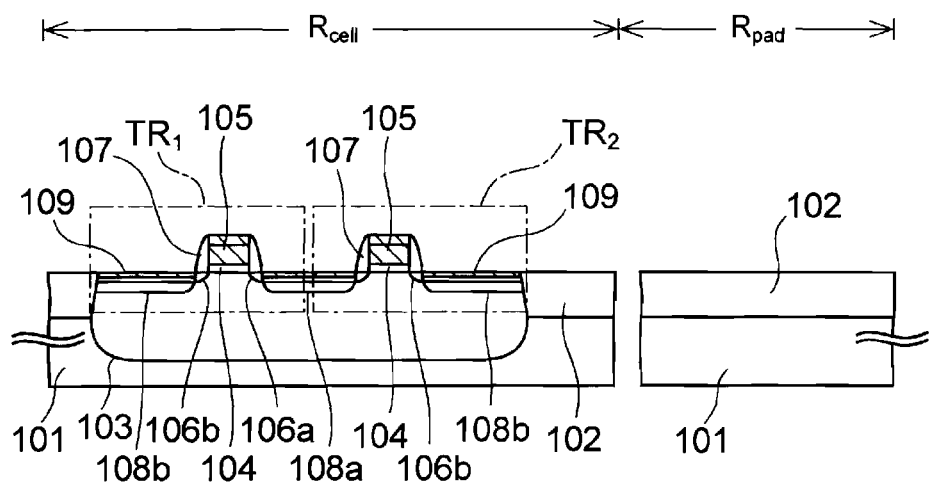
FIGS. 14A to 14X are cross-sectional views of a manufacturing semiconductor device according to a fourth embodiment.

In the first to third embodiments, the barrier insulating film 23 is formed in a planer-type FeRAM. In contrast, in the present embodiment, the barrier insulating film is formed in a stack-type FeRAM that is suitable for fine device. FIGS. 14A to 14X are cross-sectional views of a semiconductor device according the present embodiment in the course of manufacturing.

Note that the description will be given below by illustrating only a cell region $R_{cell}$ and a pad region $R_{pad}$.

First, processes for obtaining a cross-sectional structure shown in FIG. 14A will be described.

Firstly, a groove for STI defining active regions of a transistor is formed in a surface of an n-type or p-type silicon substrate 101. Then, the groove is embedded by a device isolation insulating film 102 such as silicon oxide. Note that the device isolation structure is not limited to STI, and the device isolation insulating film 102 may be formed by a LOCOS method.

Subsequently, a p-well 103 is formed by introducing p-type impurities into the active region of the silicon substrate 101. Thereafter, the surface of the active region is thermally oxidized to form a thermally-oxidized film to be a gate insulating film 104.

After that, an amorphous or polycrystal silicon film is formed on the entire upper surface of the silicon substrate 101, and these films are patterned by photolithography to form two gate electrodes 105.

The above-described two gate electrodes 105 are disposed on the p-well 103 in parallel at a distance from each other, and these gate electrodes 105 form a part of a ward line.

Thereafter, n-type impurities are introduced into the silicon substrate 101 beside the gate electrodes 105 by the ion implantation using the gate electrodes 105 as a mask, to form first and second source/drain extensions 106a and 106b.

After that, an insulating film is formed on the entire upper surface of the silicon substrate 101, and this insulating film is etched back to form insulating sidewalls 107 beside the gate electrodes 105. As the insulating film, a silicon oxide film is formed by the CVD method, for example.

Subsequently, the n-type impurities are ion-implanted into the silicon substrate 101 again, while the insulating sidewalls 107 and the gate electrodes 105 are used as a mask, to form first and second source/drain regions 108a and 108b in the surface layer of the silicon substrate 101 beside the two gate electrodes 105.

After that, a refractory metal layer, such as a cobalt layer, is formed on the entire upper surface of the silicon substrate 101 by the sputtering method. Then, the refractory metal layer is heated, and thereby caused to react with silicon to form a refractory metal silicide layer 109 on the silicon substrate 101. The refractory metal silicide layer 109 is also formed in surface portions of the gate electrodes 105. Thereby, the resistance of the gate electrodes 105 is lowered.

Thereafter, the refractory metal layer which is left unreacted on the device isolation insulating film 102 and the like is removed by wet etching.

With the processes described so far, first and second MOS transistors $TR_1$ and $TR_2$ formed of the gate insulating films 104, the gate electrodes 105, the first and second source/drain regions 108a and 108b, and the like, are formed in the active region of the silicon substrate 101.

Figure 14B:
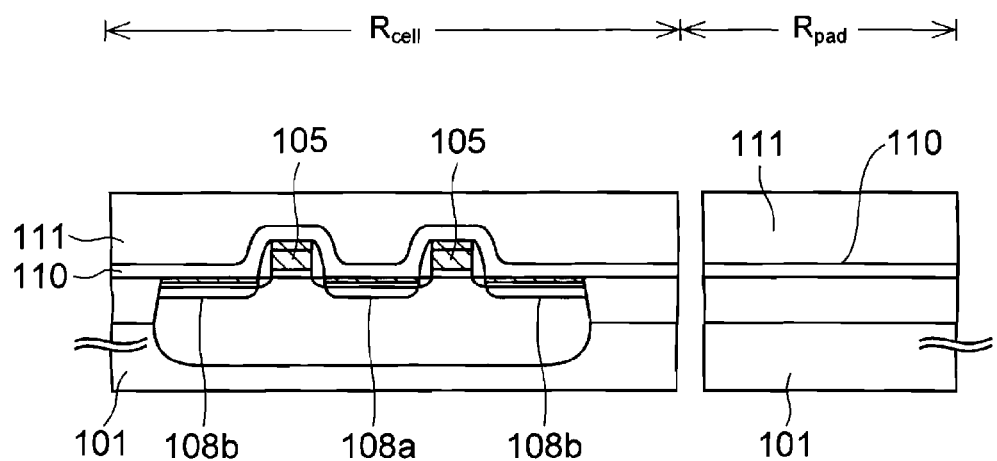

Next, as shown in FIG. 14B, a silicon oxynitride film is formed with the thickness of approximately 80 nm on the entire upper surface of the silicon substrate 101 by the plasma CVD method. The silicon oxynitride film thus formed is used as a base insulating film 110. Then, a silicon oxide film is formed as a first insulating film 111 with the thickness of approximately 1100 nm on the base insulating film 110 by the plasma CVD method using the TEOS gas.

After that, the upper surface of the first insulating film 111 is polished and planarized. As a result of this CMP, the thickness of the first insulating film 111 becomes approximately 800 nm on the flat surface of the silicon substrate 101.

Figure 14C:
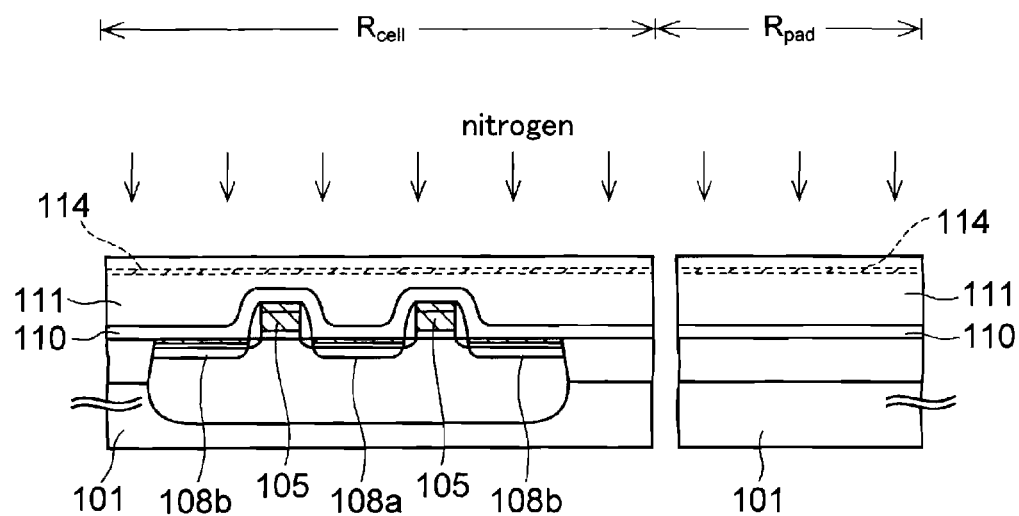

Next, as shown in FIG. 14C, nitrogen is ion-implanted into a predetermined depth of the first insulating film 111, for example the depth of 20 nm from the upper surface, under conditions with acceleration energy of 5 keV and a dose amount of $1\times10^{15}$ cm$^{-2}$, for example. Thereby, an impurity layer 114 containing nitrogen as impurities is formed.

Figure 14D:
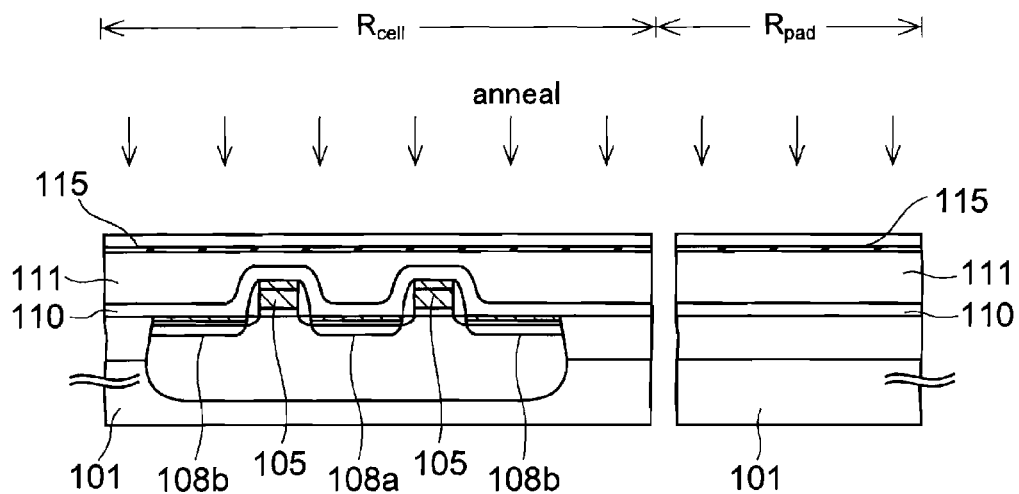

Next, as shown in FIG. 14D, the impurity layer 114 is annealed by using a vertical or lateral furnace in the atmosphere of an inert gas, such as argon or nitrogen, at the substrate temperature of 800° C. to 1000° C. With such annealing, nitrogen contained in the impurity layer 114 reacts with silicon contained in the first insulating film 111. Accordingly, a barrier insulating film (impurity-containing insulating film) 115 containing silicon nitride, which is excellent in barrier performance against moisture, is formed.

Figure 14E:
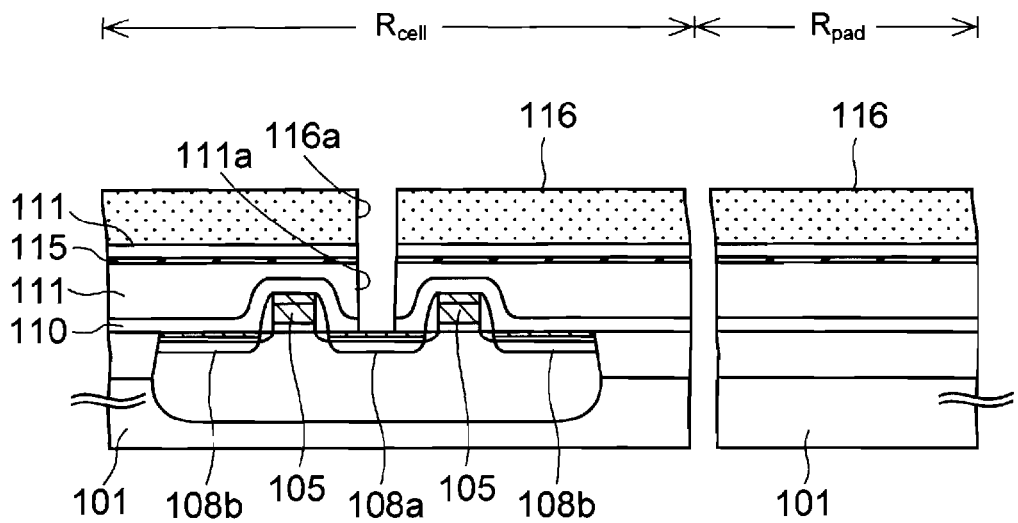

Next, as shown in FIG. 14E, a first resist pattern 116 provided with a first window 116a over the first/drain region 108a is formed on the first insulating film 111.

Subsequently, while this first resist pattern 116 is used as a mask, the first insulating film 111, the barrier insulating film 115, and the base insulating film 110 are dry-etched to form a first hole 111a in these insulating films.

This dry etching is carried out in an unillustrated parallel plate-type plasma etching equipment. Then, the mixed gas of $C_4F_8$, $O_2$, and Ar is used as an etching gas for the first insulating film 111 made of silicon oxide. Note that a CO gas may be added to the mixed gas in some cases.

In contrast, the mixed gas of $CHF_3$, $O_2$, and Ar is used as an etching gas for the barrier insulating film 115 containing silicon nitride and the base insulating film 110 formed of silicon oxynitride.

The resist pattern 37 is removed after such etching is finished.

Note that the above-described ion implantation (FIG. 14C) and annealing (FIG. 14D) may be performed after forming the first hole 111a. According to this, etching for forming the first hole 111a can be facilitated, because etching of the barrier insulating film 115 can be omitted. In this case, the first hole 111a may be buried with an optional photoresist before performing the above ion implantation. The photoresist is formed in the first hole 111a by firstly forming it on the entire upper surface of the first insulating film 111, and then by etching back and leaving it only in the hole 111a. The photoresist is served to prevent the ions from being introduced into the substrate 101 under the first hole 111a. Therefore, increase in the contact resistance between the conductive plug formed in the hole 111a and the source/drain regions 108a due to the ions can be avoided. The photoresist is removed before performing the annealing for forming the barrier insulating film 115.

Figure 14F:
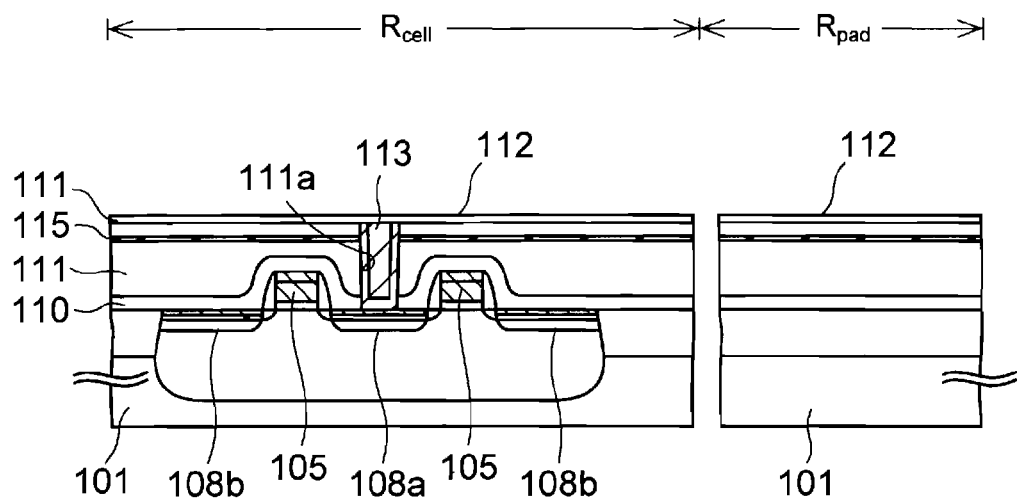

Next, processes for obtaining a cross-sectional structure as shown in FIG. 14F will be described.

Firstly, a titanium film and a titanium nitride film are formed with the thicknesses of approximately 30 nm and 50 nm, respectively, in this order on the upper surface of the first insulating film 111 and the inner surface of the first hole 111a by the sputtering method. These films are used as a glue film.

Furthermore, a tungsten film is formed on this glue film by using the CVD method using a tungsten hexafluoride gas to completely embed the first hole 111a with this tungsten film.

Then, the excessive glue film and tungsten film on the first insulating film 111 are polished and removed to leave these films as a first conductive plug 113a in the first hole 111a.

Here, the first conductive plug 113a which is mainly formed of tungsten easily causes contact defect due to oxidation when coming in contact with oxygen.

To deal with this problem, a silicon oxynitride film is formed as an oxidation prevention insulating film 112 on each of the upper surfaces of the first conductive plug 113a and the first insulating film 111. The oxidation prevention insulating film 112 protects the first conductive plug 113a from an oxygen atmosphere.

Figure 14G:
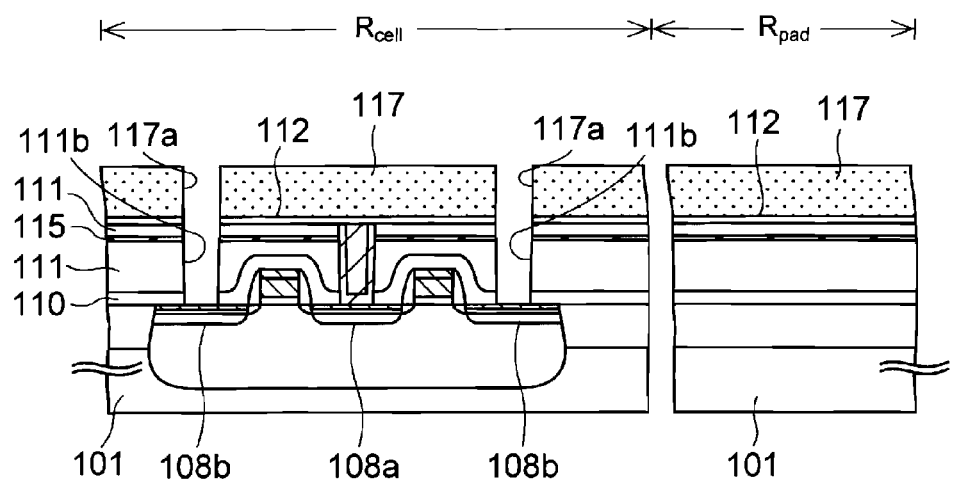

Next, as shown in FIG. 14G, a second resist pattern 117 provided with second windows 117a over the second source/drain regions 108b is formed on the oxidation prevention insulating film 112.

Subsequently, while this second resist pattern 117 is used as a mask, the oxidation prevention insulating film 112, the first insulating film 111, the barrier insulating film 115, and the base insulating film 110 are etched by using an unillustrated parallel plate-type plasma etching equipment. Thereby, second holes 111b are formed in these insulating films.

Similar to the etching of the first hole 111a (FIG. 14E), the mixed gas of $C_4F_8$, $O_2$, and Ar is also used in this etching as an etching for the first insulating film 111 made of silicon oxide. On the contrary, the mixed gas of $CHF_3$, $O_2$, and Ar is used as an etching gas for the oxidation prevention insulating film 112 and base insulating film 110, which are formed of silicon oxynitride, and the barrier insulating film containing silicon nitride.

The second resist pattern 117 is removed after this etching is finished.

Figure 14H:
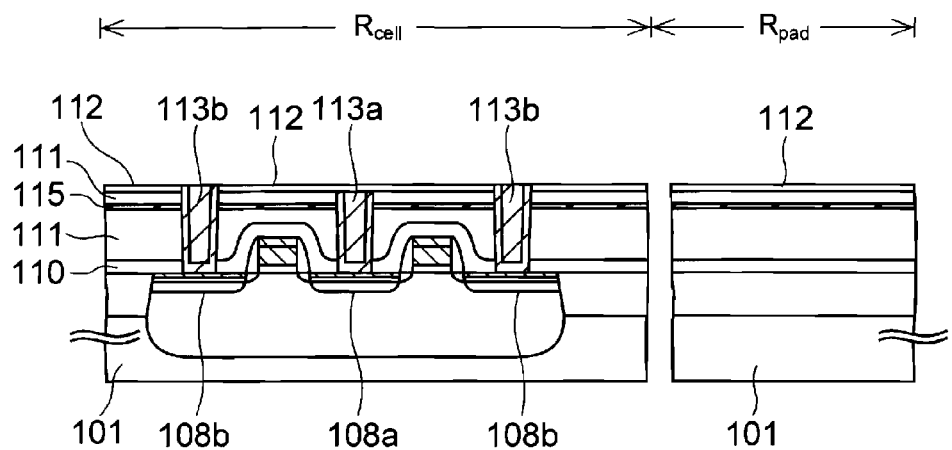

Next, as shown in FIG. 14H, second conductive plugs 113b are formed in the second holes 111b by adopting the same method as that for forming the first conductive plug 113a.

Figure 14I:
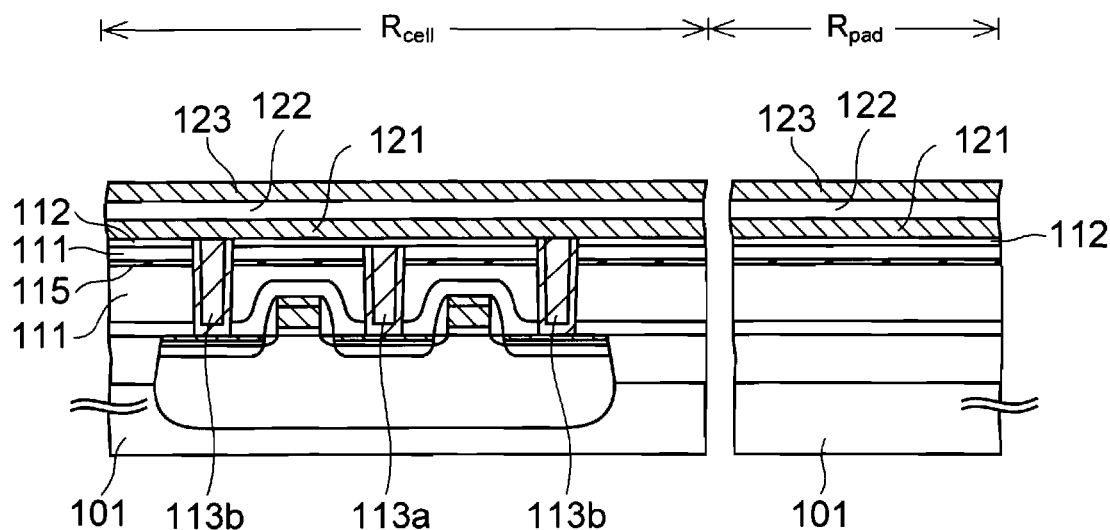

Next, as shown in FIG. 14I, an iridium film is formed as a first conductive film 121 with the thickness of approximately 200 nm on the upper surfaces of the second conductive plugs 113b and the oxidation prevention insulating film 112 by the DC sputtering method. The film-forming conditions for the iridium film are not particularly limited. In the present embodiment, the iridium film is formed by using an argon gas as a sputtering gas, and by setting the internal pressure of chamber to approximately 0.11 Pa, DC power to 0.5 kW, a film forming time to 335 seconds, and the substrate temperature to 500° C.

Furthermore a PZT film is formed as a ferroelectric film 122 with the thickness of approximately 120 nm on the first conductive film 121 by the MOCVD method. The MOCVD method is carried out by setting, for example, the flow rate of tetrahydrofuran (THF: $C_4H_8O$) to 0.474 ml per minute. The flow rate of a Pb material, which is prepared by dissolving $Pb(DPM)_2$ into the THF solvent with the concentration of 0.3 mol per liter, is set to 0.326 ml per minute. The flow rate of a Zr material, which is prepared by dissolving $Zr(dmhd)_4$ into the THF solvent with the concentration of 0.3 mol per liter, is set to 0.2 ml per minute. Then, the flow rate of a Zr material, which is prepared by dissolving $Ti(O-iPr)_2(DPM)_2$ into the THF solvent with the concentration of 0.3 mol per liter, is set to 0.2 ml per minute. In addition, the film-forming pressure is approximately 5 Torr, the substrate temperature is approximately 620° C., and the film-forming time is approximately 620 seconds.

Note that the film-forming methods of the ferroelectric film 122 include a sputtering method and a sol-gel method in addition to the MOCVD method. Furthermore, the material of the ferroelectric film 122 is not limited to the above-described PZT, and it may be formed of Bi layer structure compounds such as $SrBi_2Ta_2O_9$ and $SrBi_2(Ta, Nb)_2O_9$. Furthermore, a PLZT in which lanthanum is doped into the PZT, or other metal oxide ferroelectrics may be used as the material of the ferroelectric film 122.

After that, an iridium oxide film is formed as a second conductive film 123 with the thickness of 200 nm on the ferroelectric film 122 by the sputtering method.

Subsequently, to recover damages received in the ferroelectric film 122 at the time when the second conductive film 123 is formed, recovery annealing is carried out in a furnace with an atmosphere containing oxygen, under conditions with the substrate temperature of 500° C. and a processing time of 60 minutes.

Figure 14J:
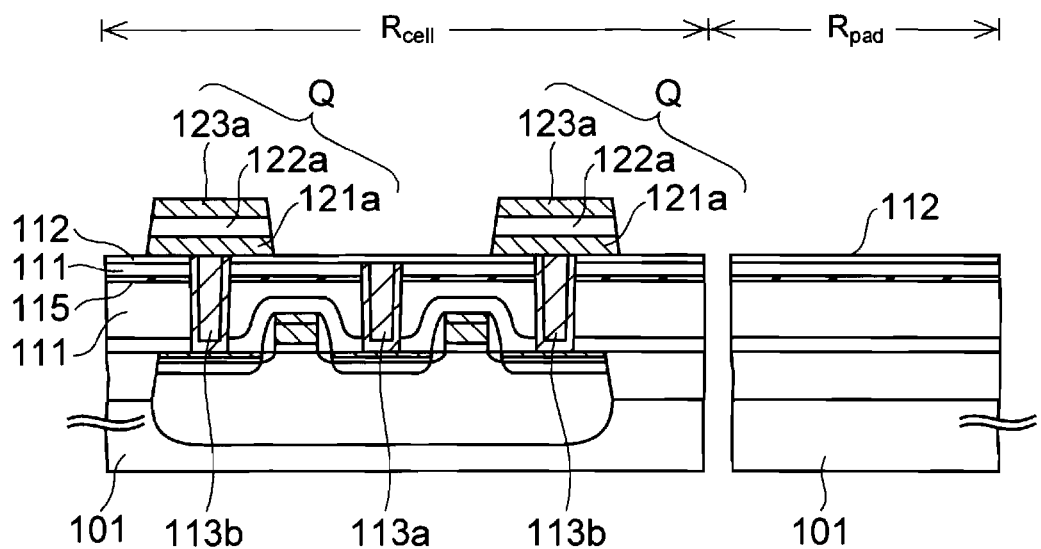

Next, as shown in FIG. 14J, while a hard mask (not shown) in a shape of a capacitor upper electrode is used as an etching mask, the first conductive film 121, the ferroelectric film 122, and the second conductive film 123 are simultaneously dry-etched. Thereby, capacitors Q, in each of which a lower electrode 121a, a capacitor dielectric film 122a, and an upper electrode 123a are laminated in this order, are formed. The dry etching uses, for example, an etching gas including a halogen gas.

Figure 14K:
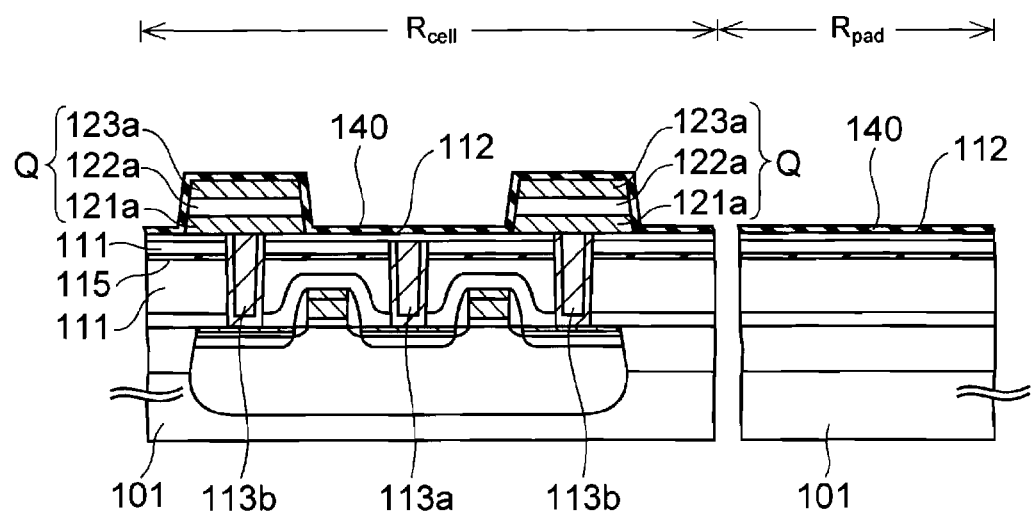

Next, as shown in FIG. 14K, an alumina film is formed with the thickness of approximately 20 nm on the entire upper surface of the silicon substrate 101 by an atomic layer deposition (ALD) method using a mixed gas of, for example, trimethyl aluminum (TMA) and $O_3$. The alumina film thus formed is used as a first capacitor protective insulating film 140.

This first capacitor protective insulating film 140 has a function to prevent, by blocking a reductant such as hydrogen, the capacitor dielectric films 122a from being deteriorated due to reduction.

After that, the recovery annealing is carried out for recovering damages received in the capacitor dielectric films 122a during the manufacturing processes so far. The recovery annealing is carried out in a furnace of the atmosphere containing oxygen at the substrate temperature of about 560° C.

Figure 14L:
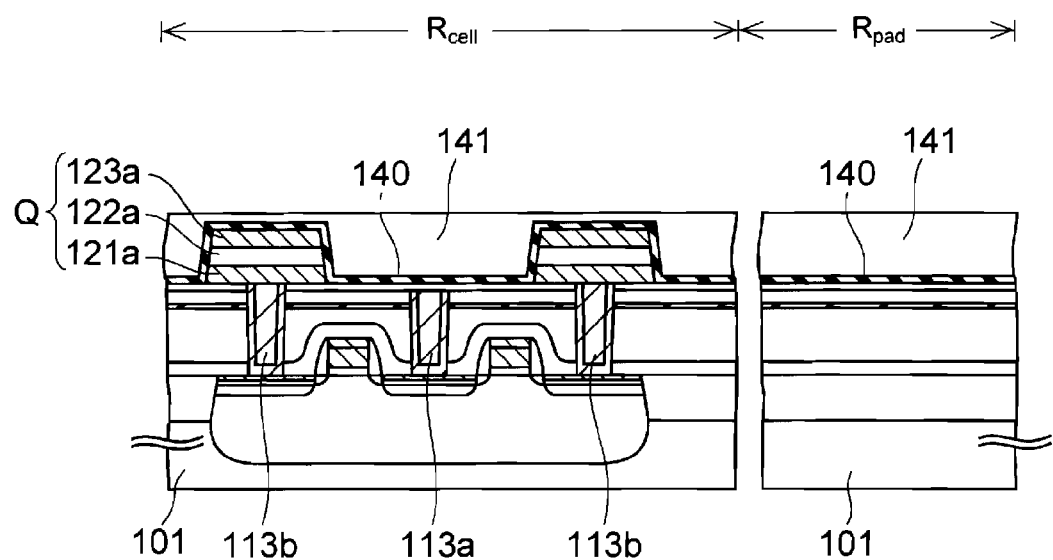

Next, as shown in FIG. 14L, a silicon oxide film is formed as a second insulating film 141 on the first capacitor protective insulating film 140 by, for example, the plasma CVD method using the TEOS gas.

After that, the upper surface of the second insulating film 141 is polished and planarized by the CMP method. With this CMP method, the thickness of the second insulating film 141 is made to be approximately 300 nm on the upper electrodes 123a.

Figure 14M:
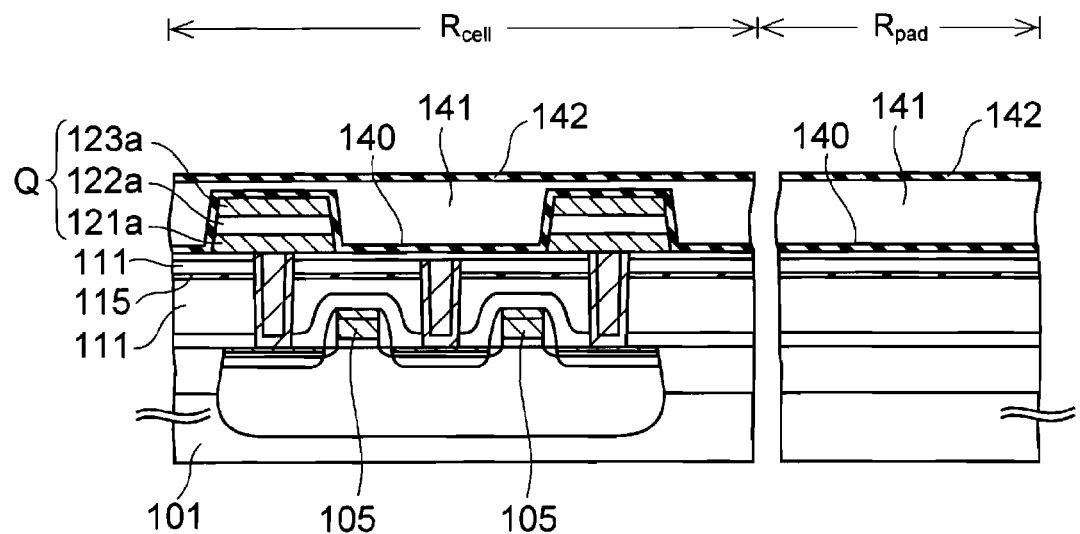

Next, as shown in FIG. 14M, an alumina film is formed with the thickness of approximately 40 nm on the second insulating film 141 by the sputtering method, as a second capacitor protective insulating film 142 for protecting the capacitor dielectric film 122a from reductants.

Note that the second insulating film 141 may be dehydrated by carrying out the $N_2O$ plasma processing on the second insulating film 141 before the second capacitor protective insulating film 142 is formed.

Figure 14N:
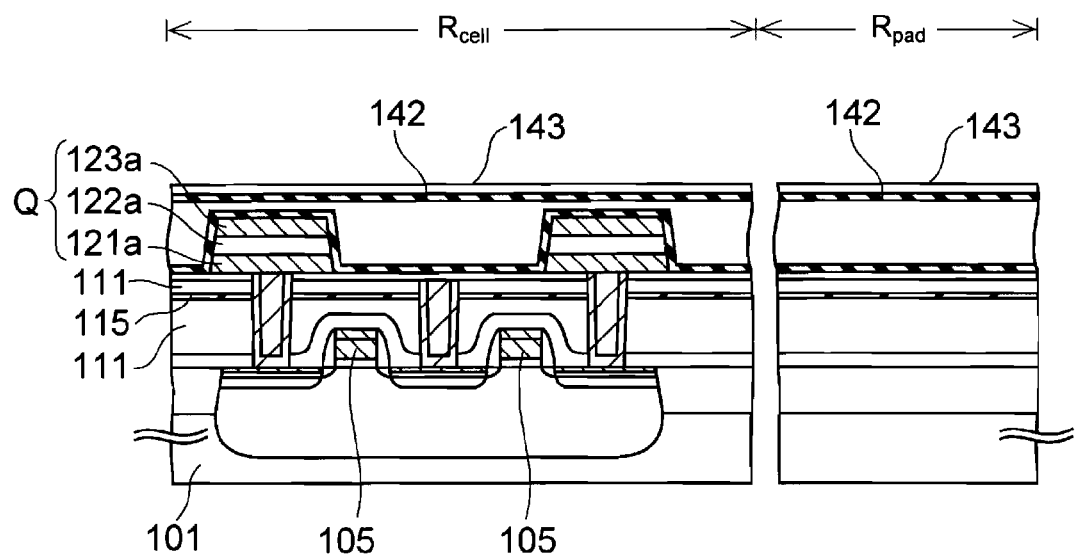

Next, as shown in FIG. 14N, a silicon oxide film is formed as a first cover insulating film 143 on the second capacitor protective insulating film 142 by the plasma CVD method using the TEOS gas.

Figure 14O:
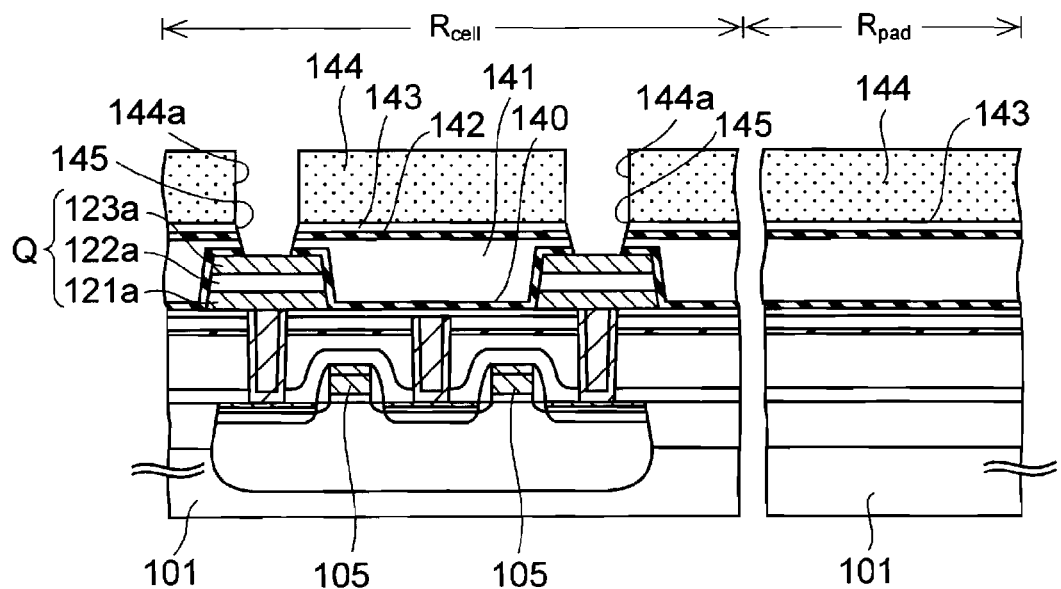

Next, processes for obtaining a cross-sectional structure shown in FIG. 14O will be described.

Firstly, a photoresist is coated on the first cover insulating film 143. The coated photoresist is then exposed and developed to form a third resist pattern 144 provided with hole-shaped third windows 144a on the upper electrodes 123a.

After that, the insulating films 140 to 143 are etched through the third windows 144a to form third holes 145 with the depths reaching the upper electrodes 123a in these insulating films. The conditions for this etching are not particularly limited. In the present embodiment, the etching is carried out by using a parallel plate-type plasma etching chamber (not shown) and the mixed gas of $C_4F_8$, Ar, and $O_2$ as an etching gas.

Subsequently, after the third resist pattern 144 is removed, in order to recover damages received in the capacitor dielectric films 122a during the manufacturing processes so far, the silicon substrate 101 is placed in the unillustrated furnace, and the recovery annealing is carried out in the atmosphere containing oxygen at the substrate temperature of 550° C. for approximately 40 minutes.

Figure 14P:
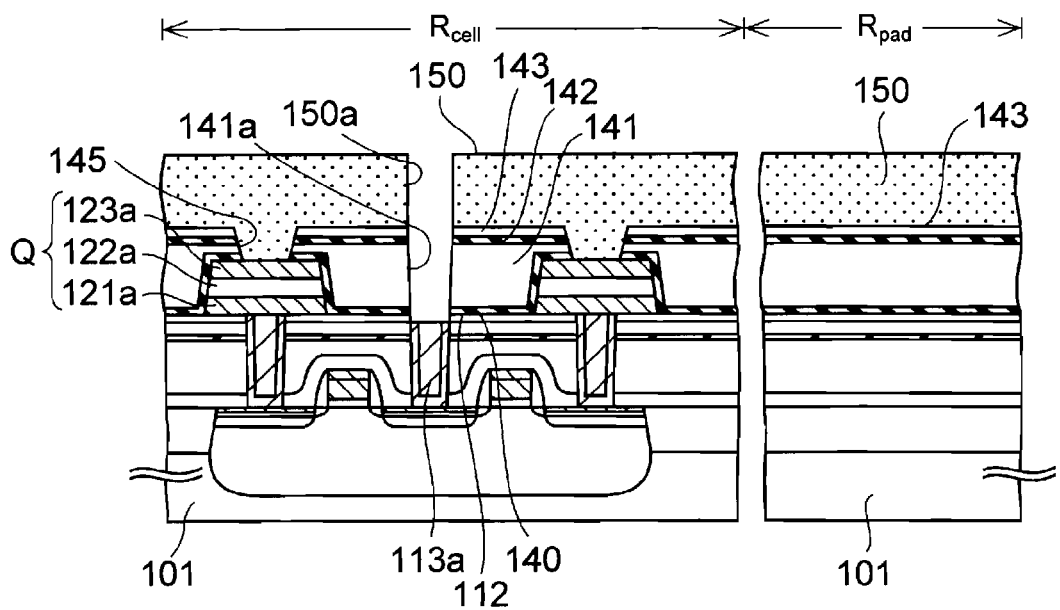
Figure 14Q:
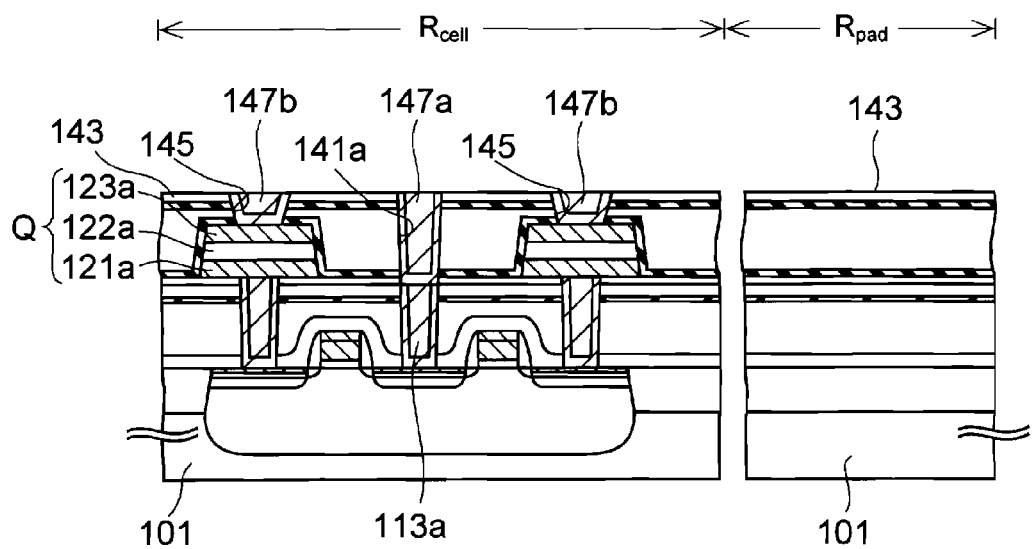
Figure 14R:
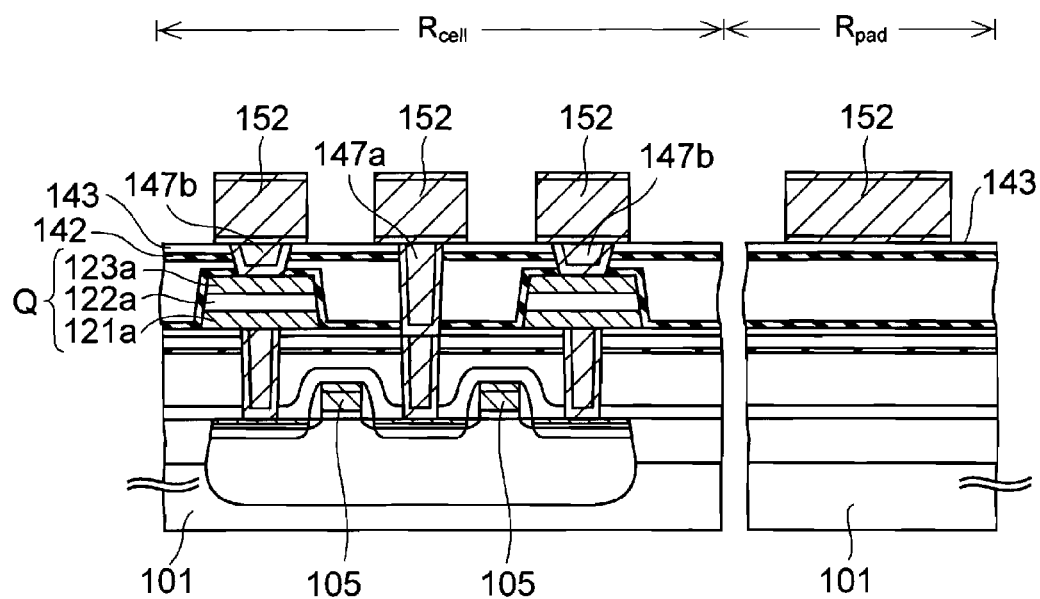

Next, as shown in FIG. 14P, a fourth resist pattern 150 is formed on the entire upper surface of the silicon substrate 101. The formed fourth resist pattern 150 has a hole-shaped fourth window 150a on the first conductive plug 113a.

Subsequently, the insulating films 112, and 140 to 143 are each etched through the fourth window 150a to form a fourth hole 141a in which the first conductive plug 113a is exposed. Such etching is carried out, for example, in the parallel plate-type plasma etching chamber by using the mixed gas of $C_4F_8$, Ar, and $O_2$ as an etching gas.

Here, the first conductive plug 113a is covered with the oxidation prevention insulating film 112 until this etching is carried out. Hence, contact defect due to the oxidation is less likely to occur in the first conductive plug 113a, because the first conductive plug 113a is isolated from the atmosphere containing oxygen during the manufacturing processes by the oxidation prevention insulating film 112 so far.

The fourth resist pattern 150 is removed after this etching is finished.

Next, processes for obtaining a cross-sectional structure shown in FIG. 14Q will be described.

Firstly, a titanium nitride film is formed as a glue film with the thickness of approximately 50 nm on each of the upper surface of the first cover insulating film 143 and the inner surfaces of the third and fourth holes 145 and 141a by the sputtering method. Thereafter, a tungsten film is formed on this glue film with the thickness sufficient to embed the third and fourth holes 145 and 141a. The thickness of the tungsten film is 300 nm on the planarized surface of the first cover insulating film 143, for example.

After that, the excessive glue film and tungsten film on the first cover insulating film 143 are polished and removed by the CMP method to leave these films in the third and fourth holes 145 and 141a as third and fourth conductive plugs 147b and 147a, respectively.

Among these conductive plugs, the fourth conductive plug 147a is electrically connected to the first conductive plug 113a, and constructs a part of a bit line together with the first conductive plug 113a. On the other hand, the third conductive plugs 147b are electrically connected to the upper electrodes 123a.

Next, processes for obtaining a cross-sectional structure shown in FIG. 14R will be described.

Firstly, a metal laminated film is formed on each of the upper surfaces of the first cover insulating film 143 and the third and fourth conductive plugs 147b and 147a by the sputtering method. The metal laminated film is formed by laminating a titanium nitride film with the thickness of approximately 50 nm, an aluminum film with the thickness of approximately 360 nm, and a titanium nitride film with the thickness of approximately 70 nm in this order.

Subsequently, this metal laminated film is patterned by photolithography to form first metal wirings 152, each of which is electrically connected to each of the third and fourth conductive plugs 147b and 147a.

Here, during the patterning of the metal laminated film, over-etching is carried out so as not to leave etching residues of the metal laminate film on the first cover insulating film 143. Since the first capacitor protective insulating film 142 is covered with the first cover insulating film 143, the first capacitor protective insulating film 142 is not etched even when such a over-etching is carried out. Therefore, the thickness of the first capacitor protective insulating film 142 does not decrease even after the patterning of the metal laminated film is finished, and thus the capability of preventing the reductant of the first capacitor prevention insulating film 142 can be sufficiently maintained.

Figure 14S:
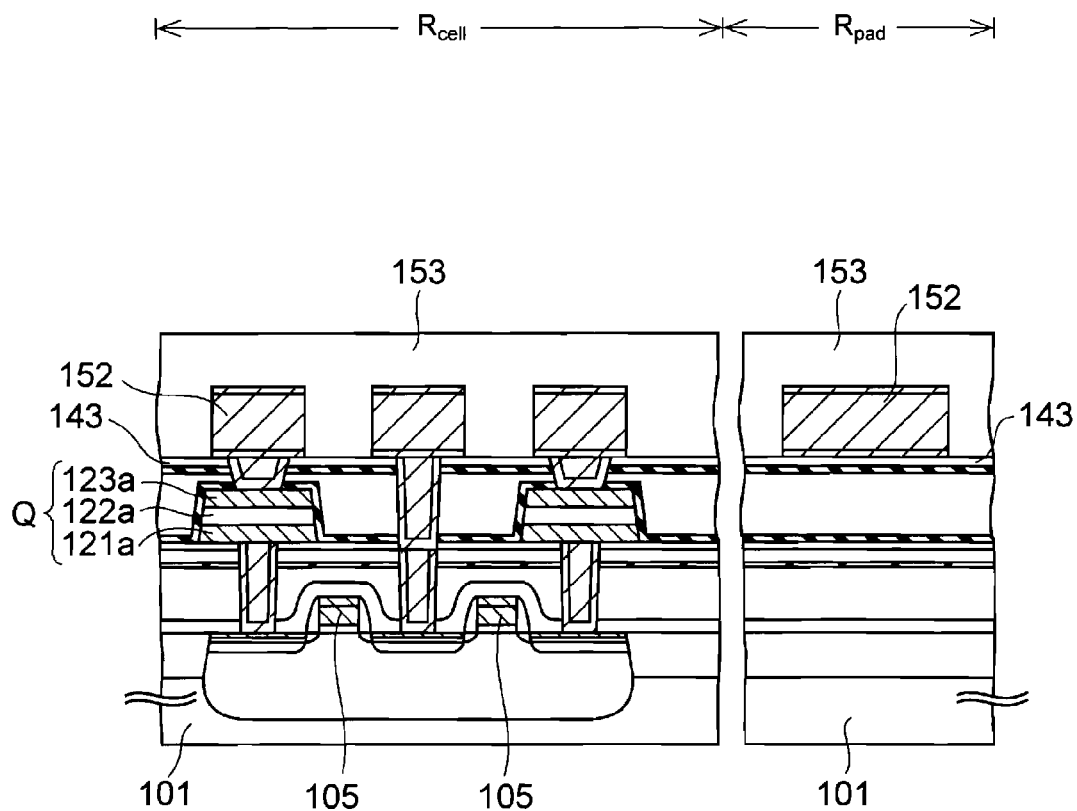

Next, as shown in FIG. 14S, a silicon oxide film is formed on each of the first cover insulating film 143 and the first metal wirings 152 as a third insulating film 153 by the plasma CVD method. This plasma CVD method uses the TEOS gas as a reaction gas. The thickness of the third insulating film 153 on the first metal wirings 152 is set to approximately 2600 nm.

Subsequently, $N_2O$ plasma processing is carried out on the surface of the third insulating film 153 after the upper surface of the third insulating film 153 is polished and planarized by the CMP method. Thereby, the third insulating film 153 is dehydrated, and the surface thereof is nitrided to prevent moisture from being absorbed again. This $N_2O$ plasma processing is carried out in CVD equipment at the substrate temperature of approximately 350° C. for a processing time of approximately 4 minutes.

Figure 14T:
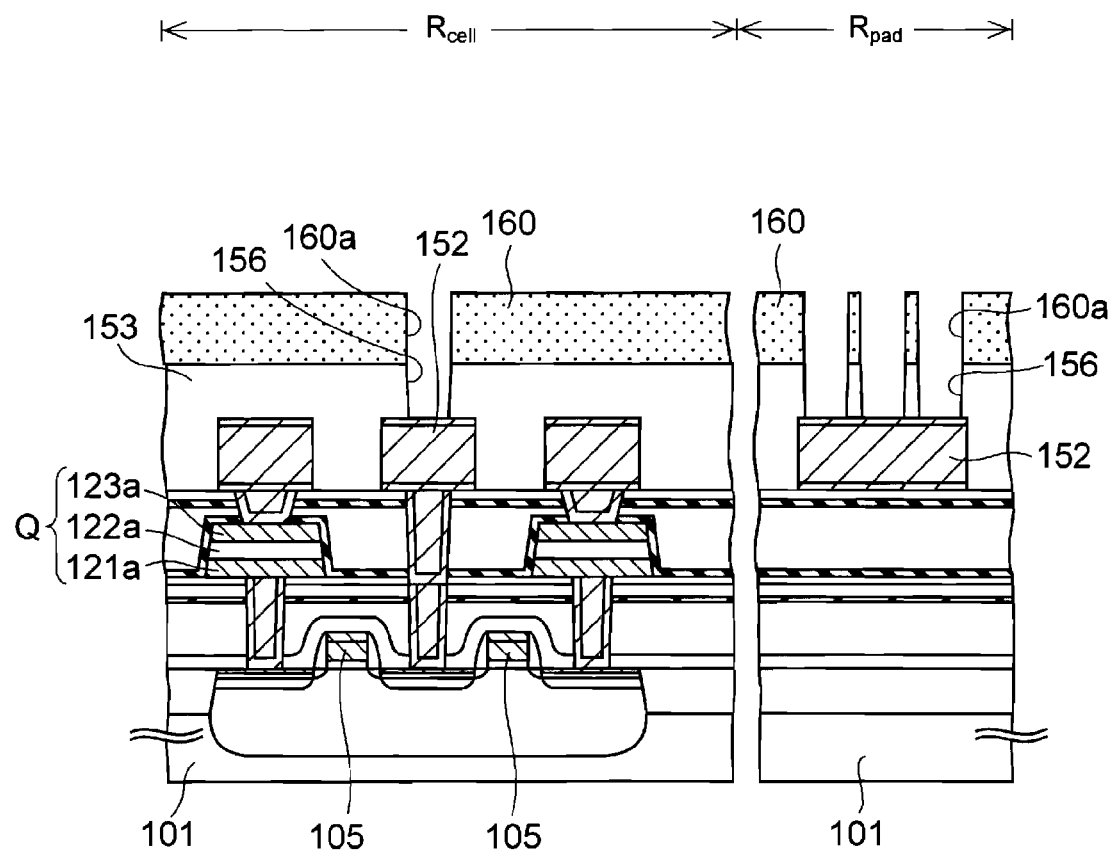

Next, as shown in FIG. 14T, a fifth resist pattern 160 having fifth windows 160a over the first metal wirings 152 is formed on the third insulating film 153.

Subsequently, the third insulating film 153 is dry-etched through the fifth windows 160a to form fifth holes 156 in the third insulating film 153 on the first metal wirings 152. The conditions for the dry etching are not particularly limited. In the present embodiment, the dry etching is carried out by using a parallel plate-type plasma etching chamber (not shown) and the mixed gas of $C_4F_8$, Ar, and $O_2$ as an etching gas.

The fifth resist pattern 160 is removed after this etching is finished.

Figure 14U:
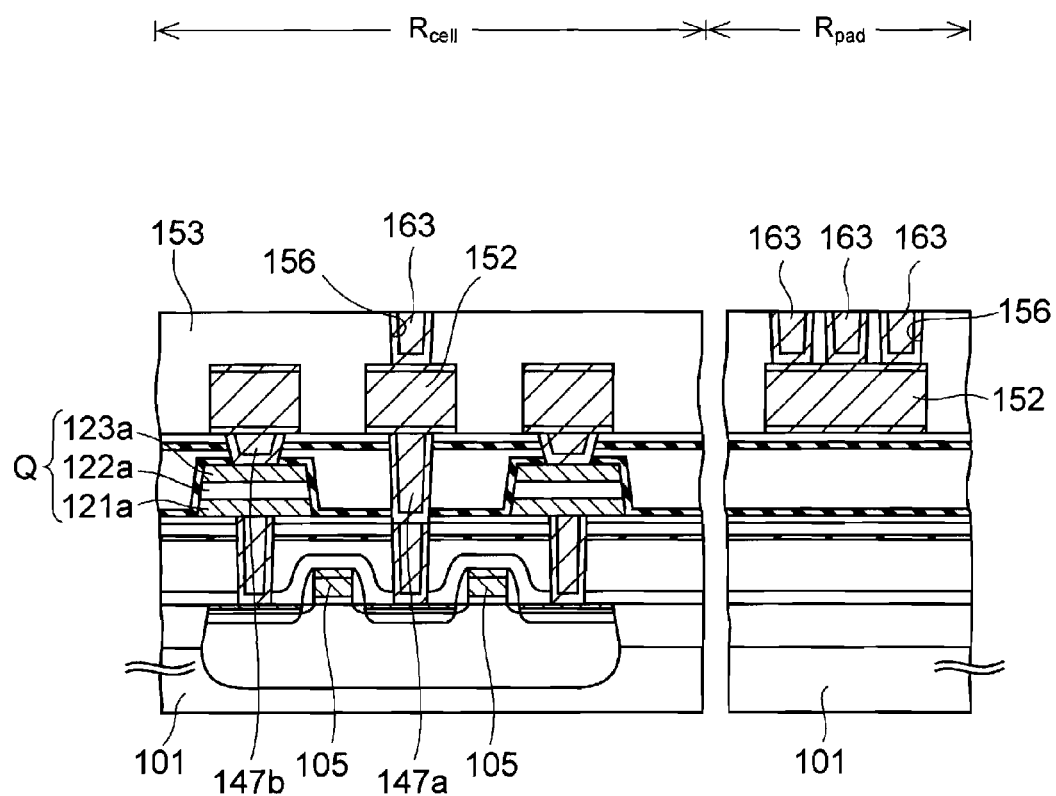

Next, as shown in FIG. 14U, by using the same method as that for forming the third and fourth conductive plugs 147b and 147a, fifth conductive plugs 163, which are electrically connected to the first metal wirings 152, are formed in the fifth holes 156.

Figure 14V:
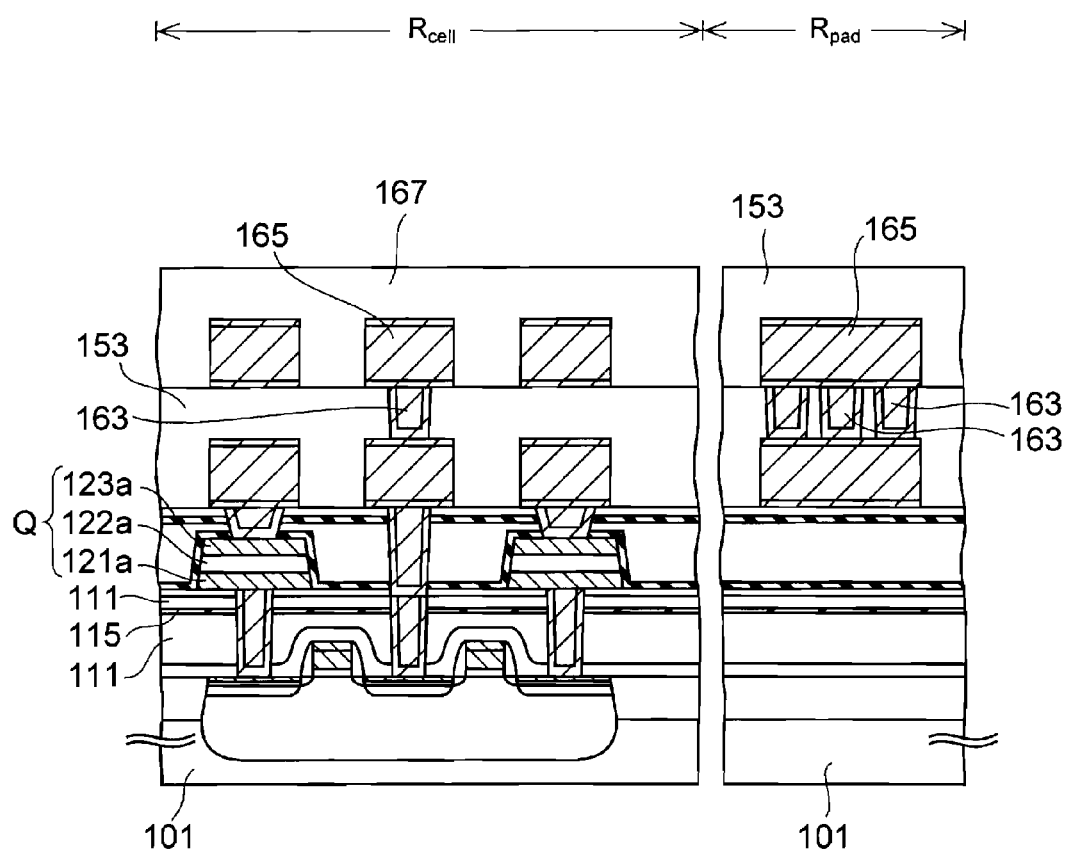

Next, as shown in FIG. 14V, a metal laminated film is formed on each of the fifth conductive plugs 163 and the third insulating film 153 by the sputtering method. Then the metal laminated film is patterned into second metal wirings 165. In the present embodiment, the metal laminated film is formed by stacking a titanium film with the thickness of approximately 60 nm, a titanium nitride film with the thickness of approximately 30 nm, a copper-containing aluminum film with the thickness of approximately 400 nm, a titanium film with the thickness of approximately 5 nm, and a titanium nitride film with the thickness of approximately 70 nm in this order.

Furthermore, a silicon oxide film is formed as a fourth insulating film 167 on each of the third insulating film 153 and the second metal wirings 165 by the plasma CVD method using the TEOS gas.

After that, the upper surface of the fourth insulating film 167 is polished and planarized by the CMP method.

Note that $N_2O$ plasma processing may be carried out as dehydration processing on the fourth insulating film 167 after the CMP.

Figure 14W:
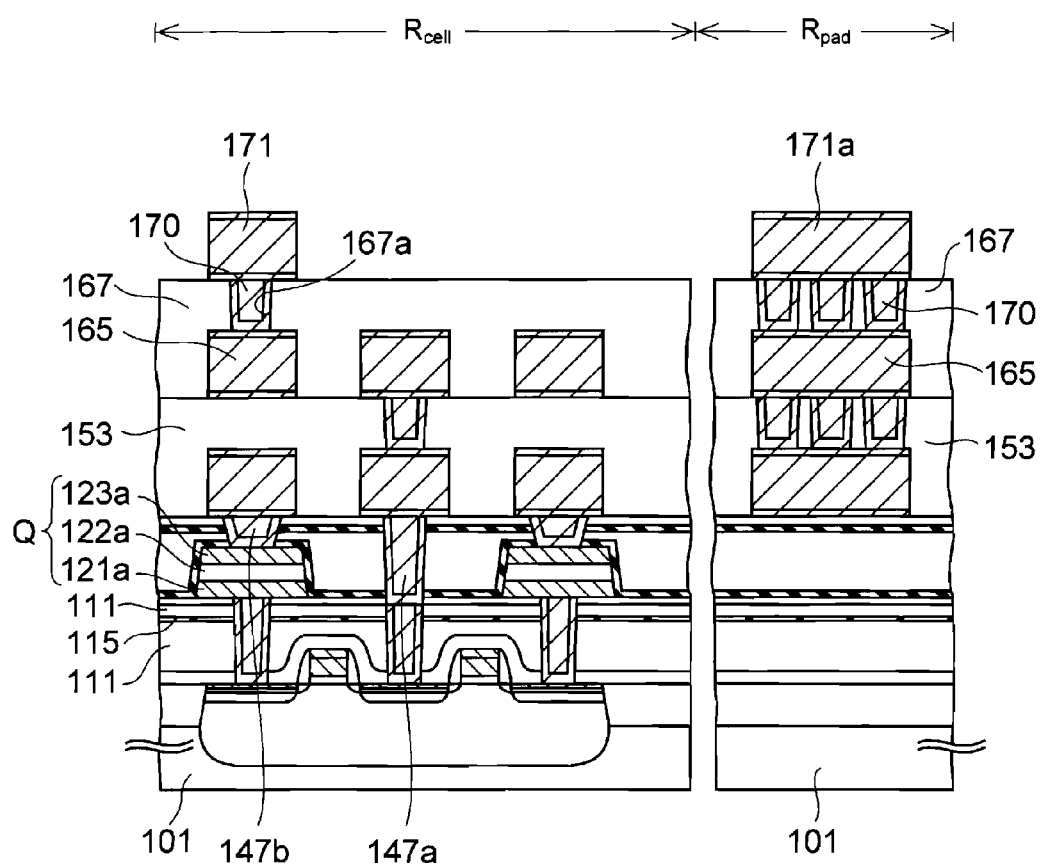
Figure 14X:
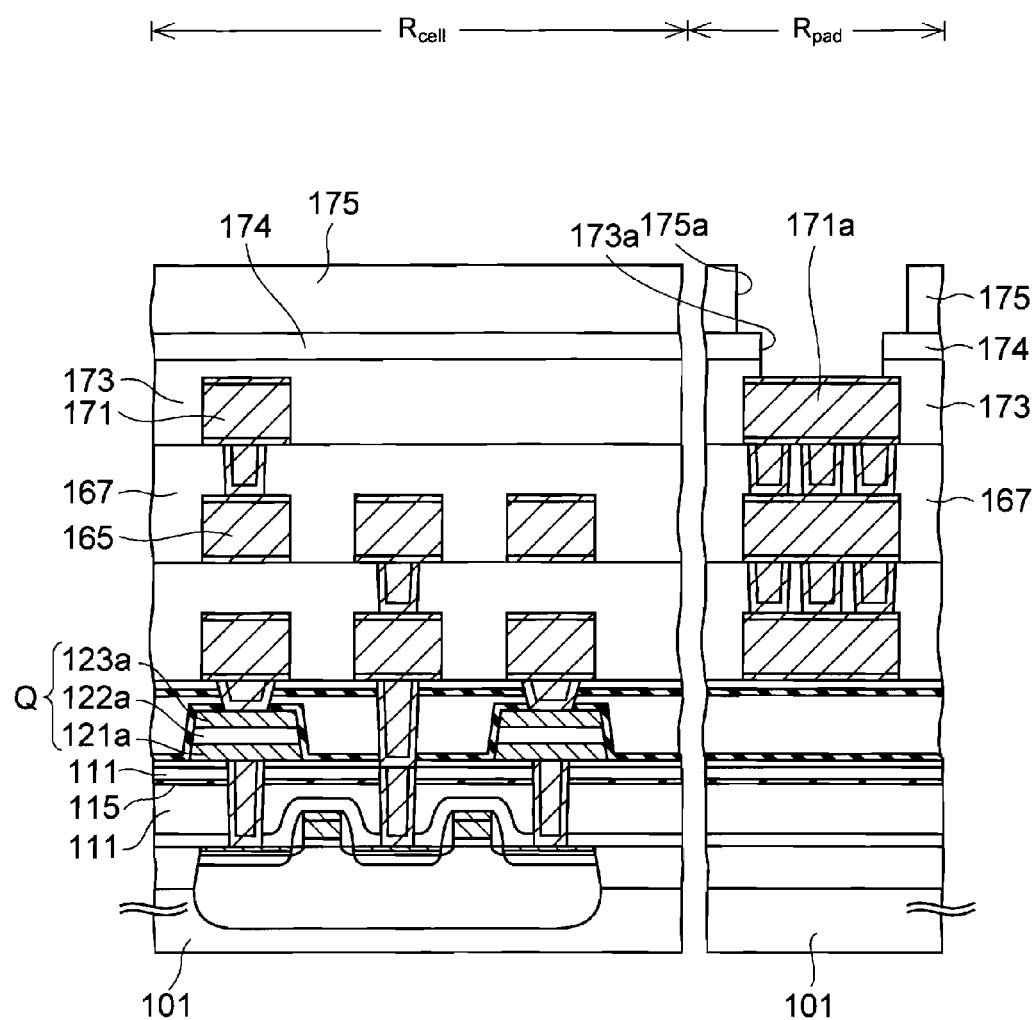

Next, as shown in FIG. 14W, a sixth hole 167a is formed on the second metal wiring 165 by selectively etching the fourth insulating film 167.

Subsequently, by using a similar method to those for forming the third and fourth conductive plugs 147b and 147a, sixth conductive plugs 170, which are electrically connected to the second metal wirings 165, are formed.

Furthermore, a metal laminated film is formed on each of the upper surfaces of the sixth conductive plugs 170 and the fourth insulating film 167 by the sputtering method, and thereafter the formed metal laminated film is patterned by photolithography. Thereby, a third metal wiring 171 is formed in a cell region $R_{cell}$, and a bonding pad 171a is formed in a pad region $R_{pad}$.

Next, processes for obtaining a cross-sectional structure shown in FIG. 14X will be described.

Firstly, a silicon oxide film is formed as a first passivation film 173 with the thickness of approximately 100 nm on each of the fourth insulating film 167 and the third metal wiring 171 by the CVD method.

Note that $N_2O$ plasma processing may be carried out on the first passivation film 173 in order to dehydrate the first passivation film 173 and to prevent moisture from being absorbed again.

Furthermore, a silicon nitride film is formed as a second passivation film 174 with the thickness of approximately 350 nm on this first passivation film 173 by the CVD method.

After that, a seventh hole 173a, in which the bonding pad 171a in the pad region $R_{pad}$ is exposed, is formed by selectively dry-etching the first and second passivation films 173 and 174.

Subsequently, photosensitive polyimide is formed with the thickness of approximately 3 μm on the entire upper surface of the silicon substrate 101 to form a protective layer 175 made of a polyimide coating film.

Then, the protective layer 175 is exposed and developed to form an eighth hole 175a, in which the bonding pad 171a is exposed, in the protective layer 175. After that, the protective layer 175 is thermally cured under conditions with the substrate temperature of 310° C., the $N_2$ flow rate of 100 liters per minute, and a processing time of 40 minutes.

With this, a basic structure of the semiconductor device according to the present embodiment is completed.

In the above-described present embodiment, as described by referring to FIGS. 14C and 14D, similar to the first embodiment, the impurity layer 114 formed by ion-implanting nitrogen is annealed to cause nitrogen contained in the layer 114 to react with silicon contained in the first insulating film 111. Thereby, a barrier insulating film 115 containing silicon nitride with excellent barrier performance against moisture is formed.

The barrier insulating film 115 is mainly made of silicon nitride as described above. Thus, the barrier insulating film 115 can easily be etched by chemical reaction, at the step of forming the first hole 111a (FIG. 14E) and the step of forming the second hole 111b (FIG. 14G) by switching the etching gas from that for silicon oxide to that for silicon nitride.

Therefore, the cross-sectional shapes of the holes 111a and 111b are hardly distorted, so that contact resistance between first and second conductive plugs 113a and 113b formed in these holes and conductive patterns, such as the first and second source/drain regions 108a and 108b, is stabilized.

In addition, as described in the first embodiment, the barrier insulating film 115 can be easily formed in the first insulating film 111 by using the ion implantation. Thus, it is not required to form, in the first insulating film 111, a cover insulating film for preventing the barrier insulating film 115 from being thinned, and $N_2O$ plasma processing for dehydrating the cover insulating film can also be omitted.

In the above-described embodiment, the barrier insulating film 115 is formed in the first insulating film 111. However, the forming portion of the barrier insulating film 115 is not limited to this, and the barrier insulating film 115 may be formed in positions like those of following first to ninth modifications of the present invention.

First Modification

Figure 15:
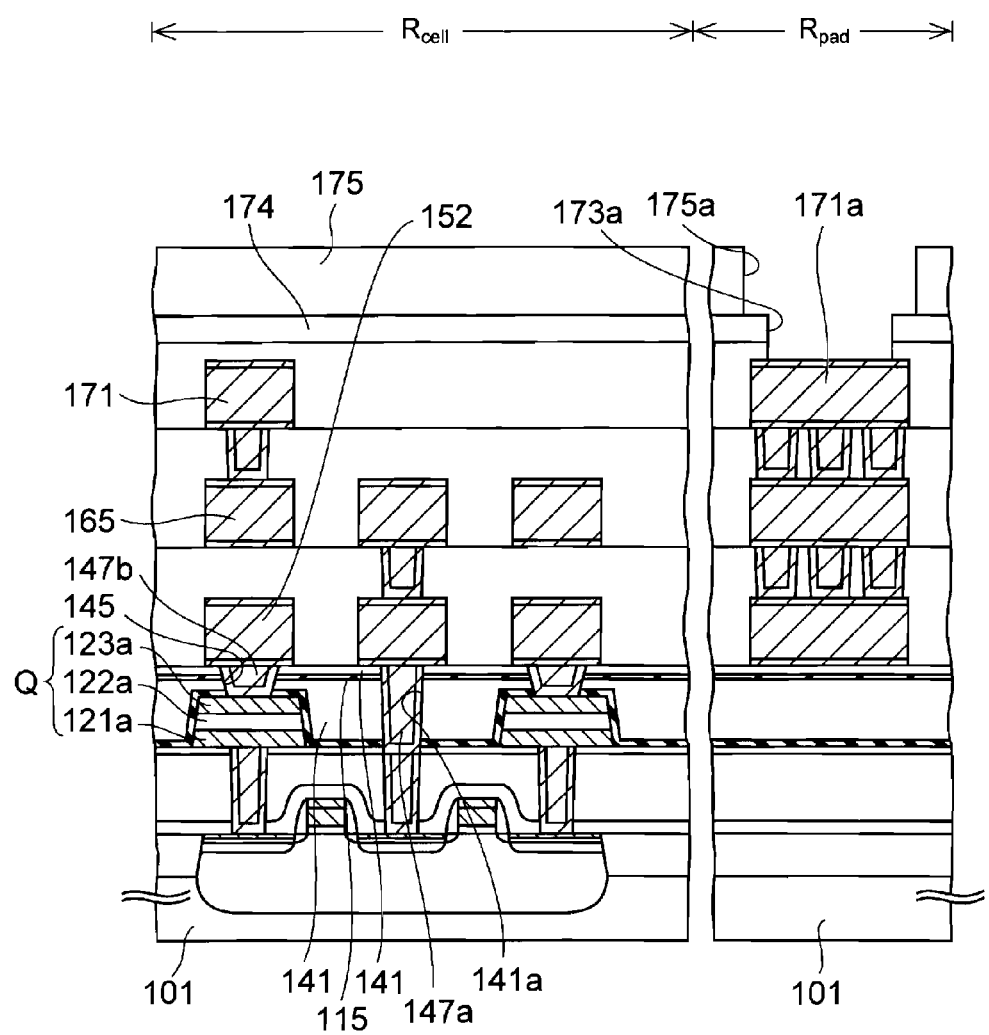
FIG. 15 is a cross-sectional view of a semiconductor device according to a first modification of the fourth embodiment.

FIG. 15 is a cross-sectional view of a semiconductor device according to a first modification of the present embodiment.

In the present modification, a barrier insulating film 115 is formed in a predetermined depth of the second insulating film 141. In this case, the barrier insulating film 115 serves to prevent moisture from penetrating from above a capacitor Q. Thus, the second capacitor protective insulating film 142 (see, FIG. 14M) is unnecessary.

In addition, the barrier insulating film 115 is automatically formed in the predetermined depth of the second insulating film 141 by ion implantation. Accordingly, the first cover insulating film 143 (FIG. 14N) for preventing the barrier insulating film 115 from being thinned at the time when first meal wirings 152 are formed by etching is also unnecessary.

In this manner, in the present modification, the number of manufacturing processes can be reduced.

Second Modification

Figure 16:
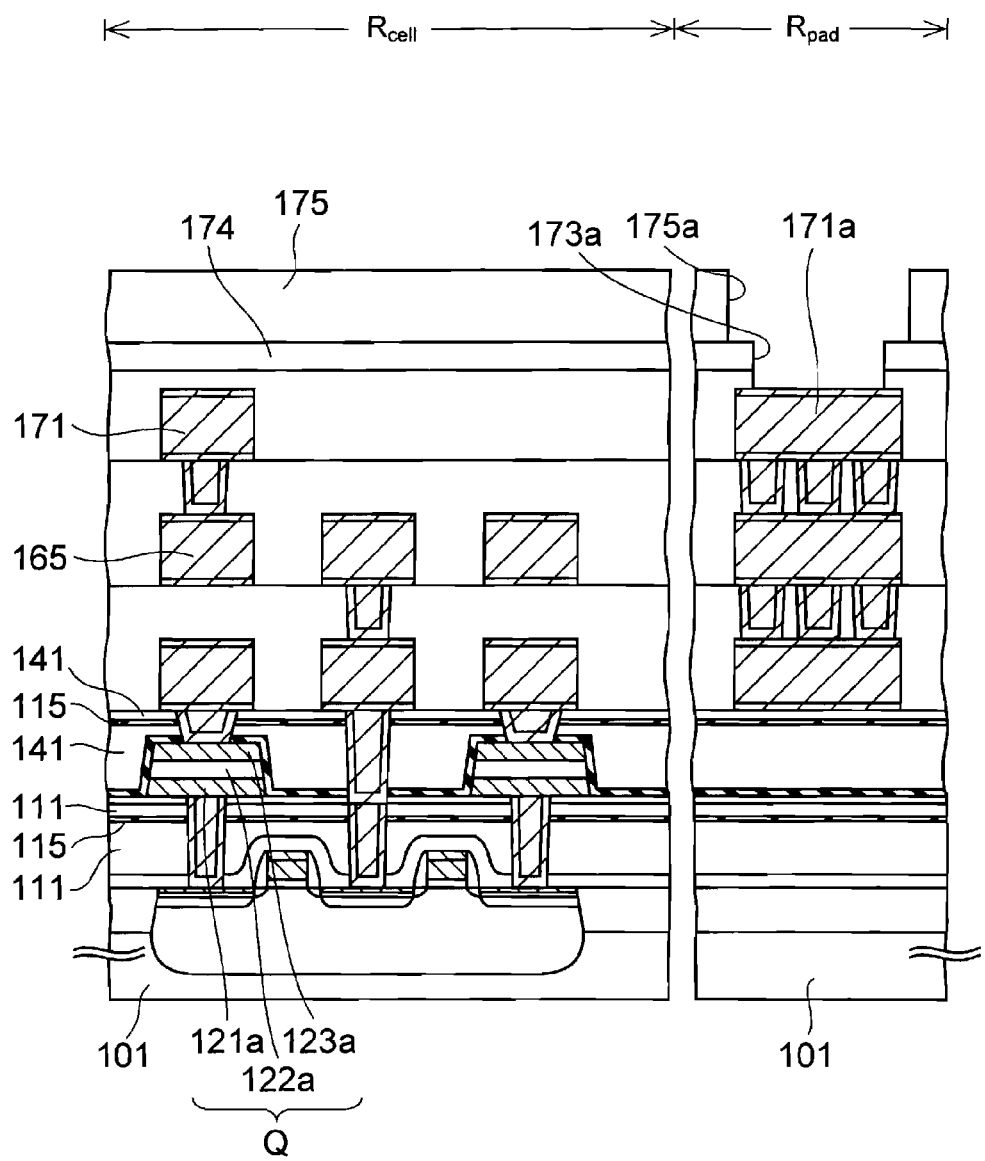
FIG. 16 is a cross-sectional view of a semiconductor device according to a second modification of the fourth embodiment.

FIG. 16 is a cross-sectional view of a semiconductor device according to a second modification of the present embodiment.

In the present modification, the barrier insulating film 115 is formed in each of predetermined depths of both the first and second insulating films 111 and 141. According to this structure, the barrier insulating films 115 protect a capacitor Q from moisture penetrating through penetration paths from above and below the capacitor Q. Accordingly, deterioration of the capacitor Q due to moisture can be effectively prevented.

Third Modification

Figure 17:
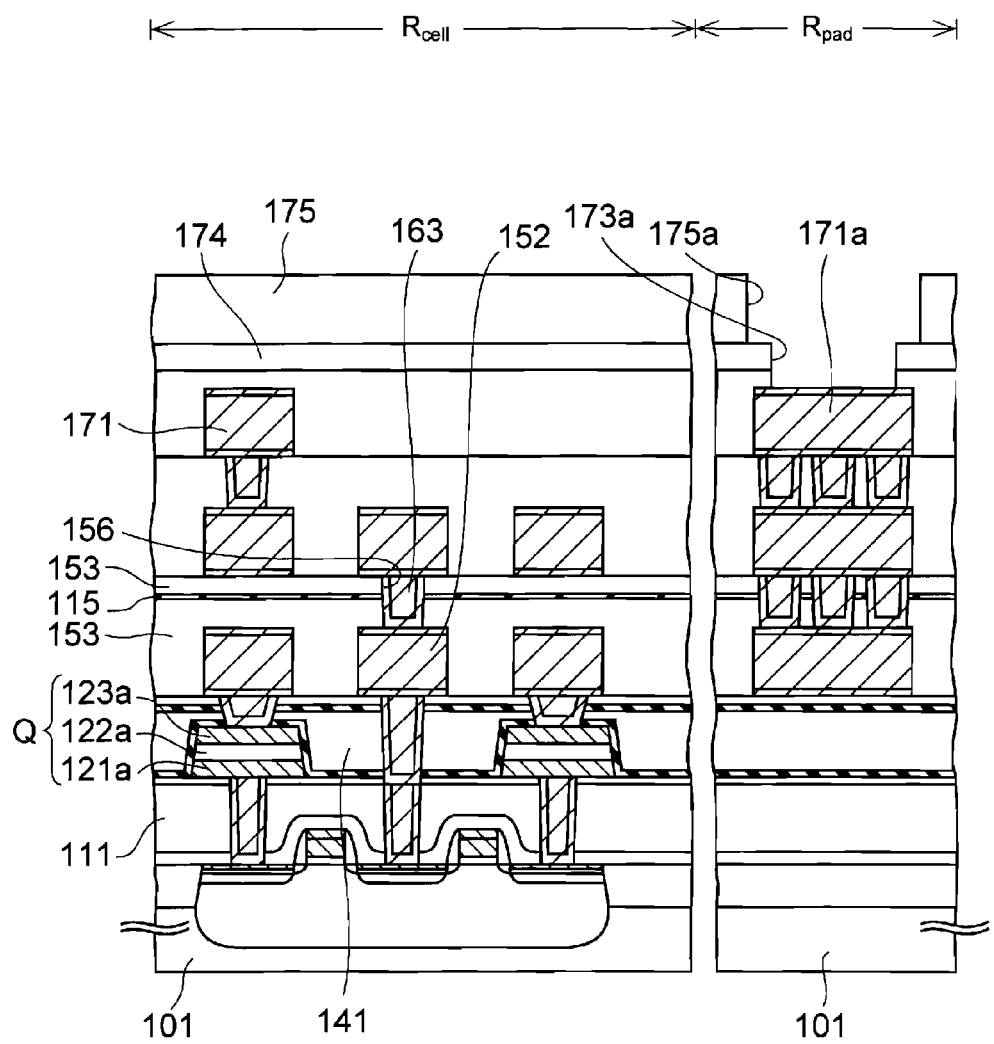
FIG. 17 is a cross-sectional view of a semiconductor device according to a third modification of the fourth embodiment.

FIG. 17 is a cross-sectional view of a semiconductor device according to a third modification of the present modification.

In the present modification, a barrier insulating film 115 is formed in a predetermined depth of the third insulating film 153. The third insulating film 153 is closer to the atmosphere than first and second insulating films 111 and 141. Therefore, the barrier insulating film 115 can protect the semiconductor device from moisture at an early stage of its penetration, so that moisture resistance of the semiconductor device can be easily improved.

Fourth Modification

Figure 18:
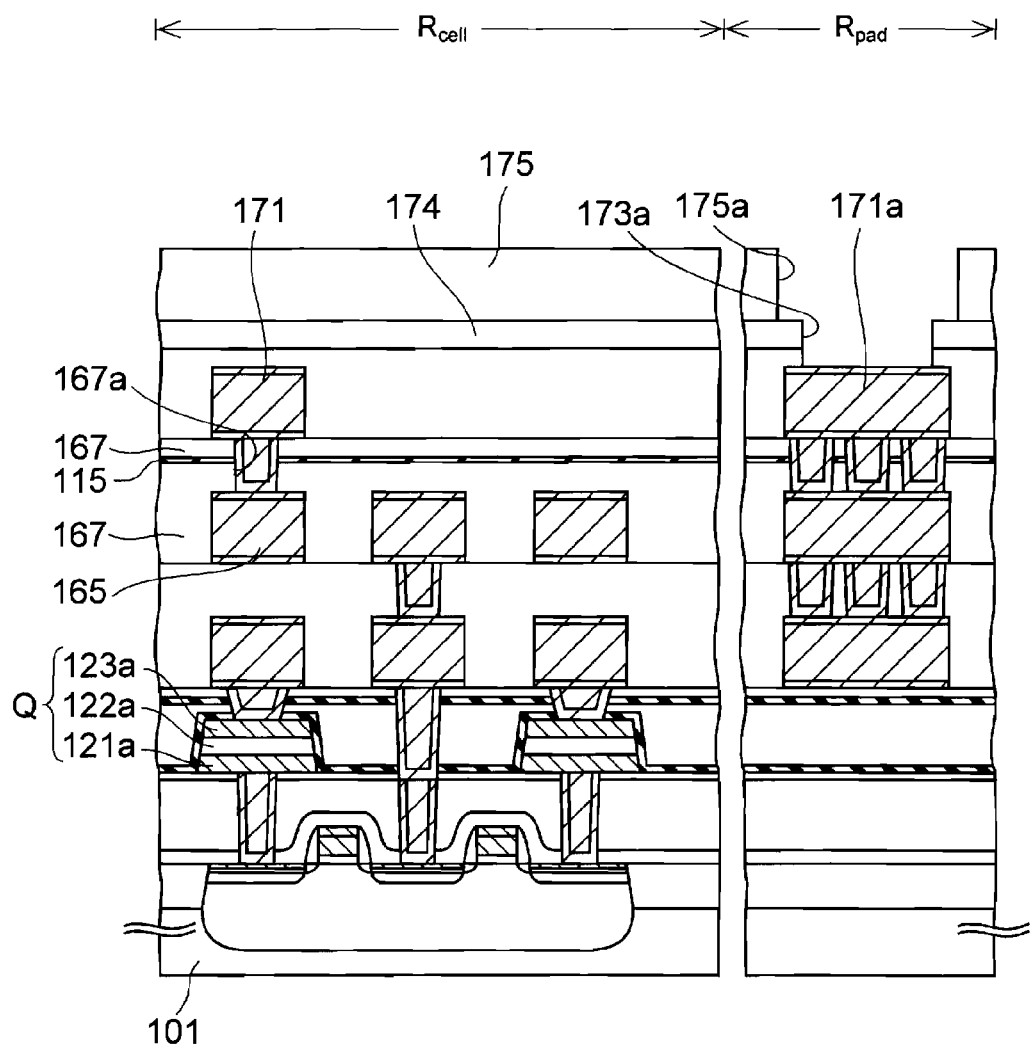
FIG. 18 is a cross-sectional view of a semiconductor device according to a fourth modification of the fourth embodiment.

FIG. 18 is a cross-sectional view of a semiconductor device according to a fourth modification of the present embodiment.

In the present modification, the barrier insulating film 115 is formed in a predetermined depth of a fourth insulting film 167. According to this structure, the barrier insulating film 115 comes closer to the atmosphere than that in the third modification. Thus, it is further easier to improve moisture resistance of the semiconductor device.

Fifth Modification

Figure 19:
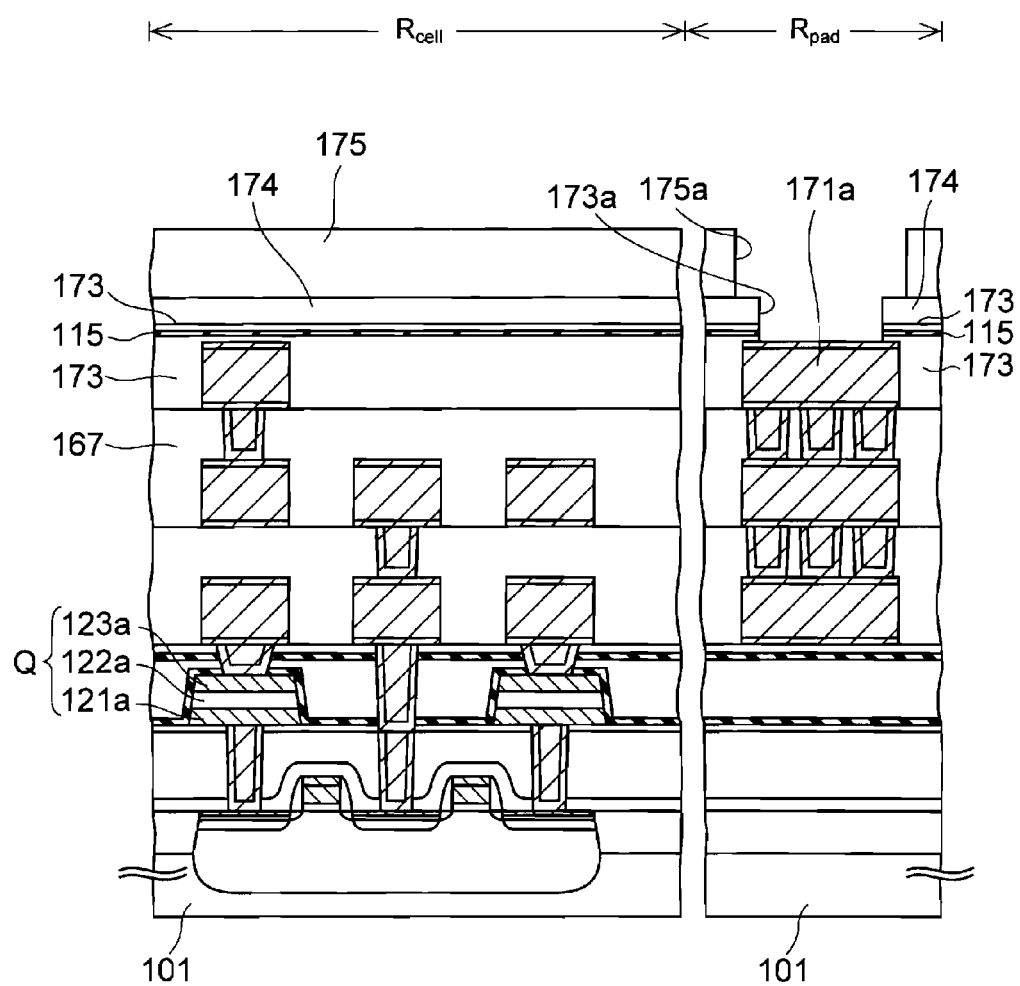
FIG. 19 is a cross-sectional view of a semiconductor device according to a fifth modification of the fourth embodiment.

FIG. 19 is a cross-sectional view of a semiconductor device according to a fifth modification of the present embodiment.

In the present modification, the barrier insulating film 115 is formed in a predetermined depth of a first passivation film 173, which is further closer to the atmosphere than a fourth insulating film 167, so that moisture resistance of the semiconductor device can be further improved.

Sixth Modification

Figure 20:
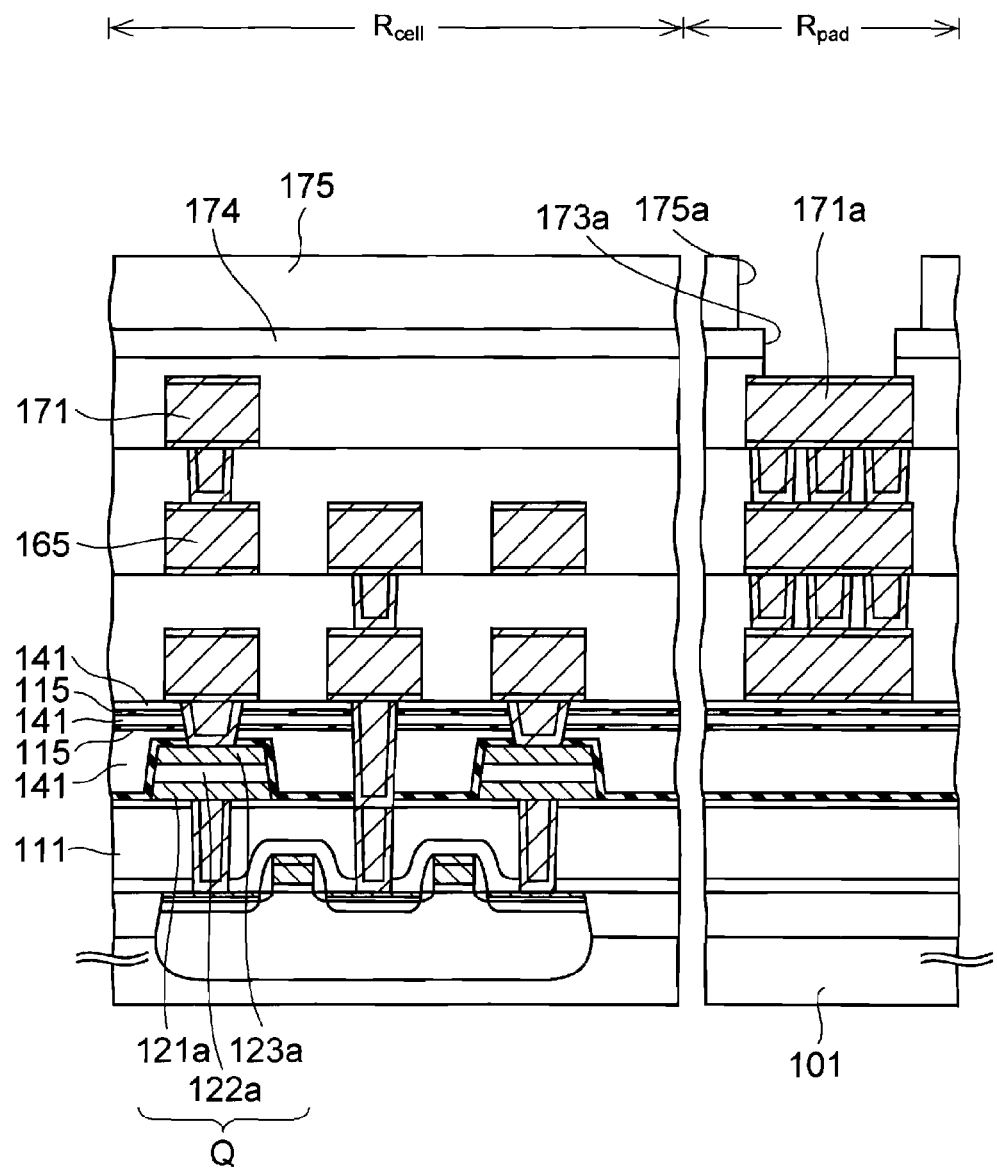
FIG. 20 is a cross-sectional view of a semiconductor device according to a sixth modification of the fourth embodiment.

FIG. 20 is a cross-sectional view of a semiconductor device according to a sixth modification of the present embodiment.

In the present modification, two layers of the barrier insulating films 115 are formed in different depths of second insulating films 141. In order to form two layers of the barrier insulating films 115, ion implantation is carried out twice by changing acceleration energy, and an impurity layer thus formed is annealed to converted into the barrier insulating films, as described by referring to FIGS. 10B and 10C in the second embodiment.

By forming the barrier insulating films 115 in two layers in this manner, moisture resistance of the semiconductor device can be improved when compared with the case where only one barrier insulating film is formed.

Seventh Modification

Figure 21:
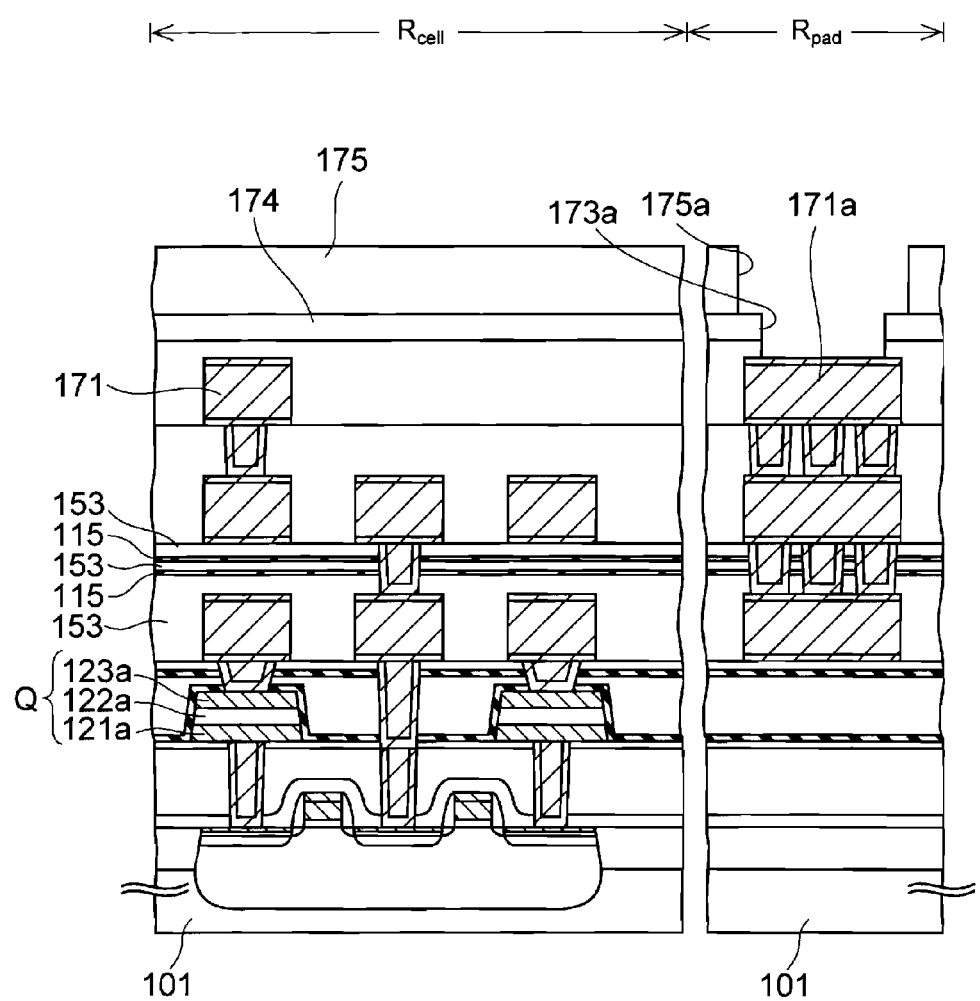
FIG. 21 is a cross-sectional view of a semiconductor device according to a seventh modification of the fourth embodiment.

FIG. 21 is a cross-sectional view of a semiconductor device according to a seventh modification of the present embodiment.

In the present modification, two layers of barrier insulating films 115 are formed in different depths of the third insulating film 153, so that moisture resistance of the semiconductor device is improved like the sixth modification.

Eighth Modification

Figure 22:
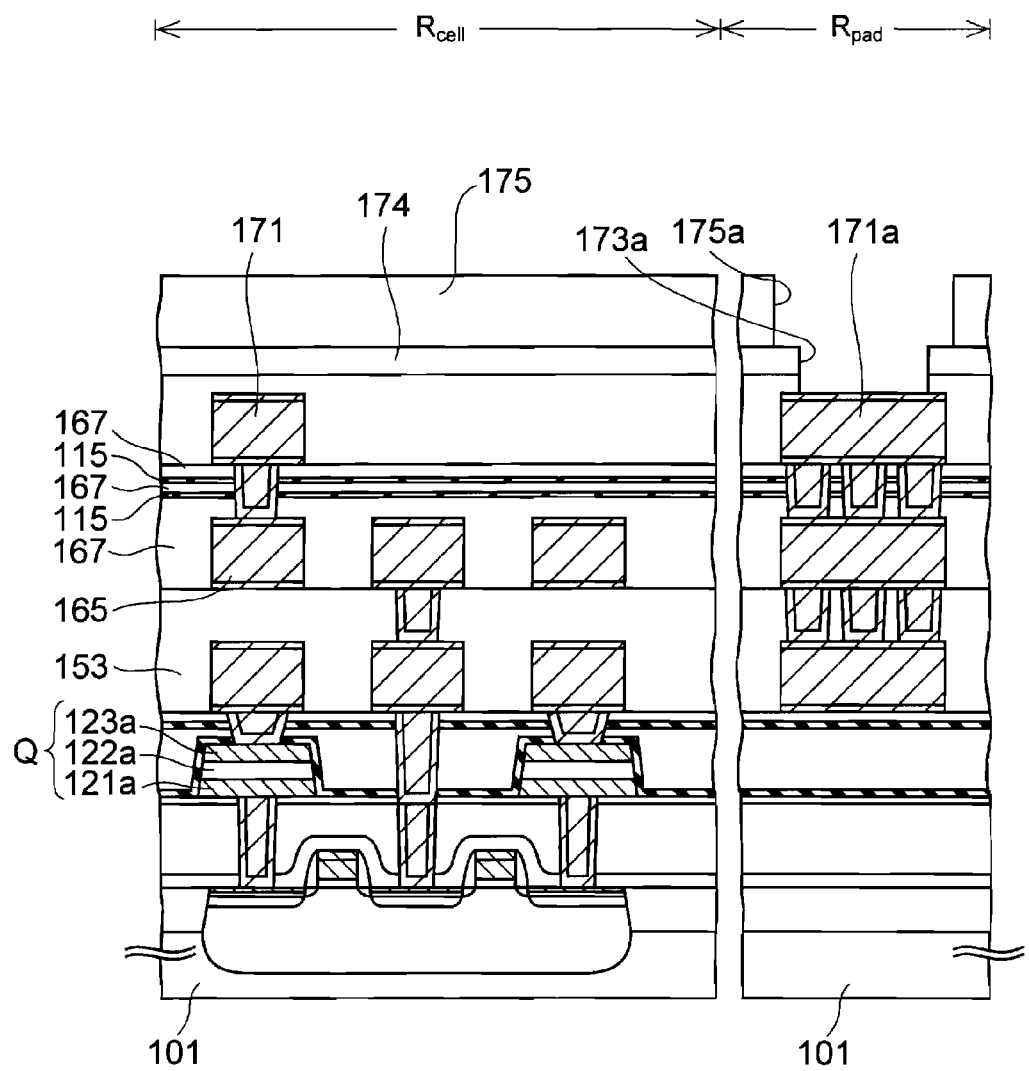
FIG. 22 is a cross-sectional view of a semiconductor device according to an eighth modification of the fourth embodiment.

FIG. 22 is a cross-sectional view of a semiconductor device according to an eighth modification of the present embodiment.

In the present modification, two layers of barrier insulating films 115 are formed in different depths of the fourth insulating film 167, which is closer to the atmosphere than a third insulating film 153. With this, the barrier insulating films 115 protect the semiconductor device from moisture contained in the atmosphere before the moisture penetrates deep in the semiconductor device. Thus, a semiconductor device with excellent moisture resistance can be provided.

Ninth Modification

Figure 23:
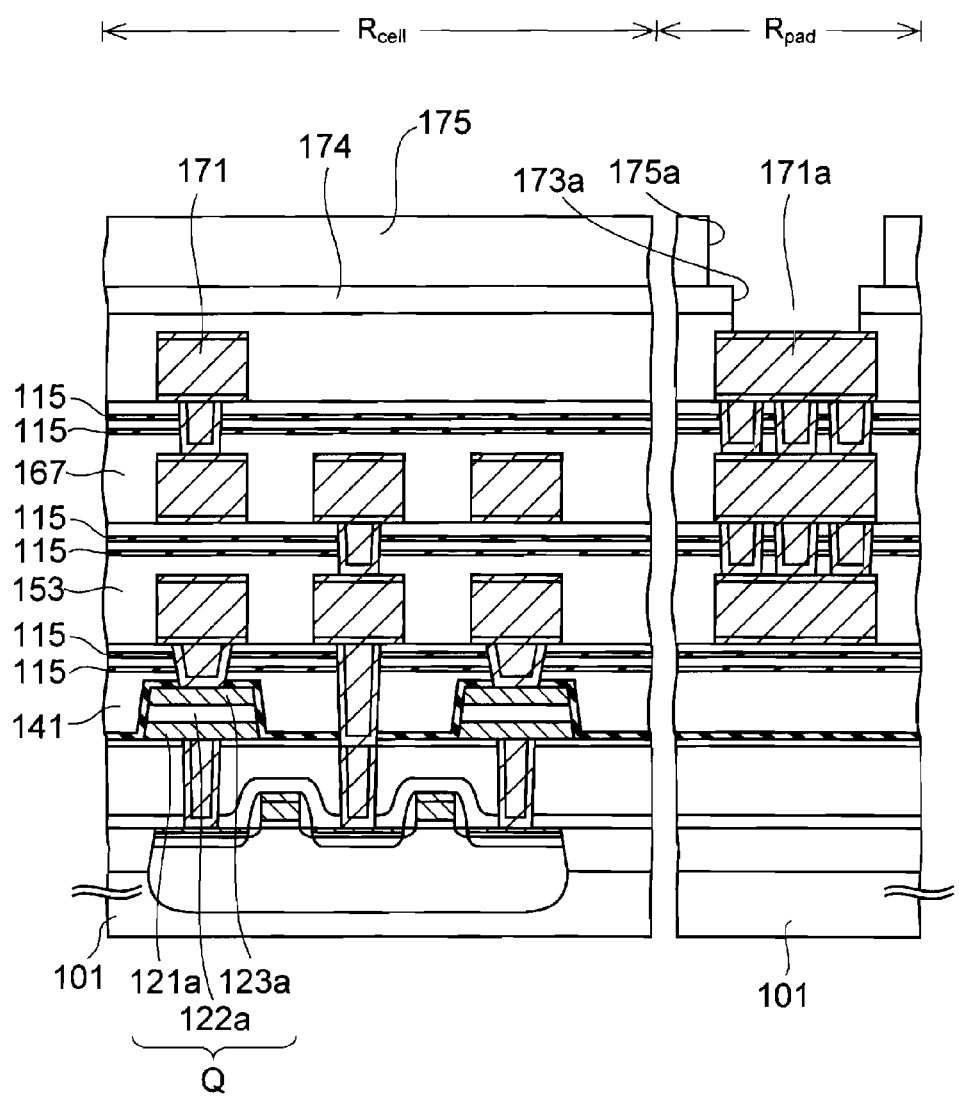
FIG. 23 is a cross-sectional view of a semiconductor device according to a ninth modification of the fourth embodiment.

FIG. 23 is a cross-sectional view of a semiconductor device according to a ninth modification of the present embodiment.

In the present modification, moisture resistance of the semiconductor device is further improved by forming two layers of barrier insulating films 115 in predetermined depths of each of the second to fourth insulating films 141, 153, and 167.

(5) Fifth Embodiment

In the above-described first to fourth embodiments, the impurity-containing insulating film, which is obtained by modifying the impurity layer containing nitrogen and the like by the annealing, is used as a barrier insulating film for a barrier to moisture and the like.

In contrast, in the present embodiment, the impurity-containing insulating film obtained by modifying the impurity layer is used as an etching stopper film for a damascene process as follows.

Note that in the following, the damascene process is applied to the stack-type FeRAM described in the fourth embodiment. However, the present invention is not limited to the FeRAM, but the damascene process may be applied to other semiconductor devices such as logic device.

Figure 24A:
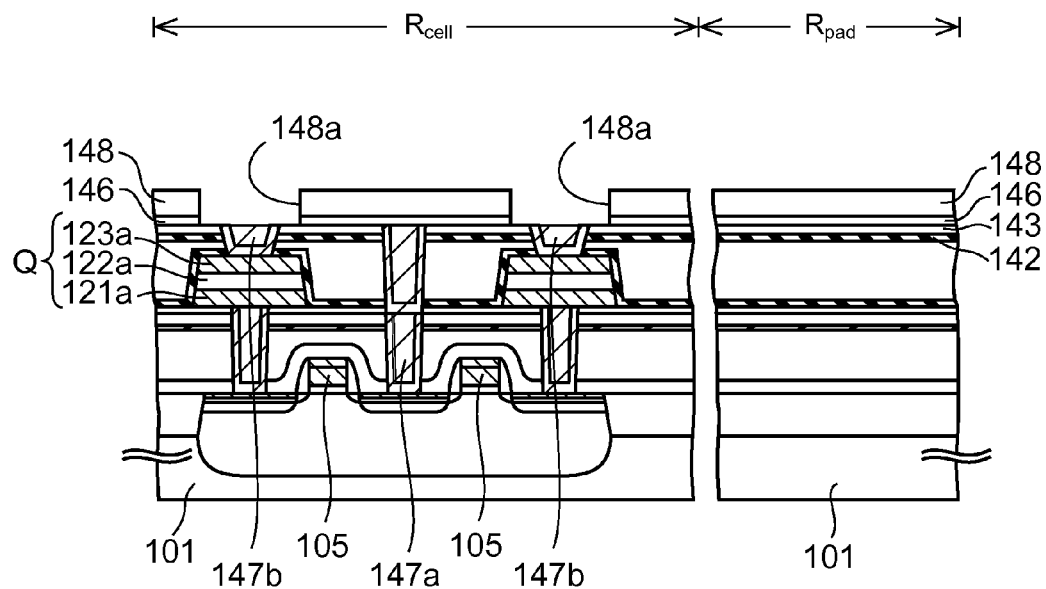
FIGS. 24A to 24S are views showing processes of manufacturing a semiconductor device according to a fifth embodiment.
Figure 24B:
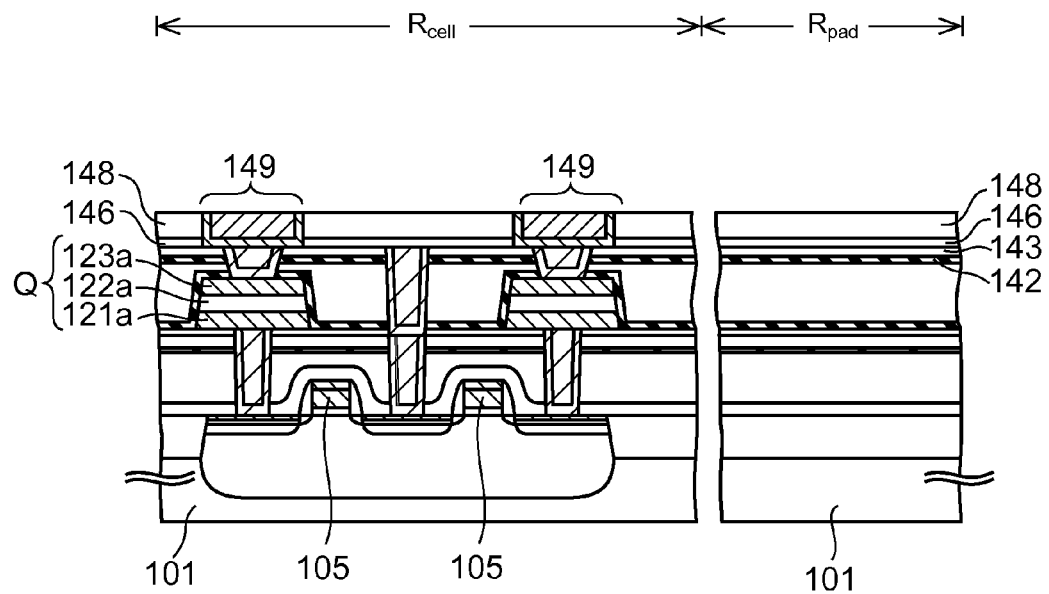
Figure 24C:
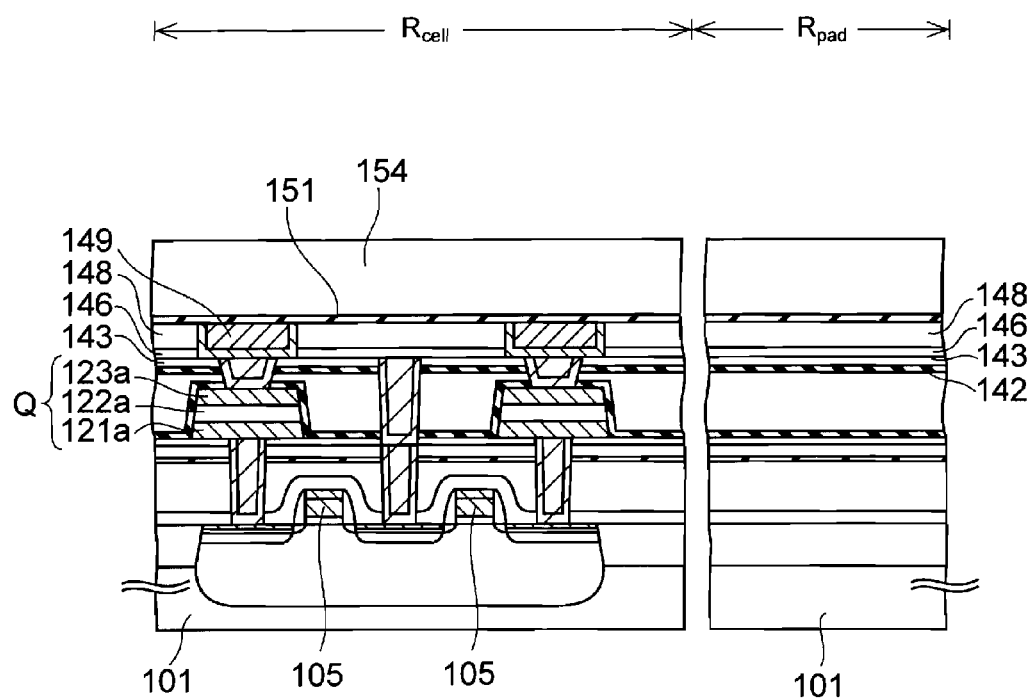
Figure 24D:
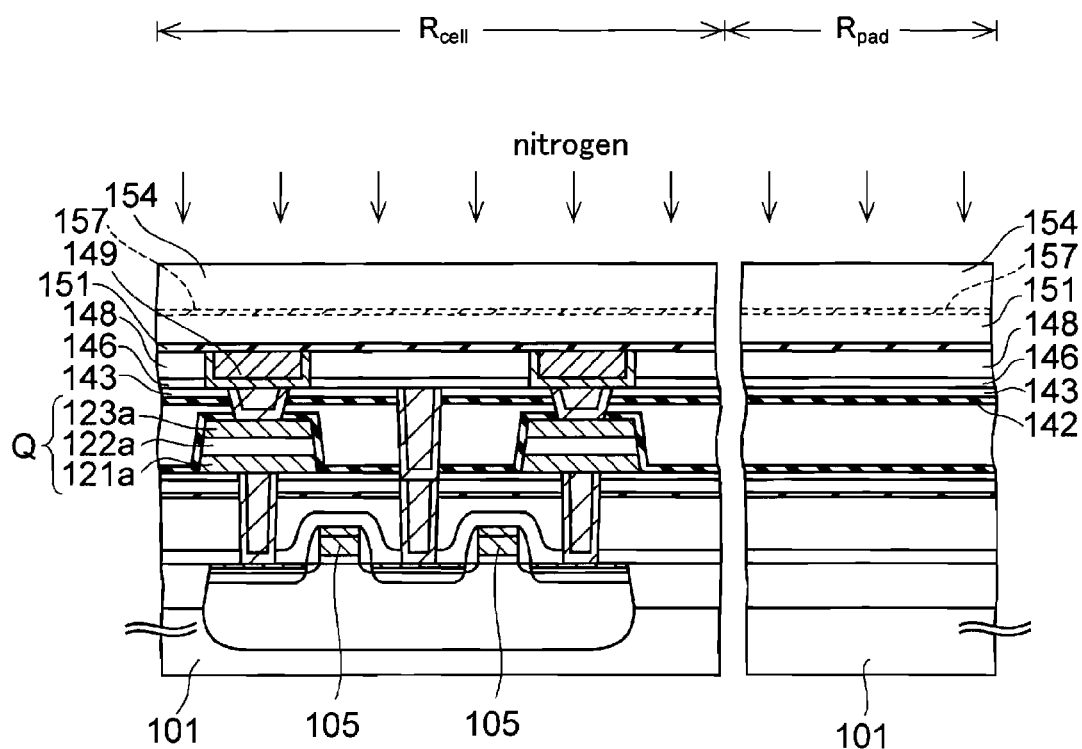
Figure 24E:
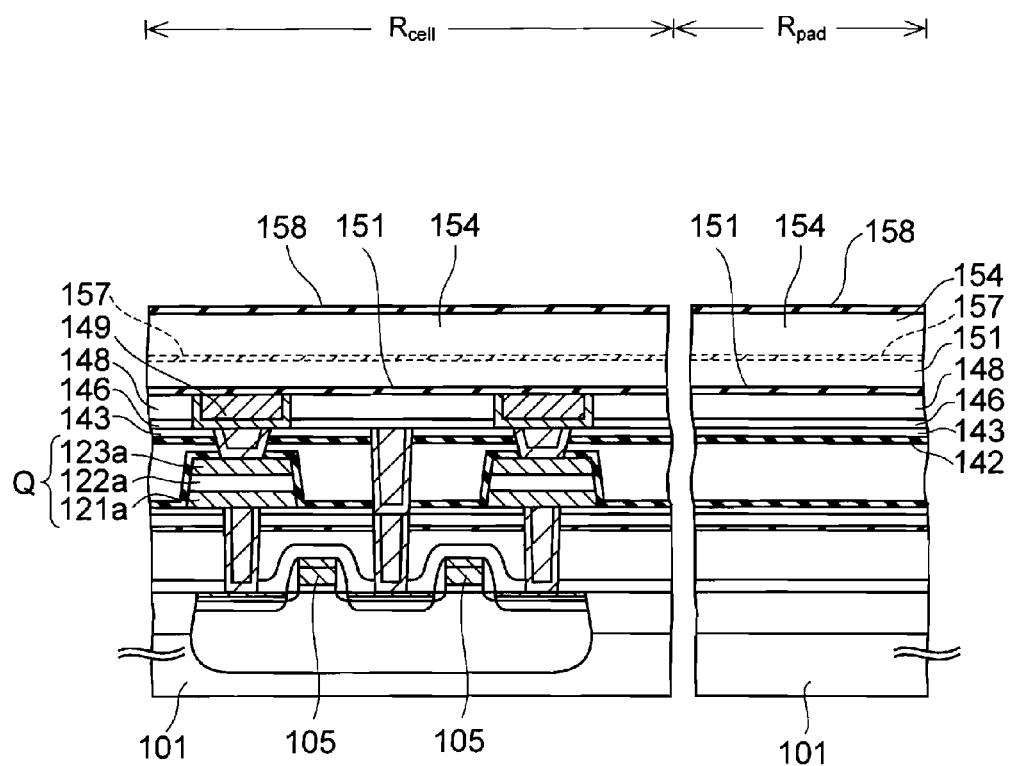
Figure 24F:
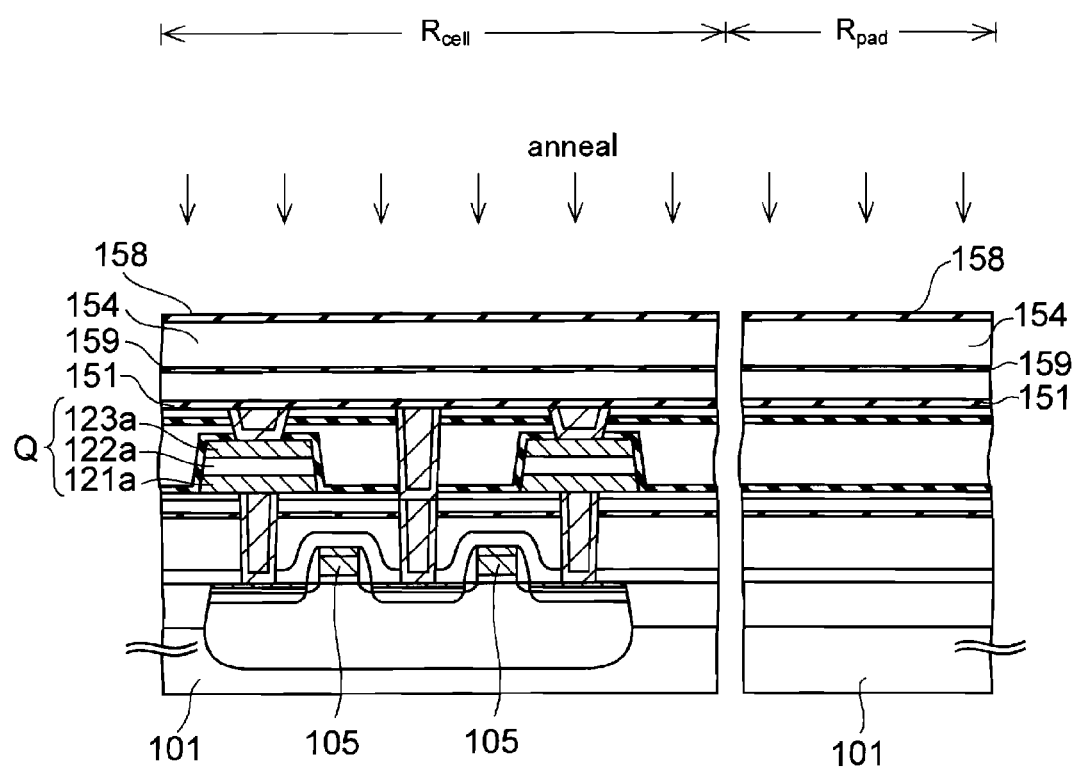
Figure 24G:
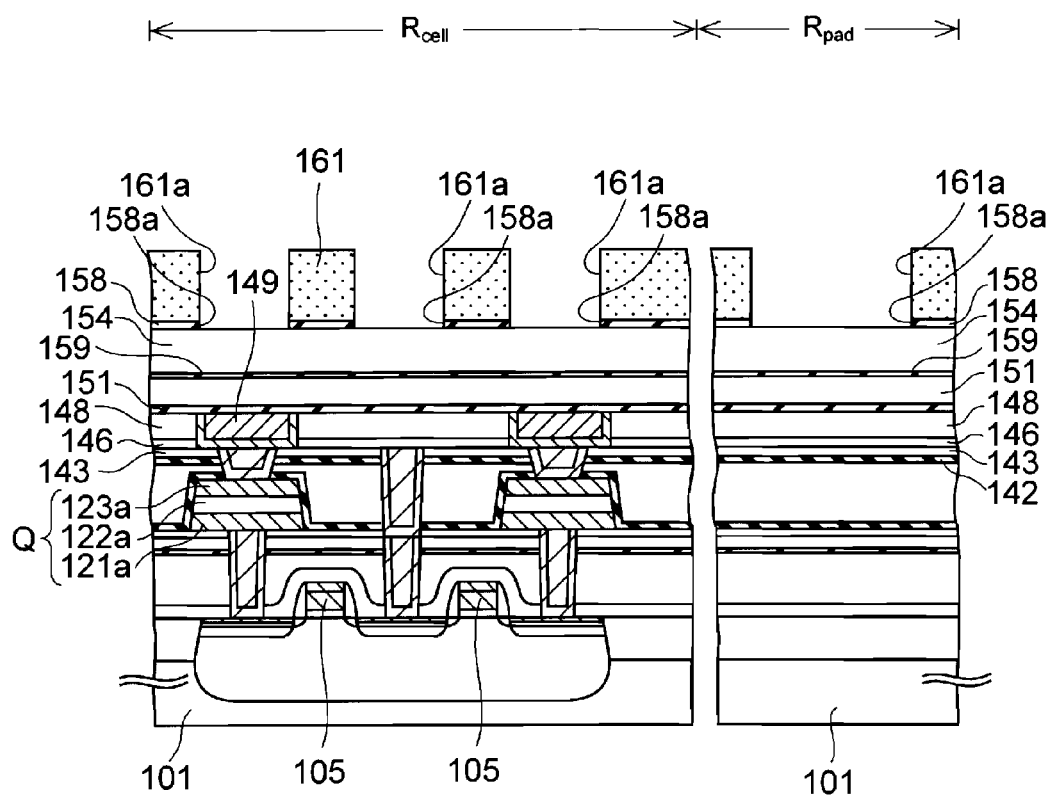
Figure 24H:
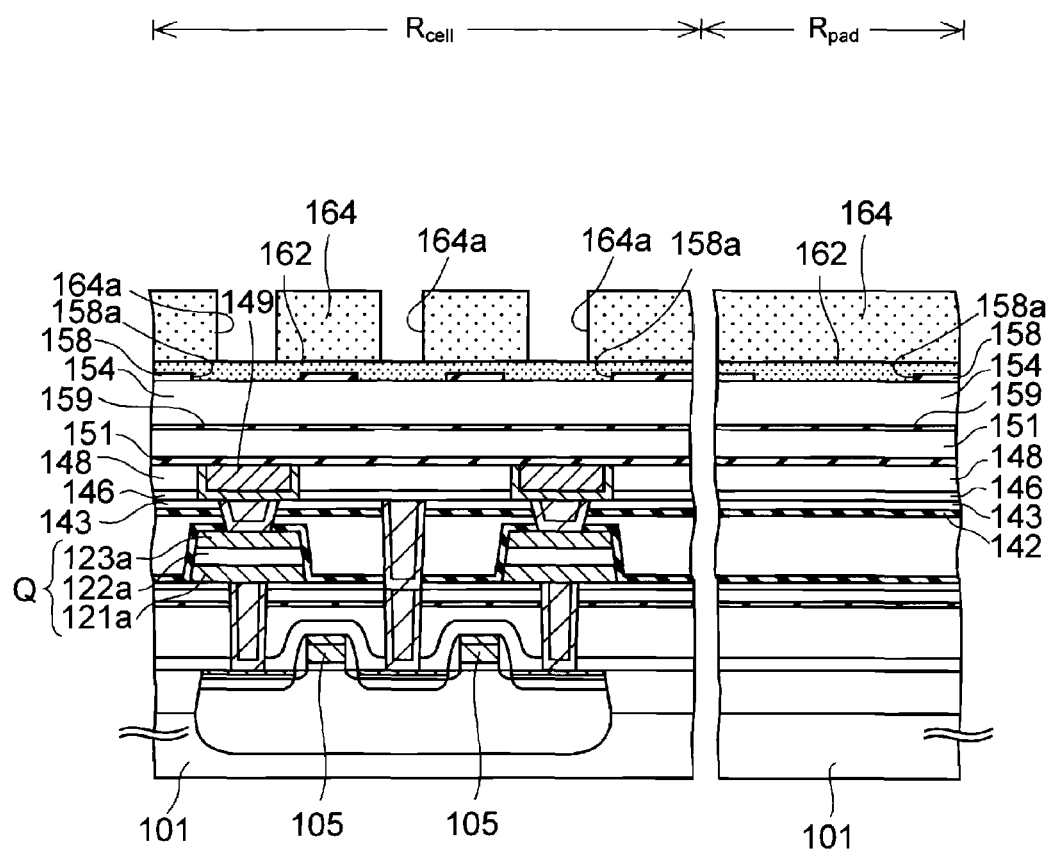
Figure 24I:
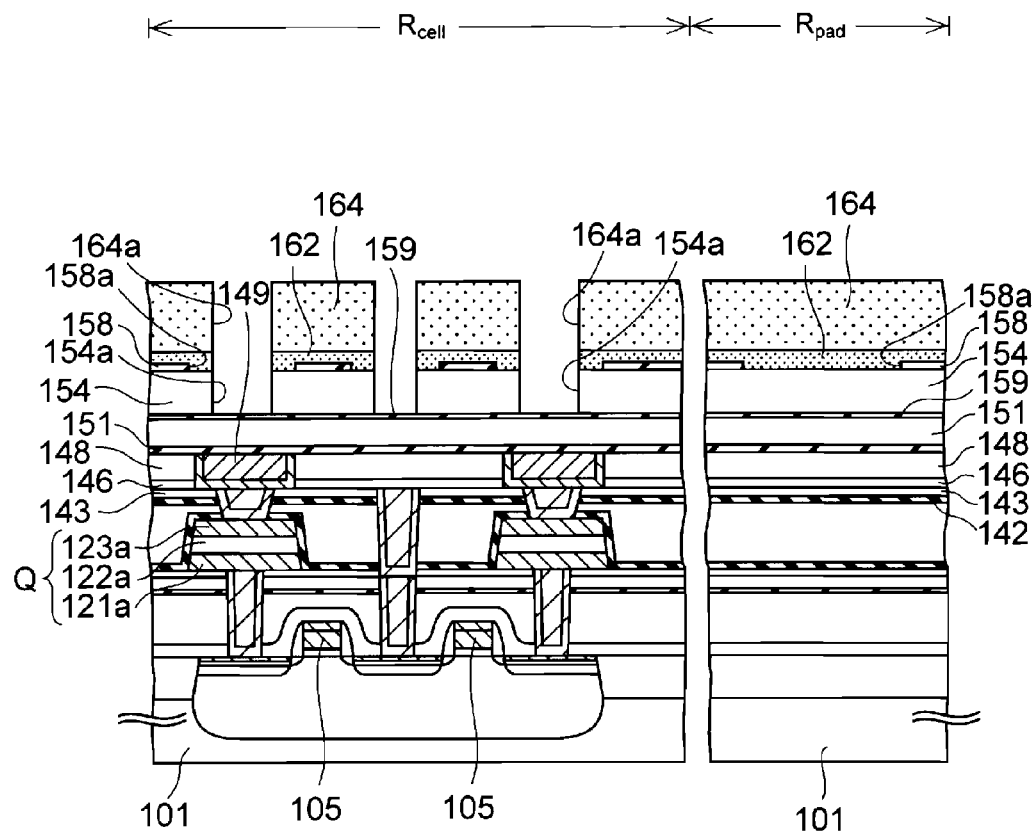
Figure 24J:
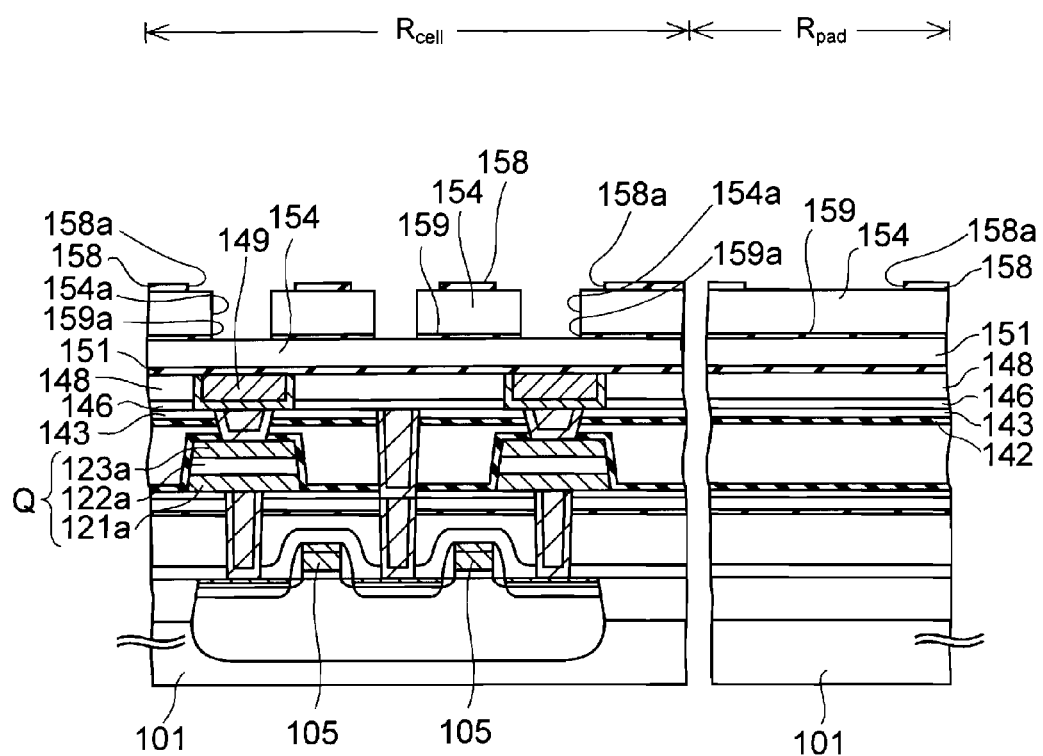
Figure 24K:
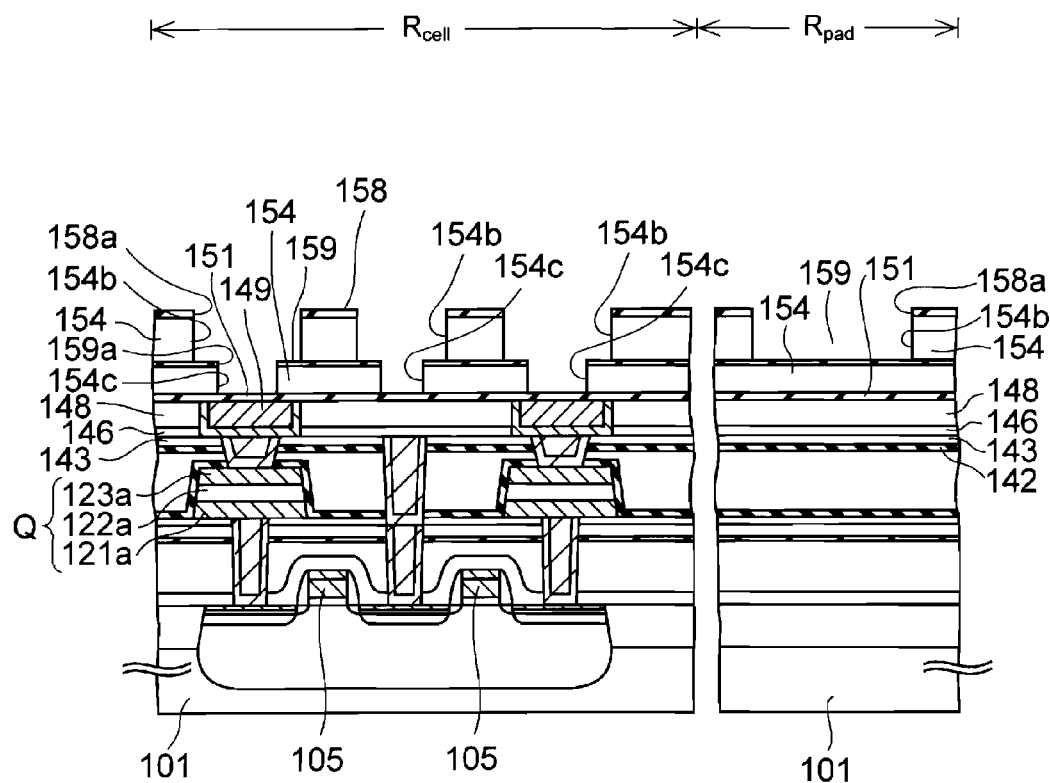
Figure 24L:
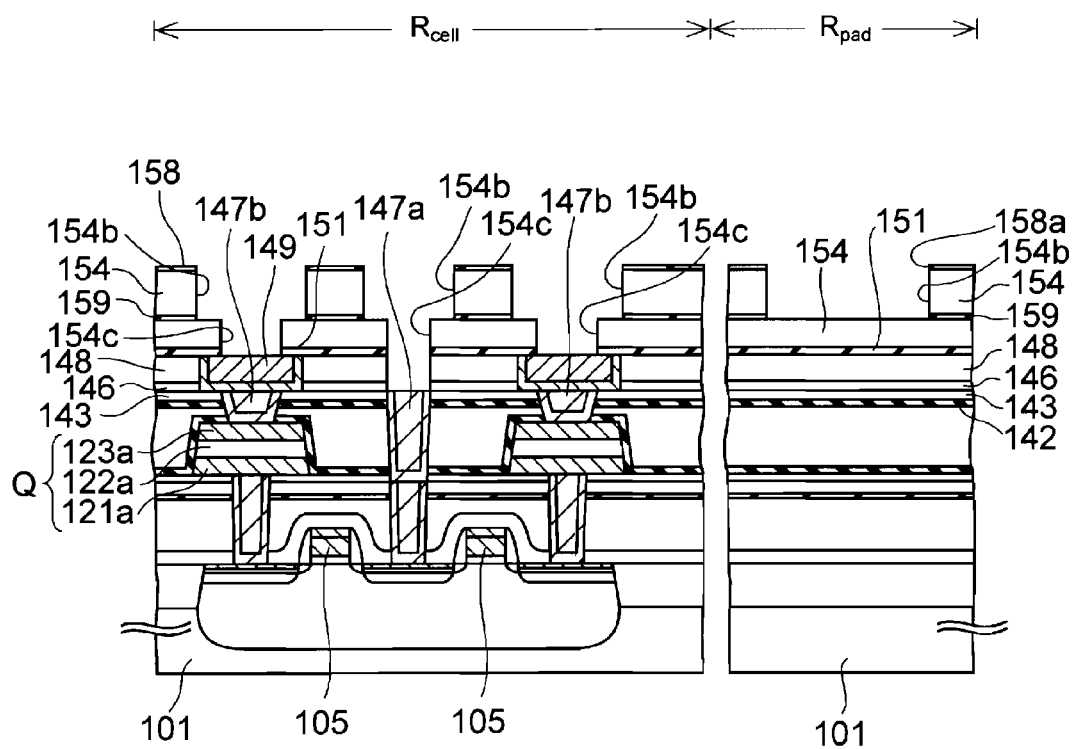
Figure 24M:
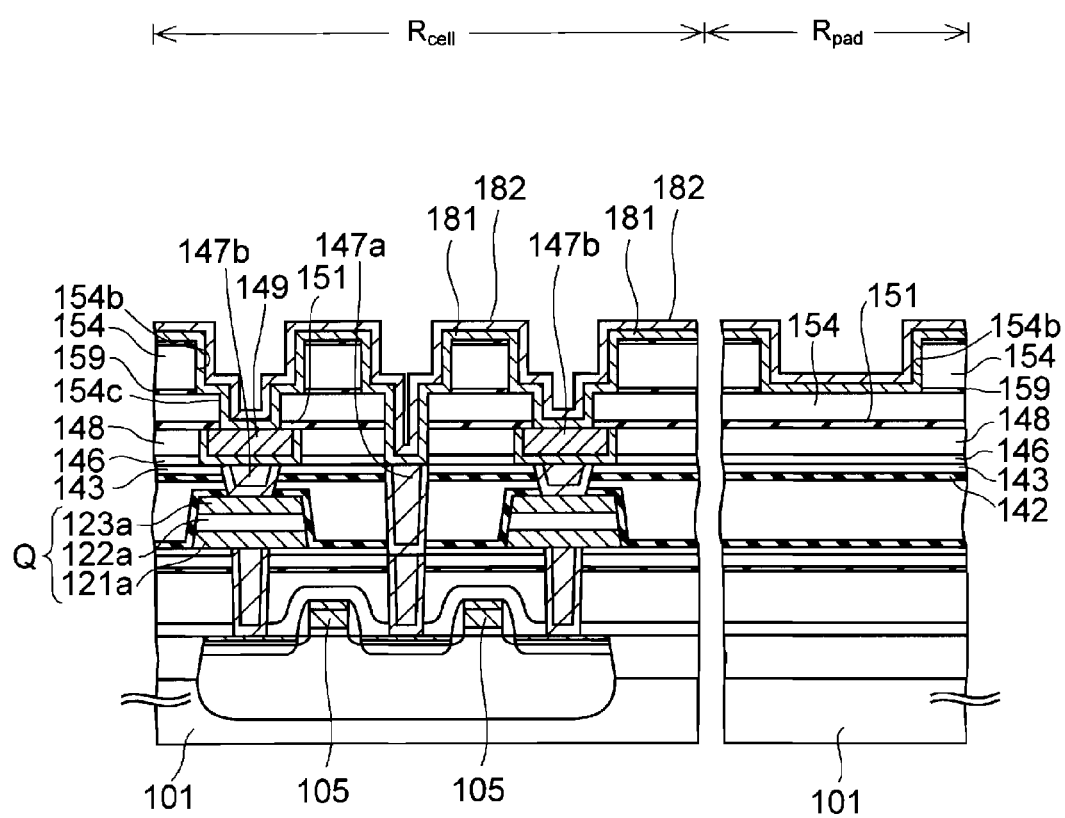
Figure 24N:
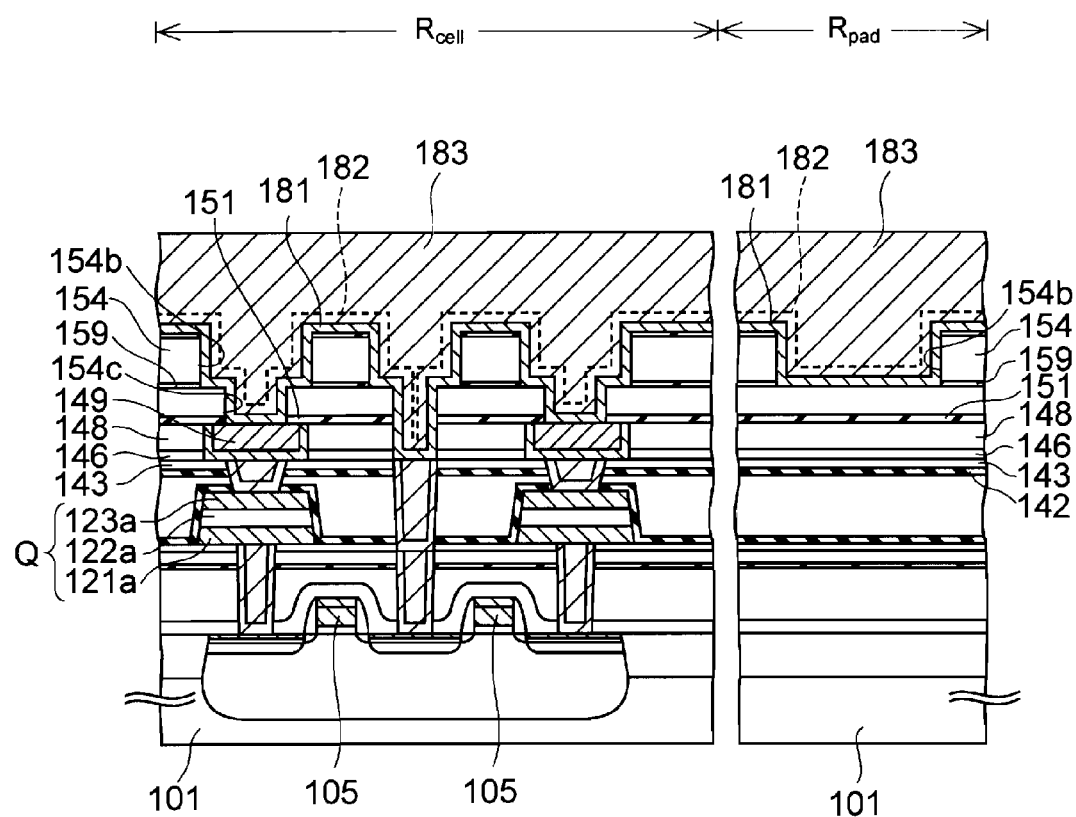
Figure 24O:
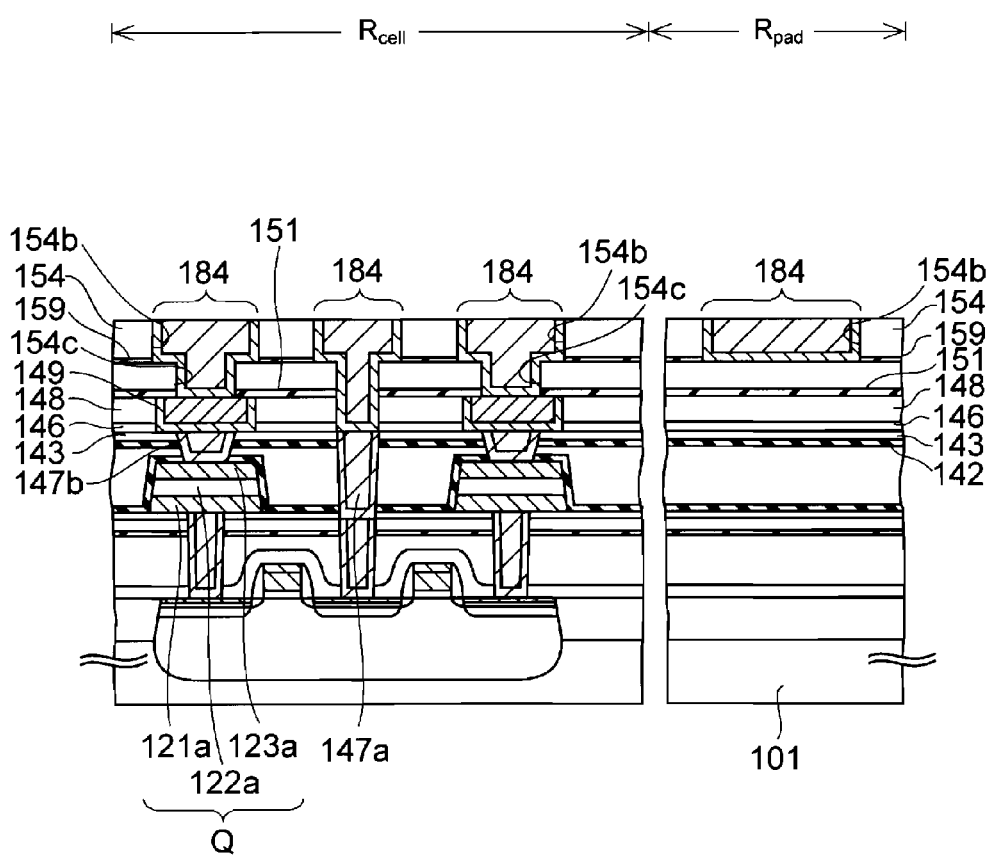
Figure 24P:
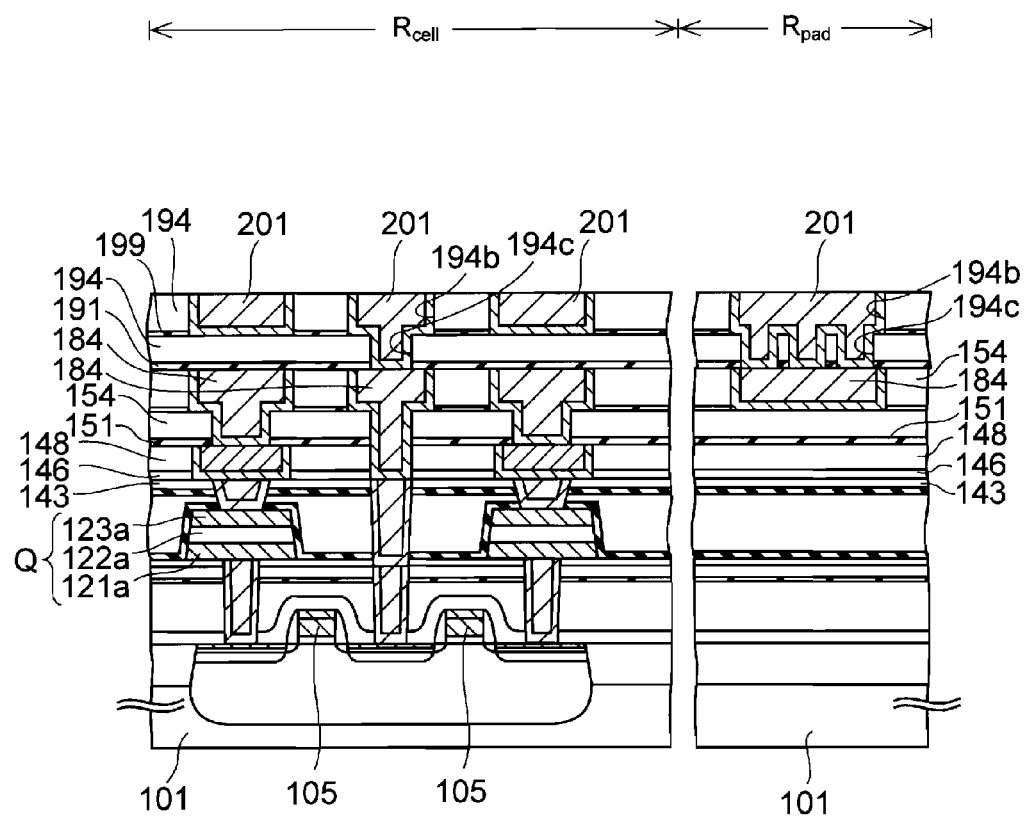
Figure 24Q:
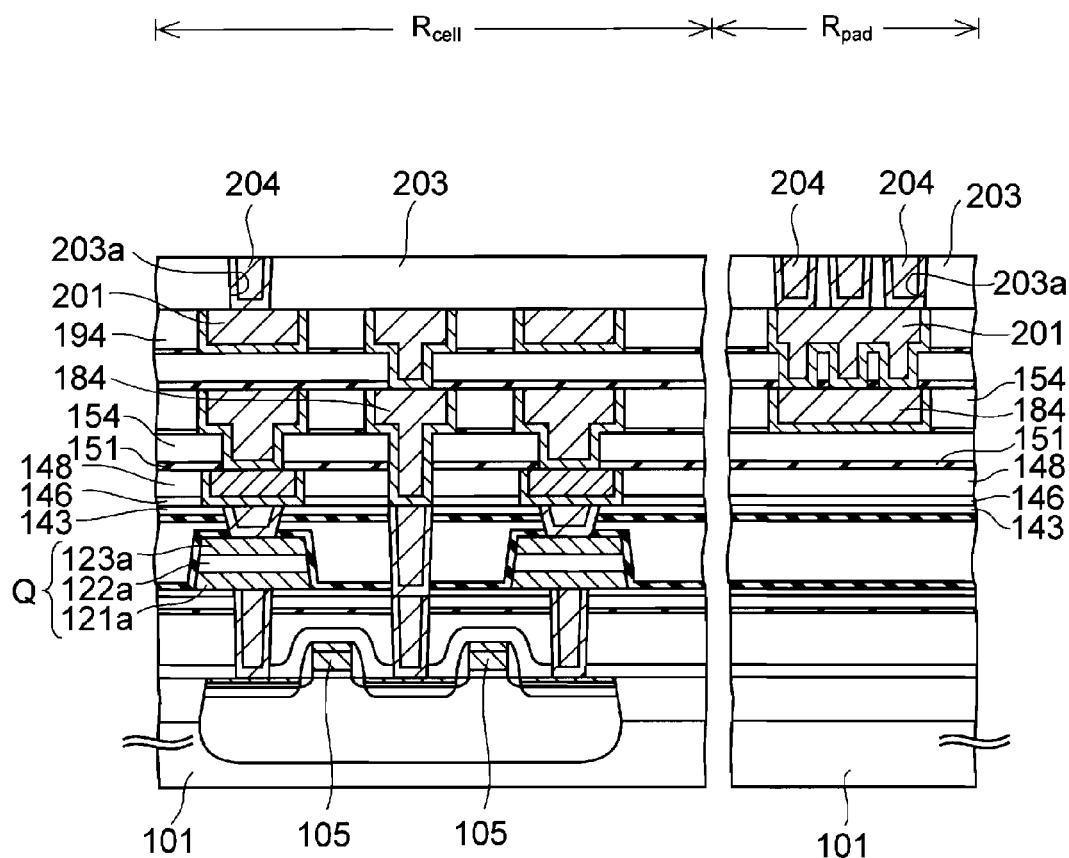
Figure 24R:
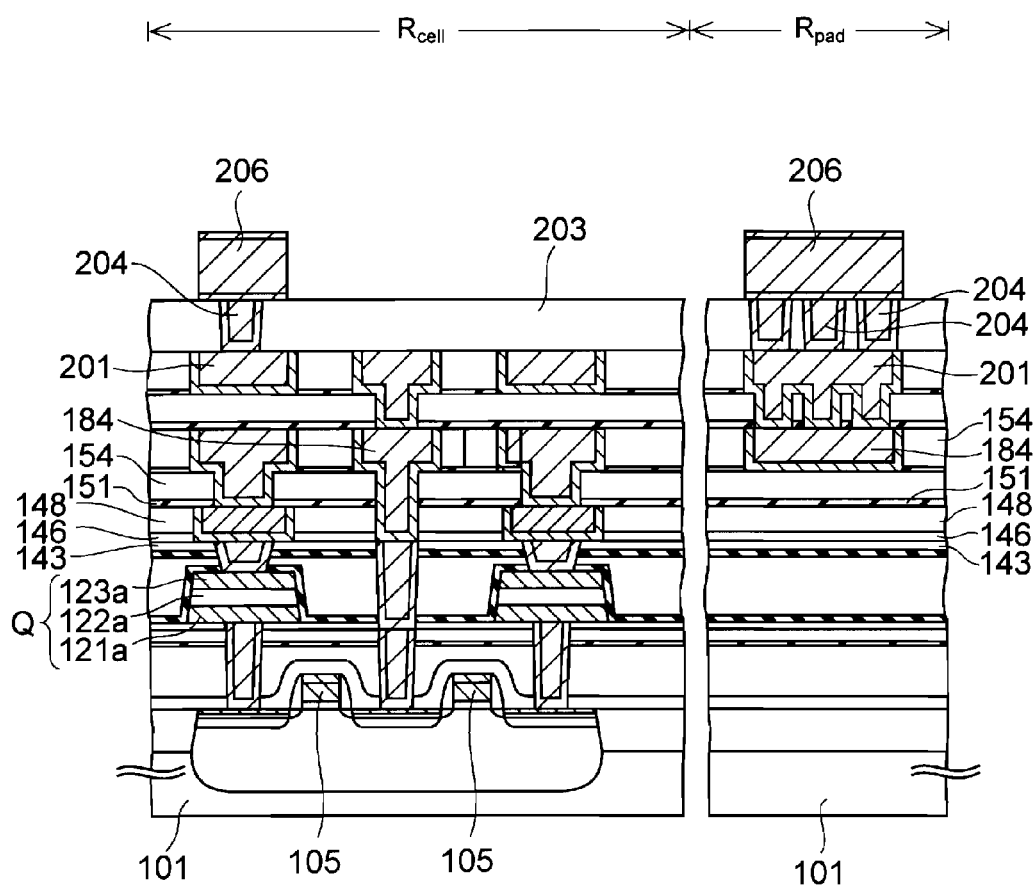
Figure 24S:
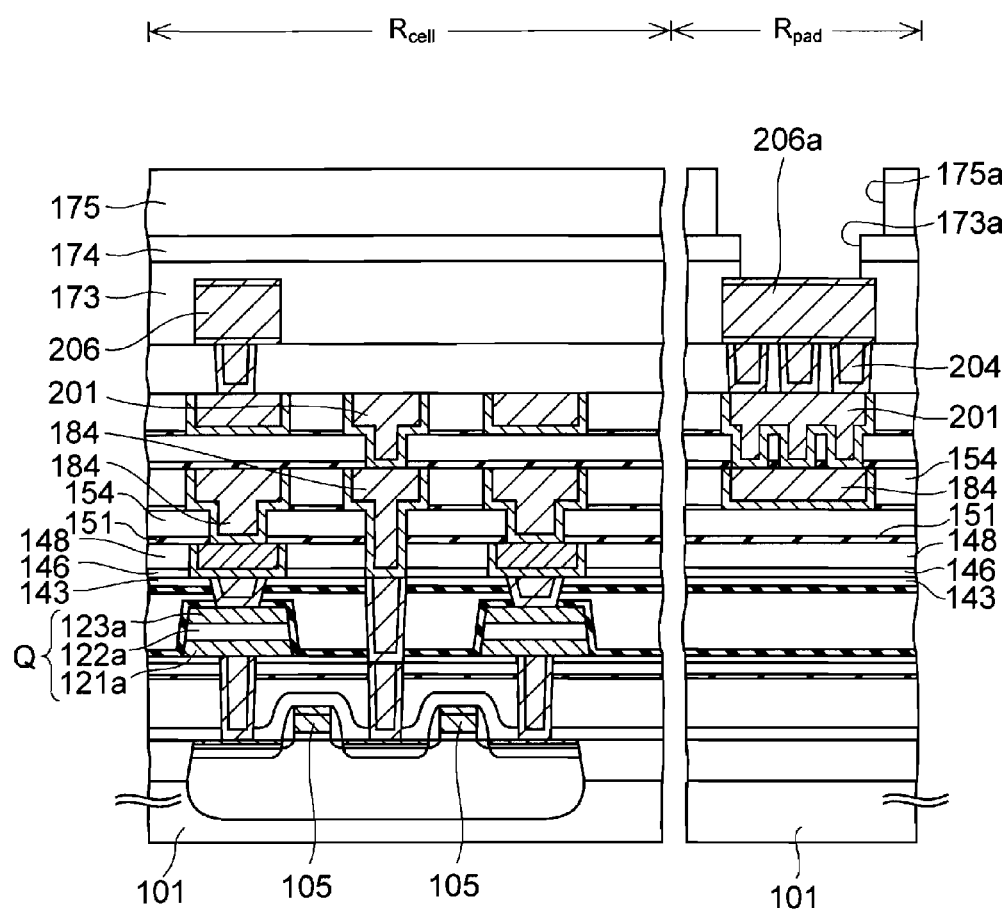

FIGS. 24A to 24S are cross-sectional views showing a semiconductor device according to the present embodiment in the course of manufacturing.

Firstly, the processes of FIGS. 14A to 14Q described in the fourth embodiment are carried out to manufacture this semiconductor device.

Next, as shown in FIG. 24A, a silicon nitride film 146 of about 50 nm to 100 nm and a silicon oxide film 148 of about 500 nm are formed in this order by the CVD method on each of the third and fourth conductive plugs 147b and 147a and a first cover insulating film 143. In addition, these films are patterned to form wiring grooves 148a on the third conductive plugs 147b. Note that the silicon nitride film 146 may be omitted in some cases.

Next, as shown in FIG. 24B, a tantalum film is formed with the thickness in a range of 10 nm to 20 nm on an entire upper surface of a silicon substrate 101 by the sputtering method. Thereafter, a copper-plating film is formed on the tantalum film. Then, these films are polished by the CMP method to leave them in the wiring grooves 148a as base copper wirings (conductive patterns) 149.

Next, as shown in FIG. 24C, a silicon nitride film is formed with the thickness of about 50 nm to 100 nm on each of the upper surfaces of the base insulating films 149 and the first cover insulating film 143 by the plasma CVD method. The silicon nitride film thus formed is used as a second cover insulating film 151.

Furthermore, a silicon oxide film is formed as a third insulating film 154 with the thickness of approximately 800 nm to 1000 nm on this second cover insulating film 151 by the plasma CVD method. The plasma CVD method uses, for example, the TEOS gas as a reaction gas.

Next, as shown in FIG. 24D, nitrogen is ion-implanted into the third insulating film 154 as impurities to form an impurity layer 157 in a predetermined depth of the third insulating film 154. The conditions for the ion implantation are not particularly limited. In the present embodiment, acceleration energy is set to 5 keV and a dose amount is set to $1 \times 10^{15}$ cm$^{-2}$. According to this acceleration energy, the impurity layer 157 having a concentration peak of impurities in the depth of approximately 20 nm from the upper surface of the third insulating film 154 is formed.

Next, as shown in FIG. 24E, a mask film 158 made of silicon nitride is formed on the third insulating film 154. This mask film 158 is formed by the plasma CVD method, and the thickness thereof is about 100 nm.

Next, as shown in FIG. 24F, annealing is carried out on the impurity layer 157 in a vertical or lateral furnace at the substrate temperature of 450° C. to 500° C. Thereby, nitride contained in the impurity layer 157 is caused to react with silicon contained in the third insulating film 154 to modify the impurity layer 157 into an etching stopper film (an impurity-containing insulating film) 159 which is mainly formed of silicon nitride.

Next, processes for obtaining a cross-sectional structure shown in FIG. 24G will be described.

Firstly, a photoresist is coated on the upper surface of the mask film 158. The coated photoresist is exposed and developed to form a fifth resist pattern 161 provided with fifth windows 161a.

Subsequently, the mask film 158 is etched through the fifth windows 161a to form openings 158a in the mask film 158 under the fifth windows 161a.

Thereafter, the fifth resist pattern 161 is removed.

Next, as shown in FIG. 24H, an organic film is coated in the openings 158a and on the mask film 158 as a refection prevention film 162 for preventing refection of exposure light. Such a reflection prevention film is also referred to as bottom anti-reflection coating (BARC).

Subsequently, a photoresist is coated on this reflection prevention film 162 to form a sixth resist pattern 164 by exposing and developing the photoresist. The sixth resist pattern 164 has sixth windows 164a on the openings 158a of the mask film 158.

Next, as shown in FIG. 24I, the reflection prevention film 162 and the third insulating film 154 made of silicon oxide are etched through the sixth windows 164a. Thereby, fifth holes 154a overlapping with the openings 158a are formed in the third insulating film 154 on the etching stopper film 159.

Such etching is carried out, for example, in a parallel plate-type plasma etching equipment while a mixed gas of $C_4F_8$, $O_2$, and Ar is used as an etching gas. In addition, the etching stopper film 159, which is mainly formed of silicon nitride, is hardly etched by this etching gas. Thus, the etching automatically stops on the etching stopper film 159.

Thereafter, the sixth resist pattern 164 and refection prevention film 162 are removed.

Next, as shown in FIG. 24J, the etching stopper film 159 is etched through the fifth holes 154a by using the parallel plate-type plasma etching equipment (not shown) to form sixth holes 159a in the etching stopper film 159.

This etching uses an etching gas for selectively etching the etching stopper film 159 containing silicon nitride, for example a mixed gas of $CH_3F$, $CF_4$, and $O_2$. Since the third insulating film 154 made of silicon oxide has etching resistance to this etching gas, the third insulating film 154 lower than the etching stopper film 159 is hardly etched.

Next, as shown in FIG. 24K, the third insulating film 154 is etched through the openings 158a of the mask film 158 to from first grooves 154b in the third insulating film 154 on the etching stopper film 159.

Furthermore, during this etching, the third insulating film 154 lower than the etching stopper film 159 is etched through the sixth holes 159a. As a result, seventh holes 154c are formed in the third insulating film 154.

This etching is carried out in unillustrated parallel plate-type plasma etching equipment, and the mixed gas of $C_4F_8$, $O_2$, and Ar is used as an etching gas. Since the second cover insulating film 151 made of silicon nitride has etching resistance to this etching gas, the etching stops on the upper surface of the second cover insulating film 151.

Next, as shown in FIG. 24L, the etching stopper film 159 and the second cover insulating film 151 are etched at the same time. Thereby, the cover insulating film 151 under the seventh holes 154c is removed, and conductive patterns, such as base copper wirings 149, are exposed in the seventh holes 154c. In addition, the etching stopper film 159 under the first grooves 154b is removed. As a result, the first grooves 154b are also formed in the etching stopper film 159.

The above-described etching is carried out in the unillustrated parallel plate-type plasma etching device by using the mixed gas of $CHF_3$, $O_2$, and Ar as an etching gas. Although nitrogen is ion-implanted (FIG. 24D) into the etching stopper film 159 as impurities, since the cover insulating film 151, which is mainly formed of silicon nitride, also contains nitrogen, these films 159 and 151 have the substantially same etching rate, and thus the etching can be carried out at the same time as described above.

Furthermore, the silicon oxide film 146 and the silicon nitride film 148 on the fourth conductive plug 147a are etched to form a hole in these films. Thereby, the fourth conductive plug 147a is exposed in the hole.

Thereafter, while maintaining the substrate temperature at 300° C., the upper surfaces of the base copper wirings 149 and fourth conductive plugs 147a are exposed to an ammonia atmosphere for approximately 300 seconds.

Next, as shown in FIG. 24M, a tantalum film is formed as a barrier metal film 181 with the thickness of 10 nm to 20 nm on each of the inner surfaces of the first grooves 154b and the seventh hole 154c by the sputtering method.

Furthermore, a copper seed layer 182 is formed with the thickness of approximately 130 nm on this barrier metal film 181 by the sputtering method.

Here, the upper surfaces of the base copper wirings 149 and fourth conductive plugs 147a are exposed to the ammonia atmosphere before the barrier metal film 181 is formed. Thereby, adhesiveness between these conductive patterns 149 and 147a and the barrier metal film 181 is improved, and contact resistance between the first copper wirings to be described later and these conductive patterns 149 and 147a is stabilized.

Next, as shown in FIG. 24N, a copper film 183 is formed on the copper seed layer 182 by electric plating. Then, this copper film 183 completely embeds the first grooves 154b and the seventh hole 154c.

Thereafter, as shown in FIG. 24O, the copper film 183, the copper seed layer 182, and the barrier metal film 181 are polished by the CMP method. Thereby, these films are left as first copper wirings 184 only in the first grooves 154b and the seventh hole 154c.

Subsequently, by carrying out the same processes as those of FIGS. 24C to 24O described above, as shown in FIG. 24P, a third cover insulating film 191 made of silicon nitride and a fourth insulating film 194 made of silicon oxide are formed as shown in the drawing, and second grooves 194b and eighth holes 194c are formed in the fourth insulating film 194. Then, second copper wirings 201 are formed in the second grooves 194b and the eighth holes 194c.

Next, as shown in FIG. 24Q, a silicon oxide film is formed as a fifth insulating film 203 on each of the upper surfaces of the fourth insulating film 194 and the second copper wirings 201 by the plasma CVD method.

Subsequently, the fifth insulating film 203 is patterned to form ninth holes 203a. Thereafter, fifth conductive plugs 204 formed by laminating a titanium nitride film and a tungsten film in this order are formed in the ninth holes 203a.

Next, as shown in FIG. 24R, a metal laminated film including an aluminum film is formed on each of the upper surfaces of the fifth conductive plugs 204 and the fifth insulating film 203 by the sputtering method. Thereafter, the metal laminated film is patterned by photolithography to form a final metal wiring 206 in a cell region $R_{cell}$ and a bonding pad 206a in a pad region $R_{pad}$.

Next, as shown in FIG. 24S, first and second passivation films 173 and 174 and a protective layer 175 are formed on each of the fifth insulating film 203 and the final metal wiring 206 by carrying out the process of FIG. 14X of the fourth embodiment. Thereby, a basic structure of the semiconductor device according to the present embodiment is completed.

In the present embodiment described above, as described by referring to FIGS. 24D to 24F, nitrogen is ion-implanted into the third insulating film 154 to form the impurity layer 157, and thereafter the impurity layer 157 is annealed to be modified into the etching stopper film 159 which is mainly made of silicon nitride.

According to this, the etching stopper film 159 is automatically formed in a predetermined depth of the third insulating film 154. Accordingly, it is not required to form a new insulating film for forming the grooves 154b on the etching stopper film 159. Thus, the number of manufacturing processes can be reduced.

Moreover, if the etching stopper film 159 were to be formed by the CVD method, the capacitor dielectric film 122a would be deteriorated due to reduction by hydrogen contained in the film-forming atmosphere of the etching stopper film 159. On the contrary, in the present embodiment, the etching stopper film 159 is formed by ion-implanting nitrogen and annealing, so that it is less likely that the capacitor dielectric film 122a is deteriorated.

In addition, similar to the first embodiment, the semiconductor device according to the present embodiment also has characteristics that there is no clear interface between the third insulating film 154 and the etching stopper film 159, because the nitrogen concentration in the third insulating film 154 shows distribution as shown in FIG. 25.

Note that in the present embodiment, nitrogen is ion-implanted as impurities to form the impurity layer 157 (FIG. 24D). However, the impurities are not limited to nitrogen, and fluorine or carbon may be ion-implanted in pace of nitrogen as long as it can show the etching selectivity between the etching stopper film 159 and the third insulating film 154.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for manufacturing a semiconductor device, comprising:
    forming a conductive pattern over a semiconductor substrate;
    forming a cover insulating film containing impurities over the conductive pattern;
    forming an insulating film over the cover insulating film;
    forming an impurity layer in the insulating film by ion-implanting impurities into a predetermined depth of the insulating film, where the impurities being a same kind as the impurities contained in the cover insulating film;
    modifying the impurity layer to form an etching stopper film by annealing the insulating film after the impurity layer is formed;
    forming a mask film provided with an opening over the insulating film;
    forming, over the mask film, a resist pattern provided with a window over the opening;
    forming a first hole overlapping with the opening in the insulating film over the etching stopper film, by etching the insulating film through the window;
    forming a second hole in the etching stopper film by etching the etching stopper film through the first hole;
    forming a groove in the insulating film over the etching stopper film by etching the insulating film through the opening, and forming a third hole in the insulating film over the conductive pattern by etching, through the second hole, the insulating film lower than the etching stopper film;

etching the etching stopper film and the cover insulating film at the same time to expose the conductive pattern in the third hole by removing the cover insulating film under the third hole, and removing the etching stopper film under the groove; and embedding a wiring in the groove and the third hole, the wiring being electrically connected to the conductive pattern.

* * * * *